(12) United States Patent
Hashim et al.

(10) Patent No.: US 8,952,707 B2
(45) Date of Patent: Feb. 10, 2015

(54) PLUG INSERTION DETECTION CIRCUITS AND RELATED METHODS AND COMMUNICATIONS CONNECTORS

(75) Inventors: Amid I. Hashim, Plano, TX (US); Scott Lynn Michaelis, Plano, TX (US); Ryan Enge, Carrollton, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 783 days.

(21) Appl. No.: 13/111,112

(22) Filed: May 19, 2011

(65) Prior Publication Data

US 2012/0187961 A1 Jul. 26, 2012

Related U.S. Application Data

(60) Provisional application No. 61/435,248, filed on Jan. 21, 2011, provisional application No. 61/475,251, filed on Apr. 14, 2011.

(51) Int. Cl.
*G01R 27/28* (2006.01)
*G01R 31/04* (2006.01)
*H04L 25/02* (2006.01)

(52) U.S. Cl.
CPC ............ *G01R 31/043* (2013.01); *H04L 25/0272* (2013.01)
USPC ........... 324/649; 324/679; 324/658; 324/647; 370/200; 370/252; 379/25

(58) Field of Classification Search
USPC .......... 324/679, 658, 647, 649; 370/200, 252; 379/25
See application file for complete search history.

(56) References Cited

U.S. PATENT DOCUMENTS

| | | | |
|---|---|---|---|
| 5,394,503 A | 2/1995 | Dietz, Jr. et al. | |
| 5,406,260 A | 4/1995 | Cummings et al. | |
| 5,483,467 A | 1/1996 | Krupka et al. | |
| 5,550,755 A | 8/1996 | Martin et al. | |
| 5,764,043 A | 6/1998 | Czosnowski et al. | |
| 5,854,824 A | 12/1998 | Bengal et al. | |

(Continued)

FOREIGN PATENT DOCUMENTS

| GB | 2468925 A | 9/2010 |
|---|---|---|
| WO | WO 2006/075247 A1 | 7/2006 |

OTHER PUBLICATIONS

Gabara T., "Phantom Mode Signaling in VLSI Systems", *Proceedings Advanced Research in VLSI*, Mar. 14, 2001, pp. 88-100.

(Continued)

*Primary Examiner* — Patrick Assouad
*Assistant Examiner* — Lamarr Brown
(74) *Attorney, Agent, or Firm* — Myers Bigel Sibley & Sajovec, P.A.

(57) ABSTRACT

Methods of detecting a plug insertion into a plug aperture of a communications connector are provided in which a control signal is transmitted to a control signal input circuit of the connector that includes a reactive coupling element. The control signal is electromagnetically coupled through the control signal input circuit. The electromagnetically coupled control signal is thereafter detected on a first differential pair of conductive paths that are included in the connector. A determination is made that a plug is present in the plug aperture based at least in part on detecting the electromagnetically coupled control signal on the first differential pair of conductive paths.

19 Claims, 24 Drawing Sheets

(56) References Cited

U.S. PATENT DOCUMENTS

| | | | |
|---|---|---|---|
| 5,937,130 A | 8/1999 | Amberg et al. | |
| 6,002,331 A | 12/1999 | Laor | |
| 6,026,078 A * | 2/2000 | Smith | 370/258 |
| 6,147,963 A | 11/2000 | Walker et al. | |
| 6,222,908 B1 | 4/2001 | Bartolutti et al. | |
| 6,285,293 B1 | 9/2001 | German et al. | |
| 6,330,307 B1 | 12/2001 | Bloch et al. | |
| 6,350,148 B1 | 2/2002 | Bartolutti et al. | |
| 6,424,710 B1 | 7/2002 | Bartolutti et al. | |
| 6,522,737 B1 | 2/2003 | Bartolutti et al. | |
| 6,705,707 B2 | 3/2004 | Furukawa | |
| 6,725,177 B2 | 4/2004 | David et al. | |
| 6,784,802 B1 | 8/2004 | Stanescu | |
| 6,821,024 B2 | 11/2004 | Bates, III | |
| 6,961,675 B2 | 11/2005 | David | |
| 6,968,994 B1 | 11/2005 | Ashwood Smith | |
| 6,985,713 B2 | 1/2006 | Lehr et al. | |
| 7,153,142 B2 | 12/2006 | Shifris et al. | |
| 7,160,143 B2 | 1/2007 | David et al. | |
| 7,170,393 B2 | 1/2007 | Martin | |
| 7,217,152 B1 | 5/2007 | Xin et al. | |
| 7,297,018 B2 | 11/2007 | Caveney et al. | |
| 7,370,106 B2 | 5/2008 | Caveney et al. | |
| 7,517,243 B2 | 4/2009 | Caveney et al. | |
| 7,573,254 B2 | 8/2009 | Cobb et al. | |
| 2003/0171037 A1 * | 9/2003 | Norris | 439/668 |
| 2004/0000898 A1 | 1/2004 | Pool et al. | |
| 2004/0021452 A1 | 2/2004 | Hwang et al. | |
| 2004/0161964 A1 | 8/2004 | Liebenow | |
| 2005/0002518 A1 * | 1/2005 | Daw | 379/413 |
| 2005/0202697 A1 * | 9/2005 | Caveney et al. | 439/77 |
| 2005/0245127 A1 | 11/2005 | Nordin et al. | |
| 2005/0277320 A1 | 12/2005 | Merlet | |
| 2007/0117444 A1 | 5/2007 | Caveney et al. | |
| 2007/0197083 A1 | 8/2007 | Below et al. | |
| 2007/0243725 A1 | 10/2007 | Nordin et al. | |
| 2007/0280121 A1 * | 12/2007 | Schoenborn et al. | 370/249 |
| 2008/0122579 A1 * | 5/2008 | German et al. | 340/10.1 |
| 2008/0253556 A1 | 10/2008 | Cobb et al. | |
| 2009/0019718 A1 * | 1/2009 | Mittleman et al. | 34/85 |
| 2009/0096581 A1 | 4/2009 | Macauley et al. | |
| 2009/0111310 A1 | 4/2009 | Burke et al. | |
| 2009/0142968 A1 * | 6/2009 | Goodrich et al. | 439/676 |
| 2009/0178119 A1 | 7/2009 | Macauley | |
| 2009/0186532 A1 * | 7/2009 | Goodrich et al. | 439/676 |
| 2009/0191740 A1 | 7/2009 | Aekins | |
| 2010/0008482 A1 | 1/2010 | Tucker | |
| 2010/0011097 A1 | 1/2010 | Cobb | |
| 2010/0085156 A1 | 4/2010 | Tucker | |
| 2010/0244998 A1 | 9/2010 | Peyton et al. | |
| 2010/0266117 A1 | 10/2010 | Enge et al. | |
| 2010/0267274 A1 | 10/2010 | McNally et al. | |
| 2010/0316334 A1 * | 12/2010 | Kewitsch | 385/78 |
| 2010/0317230 A1 | 12/2010 | Larsen et al. | |
| 2011/0008996 A1 * | 1/2011 | Pinn et al. | 439/489 |
| 2011/0043371 A1 | 2/2011 | German et al. | |
| 2011/0097925 A1 | 4/2011 | Caveney et al. | |
| 2011/0104933 A1 | 5/2011 | Straka et al. | |
| 2011/0115494 A1 | 5/2011 | Taylor et al. | |
| 2012/0015552 A1 | 1/2012 | Diab et al. | |

OTHER PUBLICATIONS

Invitation to Pay Additional Fees Corresponding to International Application No. PCT/US2012/021822; Date of Mailing: May 23, 2012; 8 Pages.

Written Opinion of the International Preliminary Examining Authority Corresponding to International Application No. PCT/US2012/021822; Date of Mailing: Feb. 21, 2013; 6 Pages.

International Preliminary Report on Patentability Corresponding to International Application No. PCT/US2012/021822; Date of Mailing: Apr. 25, 2013; 7 Pages.

* cited by examiner

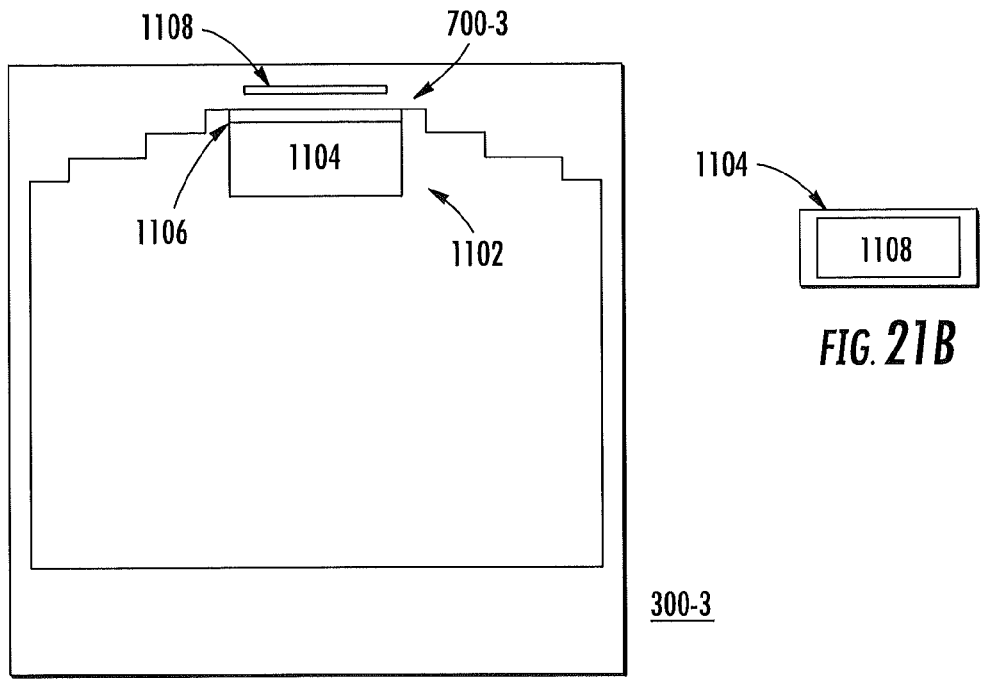
FIG. 21A
FIG. 21B
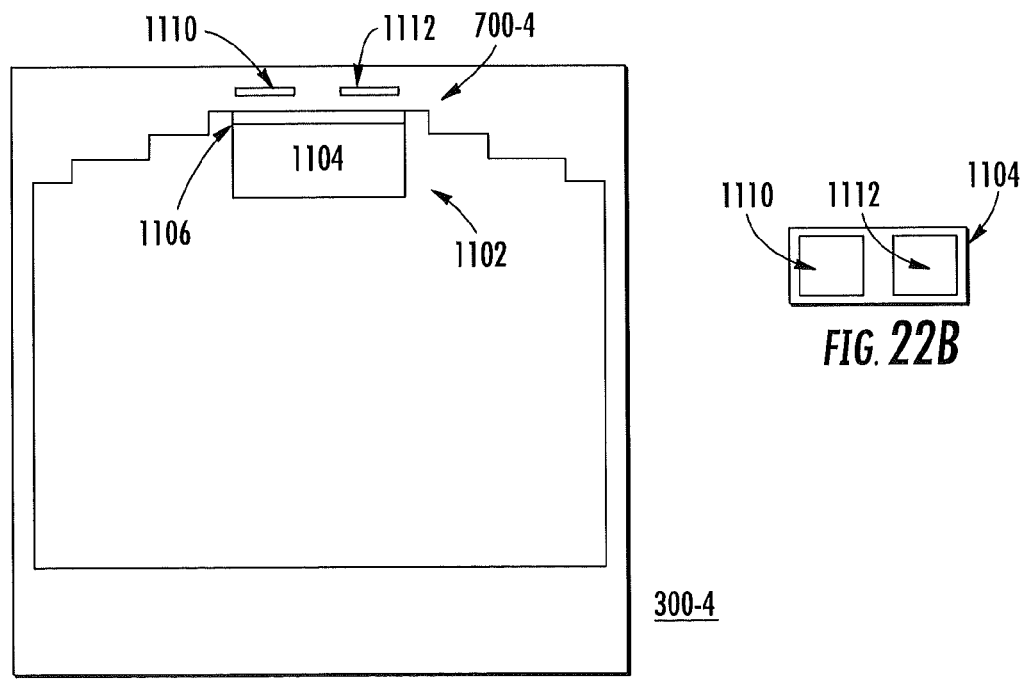
FIG. 22A
FIG. 22B

PLUG INSERTION DETECTION CIRCUITS AND RELATED METHODS AND COMMUNICATIONS CONNECTORS

CROSS-REFERENCE TO RELATED APPLICATIONS

The present application claims priority under 35 U.S.C. §119(e) to U.S. Provisional Patent Application Ser. No. 61/435,248, filed Jan. 21, 2011, and to U.S. Provisional Patent Application Ser. No. 61/475,251, filed Apr. 14, 2011. The entire contents of each of these applications are incorporated by reference herein as if set forth in their entireties. This application is related to U.S. patent application Ser. No. 13/110,994, which is filed concurrently herewith under, and to U.S. patent application Ser. No. 13/111,015, which is filed concurrently herewith.

FIELD OF THE INVENTION

The present invention relates generally to communications systems and, more particularly, to automatically tracking cabling connections in communications systems.

BACKGROUND

Most businesses, government agencies, schools and other organizations employ dedicated communications systems (also referred to herein as "networks") that enable computers, servers, printers, facsimile machines, telephones, security cameras and the like to communicate with each other, through a private network, and with remote locations via a telecommunications service provider. Such communications system may be hard-wired through, for example, the walls and/or ceilings of a building using communications cables and connectors. Typically, the communications cables contain eight insulated conductors such as copper wires that are arranged as four differential twisted pairs of conductors. Each twisted pair may be used to transmit a separate differential communications signal. Individual communications connectors (which are also referred to herein as "connector ports") such as RJ-45 style modular wall jacks are mounted in offices, conference rooms and other work areas throughout the building. The communications cables and any intervening connectors provide communications paths from the connector ports (e.g., modular wall jacks) in offices and other rooms, hallways and common areas of the building (referred to herein as "work area outlets") to network equipment (e.g., network switches, servers, memory storage devices, etc.) that may be located in a computer room, telecommunications closet or the like. Communications cables from external telecommunication service providers may also terminate within the computer room or telecommunications closet.

A commercial data center is a facility that may be used to run the computer-based applications that handle the core electronic business and operational data of one or more organizations. The expansion of the Internet has also led to a growing need for a so-called "Internet data centers," which are data centers that are used by online retailers, Internet portals, search engine companies and the like to provide large numbers of users simultaneously, secure, high-speed, fail-safe access to their web sites. Both types of data centers may host hundreds, thousands or even tens of thousands of servers, routers, memory storage systems and other associated equipment. In these data centers, fiber optic communications cables and/or communications cables that include four differential pairs of insulated conductive (e.g., copper) wires are typically used to provide a hard-wired communications system that interconnects the data center equipment.

As noted above, the communications cables and connectors in conductive wire-based communication systems that are installed in both office buildings and data centers usually include eight conductors that are arranged as four differential pairs of conductors. Such communications systems typically use RJ-45 plugs and jacks to ensure industry-wide compatibility. Pursuant to certain industry standards (e.g., the TIA/EIA-568-B.2-1 standard approved Jun. 20, 2002 by the Telecommunications Industry Association), the eight conductors in RJ-45 plug and jack connectors are aligned in a row in the connection region where the contacts of the plug mate with the contacts of the jack. FIG. 1 is a schematic view of the front portion of an RJ-45 jack that illustrates the pair arrangement and positions of the eight conductors in this connection region that are specified in the type B configuration of the TIA/EIA-568-B.2-1 standard, which is the most widely used configuration. As shown in FIG. 1, under the TIA/EIA 568 type B configuration, conductors 4 and 5 comprise differential pair 1, conductors 1 and 2 comprise differential pair 2, conductors 3 and 6 comprise differential pair 3, and conductors 7 and 8 comprise differential pair 4. Herein, a differential pair of conductors may be referred to simply as a "pair."

In both office network and data center communications systems, the communications cables that are connected to end devices (e.g., network servers, memory storage devices, network switches, work area computers, printers, facsimile machines, telephones, etc.) may terminate into one or more communications patching systems that may simplify later connectivity changes. Typically, a communications patching system includes one or more "patch panels" that are mounted on equipment rack(s) or in cabinet(s), and a plurality of "patch cords" that are used to make interconnections between different pieces of equipment. As is known to those of skill in the art, a "patch cord" refers to a communications cable (e.g., a cable that includes four differential pairs of copper wires or a fiber optic cable) that has a connector such as, for example, an RJ-45 plug or a fiber optic connector, on at least one end thereof. A "patch panel" refers to an inter-connection device that includes a plurality (e.g., 24 or 48) of connector ports. Each connector port (e.g., an RJ-45 jack or a fiber optic adapter) on a patch panel may have a plug aperture on a front side thereof that is configured to receive the connector of a patch cord (e.g., an RJ-45 plug), and the back end of each connector port may be configured to receive a communications cable. With respect to RJ-45 connector ports, each communications cable is typically terminated into the back end of the RJ-45 connector port by terminating the eight conductive wires of the cable into corresponding insulation displacement contacts ("IDCs") or other wire connection terminals of the connector port. Consequently, each RJ-45 connector port on a patch panel acts to connect the eight conductors of the patch cord that is plugged into the front side of the connector port with the corresponding eight conductors of the communications cable that is terminated into the back end of the connector port. The patching system may optionally include a variety of additional equipment such as rack managers, system managers and other devices that facilitate making and/or tracking patching connections.

In a typical office network, "horizontal" cables are used to connect each work area outlet (which typically are RJ-45 jacks) to the back end of a respective connector port (which also typically are RJ-45 jacks) on a first set of patch panels. The first end of each of these horizontal cables is terminated into the IDCs of a respective one of the work area outlets, and the second end of each of these horizontal cables is terminated into the IDCs of a respective one of the connector ports on the patch panel. In an "inter-connect" patching system, a single set of patch cords is used to directly connect the connector ports on a first set of patch panels to respective connector ports on network switches. In a "cross-connect" patching system, a second set of patch panels is provided, and the first set of patch cords is used to connect the connector ports on the first set of patch panels to respective connector ports on the second set of patch panels, and the second set of typically single-ended patch cords is used to connect the connector ports on the second set of patch panels to respective connector ports on the network switches. In both inter-connect and cross-connect patching systems the cascaded set of plugs, jacks and cable segments that connect a connector port on a network switch to a work area end device is typically referred to as a channel. Thus, if RJ-45 jacks are used as the connector ports, each channel includes four communications paths (since each jack and cable has four differential pairs of conductors).

The connections between the work area end devices and the network switches may need to be changed for a variety of reasons, including equipment changes, adding or deleting users, office moves, etc. In an inter-connect patching system, these connections are typically changed by rearranging the patch cords in the set of patch cords that run between the first set of patch panels and the network switches. In a cross-connect patching system, the connections between the work area end devices and the network switches are typically changed by rearranging the patch cords in the set of patch cords that run between the first set of patch panels and the second set of patch panels. Both types of patching systems allow a network manager to easily implement connectivity changes by simply unplugging one end of a patch cord from a first connector port on one of the patch panels in the first set of patch panels and then plugging that end of the patch cord into a second connector port on one of the patch panels in the first set of patch panels.

The connectivity between the connector ports on the network switches and the work area outlets is typically recorded in a computer-based log. Each time patching changes are made, this computer-based log is updated to reflect the new patching connections. Unfortunately, in practice technicians may neglect to update the log each and every time a change is made, and/or may make errors in logging changes. As such, the logs may not be complete and/or accurate.

In order to reduce or eliminate such logging errors, a variety of systems have been proposed that automatically log the patch cord connections in a communications patching system. These automated patching systems typically use special "intelligent" patch panels that employ sensors, radio frequency identification tags, serial ID chips and the like and/or special patch cords that include an additional conductor to detect patch cord insertions and removals and/or to automatically track patching connections. Typically, these systems require that all of the patch panels in the patching system have these automatic tracking capabilities and, in inter-connect systems, may also require that the network switches include automatic tracking capabilities as well.

The use of common mode signalling has also been explored as a means for automatically tracking patch cord connections in a communications patching system. As noted above, communications systems that use conductive wires as the cabling media typically transmit each communications signal as a differential signal. As known to those of skill in the art, differential signalling refers to a technique whereby an information signal is transmitted between devices over a pair of conductors rather than over a single conductor. With differential signalling, the signals transmitted on each conductor of the differential pair have equal magnitudes, but opposite phases, and the information signal is embedded as the voltage difference between the signals carried on the two conductors of the pair. Differential signalling is used because it can reduce the impact that external noise sources may have on the transmitted signal. In particular, when signals are transmitted over a tightly twisted differential pair of conductors, electrical noise from external sources will typically be picked up by each conductor of the pair in approximately equal amounts. As the information signal is extracted from the differential pair by taking the difference of the signals carried on the two conductors of the pair, the approximately equal amounts of noise that are picked up by each conductor cancel out in the subtraction process. As such, the use of differential signalling can reduce the impact of external noise sources on a transmitted signal.

In a communications system that includes multiple differential pairs per cable/connector, such as RJ-45 communications systems, "common mode" signalling may be used to transmit one or more additional signals over the cables and connectors. As known to those of skill in the art, a common mode signal refers to the part of a signal that is transmitted between devices over two (or more) conductors that is extracted from the transmitted signal by taking the voltage average of the signals carried on the two (or more) conductors. Theoretically, a common mode and a differential signal may be transmitted over a differential pair without interfering with each other. In particular, since the differential information signal is extracted from the differential pair by taking the difference between the signals carried by the two conductors of the pair, the common mode signal is theoretically removed by the subtraction process. Likewise, the differential signal does not theoretically interfere with the common mode signal as the differential signal adds equal but opposite signals that cancel out when the signals on each conductor of the pair are averaged to recover the common mode signal.

In a communications cable that includes multiple pairs of conductors, multiple common mode signals may be transmitted along with the differential signals. By way of example, in a communications cable that includes two differential pairs (four conductors total), a differential signal may be transmitted over each differential pair and a common mode signal may also be transmitted over each differential pair for a total of four transmitted information signals. Alternatively, the two common mode signals may be replaced with a third differential signal that is simultaneously transmitted over all four conductors. In particular, the third differential signal may be transmitted by transmitting its negative component as a common mode signal over both conductors of the first differential pair, and by transmitting its positive component as a common mode signal over both conductors of the second differential pair. As the transmission of the negative component of the third differential signal adds the exact same signal to each conductor of the first differential pair, the negative component of the third differential signal is effectively removed from the first differential pair during the subtraction process that is used to recover the first differential signal. The same is true for the positive component of the third differential signal that is transmitted over the second differential pair. Thus, in the above-described manner two differential pairs may be used to transmit a total of three differential signals. Although it cannot be characterized as a common mode signal, the third differential signal is comprised of two oppositely polarized common mode components, and thus it involves the use of common mode signalling. In order to distinguish signals such as the above-described third differential signal from both standard differential signals that are carried on two conductors and from true common mode signals, herein differential signals that are comprised of two oppositely polarized common mode components are referred to as "phantom mode" signals.

U.S. Pat. No. 7,573,254 to Cobb et al. ("the '254 patent") discloses patch panels that include port identification circuits that transmit control signals over a phantom mode transmission path to track patch cord connections. In an embodiment disclosed in the '254 patent, a center tap inductor is used to inductively couple the phantom mode signal onto two of the differential pairs in a communications channel U.S. Patent Publication No. 2010/0008482 to Tucker discloses techniques in which phantom mode signalling is used to discover the patch panel connector ports in first and second patching zones to which backbone cables are connected. U.S. Patent Application No. 2010/0244998 to Peyton et al. discloses injecting phantom mode signals onto a communications cable in order to determine interconnections within a local area network.

SUMMARY

Pursuant to embodiments of the present invention, methods of detecting a plug insertion into a plug aperture of a communications connector are provided in which a control signal is transmitted to a control signal input circuit of the communications connector that includes a reactive coupling element. The control signal is electromagnetically coupled through the control signal input circuit. The electromagnetically coupled control signal is thereafter detected on a first differential pair of conductive paths that are included in the connector. A determination is made that a plug is present in the plug aperture based at least in part on detecting the electromagnetically coupled control signal on the first differential pair of conductive paths.

In some embodiments, the control signal is electromagnetically coupled onto the first differential pair of conductive paths as a common mode signal. The method may further include electromagnetically coupling a second control signal from a second control signal input circuit onto a second differential pair of conductive paths that are included in the connector. In such embodiments, the control signal and the second control signal may together comprise a differential control signal.

In some embodiments, the control signal may be a first component of a phantom mode control signal, and a second component of the phantom mode control signal that is oppositely phased from the first component is electromagnetically coupled onto a second differential pair of conductive paths that are included in the connector. The first component of the phantom mode control signal may be electromagnetically coupled onto the first differential pair of conductive paths via a first capacitive circuit having an input terminal, a first output terminal and a second output terminal, and the second component of the phantom mode control signal may be electromagnetically coupled onto the second differential pair of conductive paths via a second capacitive circuit having an input terminal, a first output terminal and a second output terminal. The connector may include first through eighth spring contacts that each mate with a respective one of first through eighth contact pads. The first and second spring contacts may be part of the first differential pair of conductive paths, and the first and second contact pads that mate with the respective first and second spring contacts may comprise first and second output terminals of the first capacitive circuit. In some embodiments, the connector may be configured such that the insertion of a plug into the plug aperture thereof completes an electrical connection between the first differential pair of conductive paths and the control signal input circuit.

Pursuant to still further embodiments of the present invention, communications jacks are provided that include spring contacts that have plug contact regions that comprise input ports of the jack and wire connection contacts that include wire contact regions that comprise output ports of the jack. These jacks further include conductive paths that connect respective ones of the spring contacts to respective ones of the wire connection contacts, where the conductive paths are arranged as a plurality of differential pairs of conductive paths. The jack also have a control signal input circuit that is configured to inject a common mode control signal onto a first of the differential pairs of conductive paths and a control signal output circuit that is configured to output at least a portion of the injected common mode control signal. Finally, the jacks include a plug insertion detection circuit that is coupled to the control signal output circuit.

In some embodiments, the control signal circuit input may be configured to electromagnetically couple the common mode control signal onto the first of the differential pairs of conductive paths. The control signal input circuit may be a capacitor. The control signal input circuit may be separate from both the input ports and the output ports for the first of the differential pairs of conductive paths. The control signal input circuit may be a capacitor having an input terminal, a first output terminal and a second output terminal, where the input terminal is coupled to a control signal generator and first and second output terminals are coupled to the respective conductive paths of the first of the differential pairs of conductive paths. The jack may further include a first contact pad that is positioned adjacent a first of the spring contacts that is connected to a first of the conductive paths of the first differential pair of conductive paths, where the first contact pad is positioned so that it does not contact the first of the spring contacts when the first of the spring contacts is in a resting position and so that it contacts the first of the spring contacts when a mating plug is inserted within the plug aperture to resiliently deflect the first of the spring contacts.

Pursuant to additional embodiments of the present invention, methods of detecting insertion of a plug into a plug aperture of a communications jack are provided in which a plug insertion detection signal is transmitted to a plug insertion detection circuit that includes a switch that selectively opens and closes the plug insertion detection circuit, a received version of the plug insertion detection signal is received at a receiver, and a determination is made that the plug is present within the plug aperture based on receipt of the received version of the plug insertion detection signal.

In some embodiments, the plug insertion detection circuit may include a capacitor that capacitively couples the plug insertion detection signal onto at least a first conductor of a first differential pair of conductive paths through the jack. The switch may be a spring contact and a mating contact pad. The contact pad may be positioned so that insertion of a mating plug within the plug aperture resiliently deflects the spring contact into physical and electrical contact with the contact pad.

Pursuant to additional embodiments of the present invention, communications jacks are provided that include a plurality of spring contacts that have plug contact regions that comprise input ports of the jack and a plurality of wire connection contacts that include wire contact regions that comprise output ports of the jack. A plurality of conductive paths connect respective ones of the spring contacts to respective ones of the wire connection contacts. These conductive paths are arranged as a plurality of differential pairs of conductive paths. A first contact pad is positioned adjacent a first of the spring contacts that is connected to a first of the conductive paths of the first differential pair of conductive paths, where the first contact pad is positioned so that it does not contact the first of the spring contacts when the first of the spring contacts is in a resting position and so that it contacts the first of the spring contacts when a mating plug is inserted within the plug aperture to resiliently deflect the first of the spring contacts. A control signal input circuit is also provided that is configured transfer a signal onto at least one conductive path of a first of the differential pairs of conductive paths, independent of whether a mating plug is inserted within the plug aperture.

In some embodiments, the control signal input circuit is a capacitor. The control signal input circuit may be configured to receive a control signal that is used to map a cabling connection between the communications jack and a second communications jack, independent of whether a mating plug is inserted within the plug aperture. The control signal input circuit may be configured to transfer a signal from a building infrastructure system onto at least one of a plurality of differential pairs of conductors of an Ethernet cable as a common mode signal or as a phantom mode signal.

BRIEF DESCRIPTION OF THE DRAWINGS

FIG. 21A is a schematic front view of a jack that includes a plug insertion/removal detection circuit according to further embodiments of the present invention.

FIG. 21B is a top schematic view of two electrodes that form a capacitor that is part of the plug insertion/removal detection circuit of the jack of FIG. 21A.

FIG. 22A is a schematic front view of a jack that includes a plug insertion/removal detection circuit according to still further embodiments of the present invention.

FIG. 22B is a top schematic view of a capacitor that is part of the plug insertion/removal detection circuit of the jack of FIG. 22A.

DETAILED DESCRIPTION

Pursuant to embodiments of the present invention, methods and systems (and related connectors and equipment) for tracking connectivity in a communications system are provided that use phantom mode control signals. These methods and systems may be used to track patching connections between two patch panel fields (i.e., in cross-connect patching systems) or between a patch panel field and a plurality of network switches (i.e., in inter-connect patching systems). Additionally, in some embodiments, the methods and systems may be used to track connections all the way to individual modular wall jacks and/or to end devices in the work area and/or in the computer room. Thus, the communications systems according to certain embodiments of the present invention can automatically (1) track patching connections between patch panels and/or between patch panels and network switches, (2) monitor connectivity of horizontal cabling to work area outlets and (3) track end devices in order to determine the end-to-end connectivity of a channel. The methods and systems disclosed herein may be implemented on both unshielded and shielded twisted pair communications systems.

In some embodiments, the phantom mode control signals that are used to track connectivity may be inserted into a communications channel by capacitively coupling the phantom mode control signal onto various of the conductors of the channel at one of the connector ports along the channel. Such capacitive coupling techniques may be implemented at very low cost within the connector ports, and may not require any changes to the communications cables (including patch cords) that are used in the communications system. This is in stark contrast to many other existing and proposed intelligent patching solutions, which often require specialized patch cords that include extra conductors and modified plug connectors. In some embodiments, the phantom mode control signaling may be combined with technology that detects plug insertions and removals at, for example, some or all of the connector ports in the communications system. Such plug insertion and removal detection technology may provide a number of additional advantages, which will be discussed below.

Figure 2:
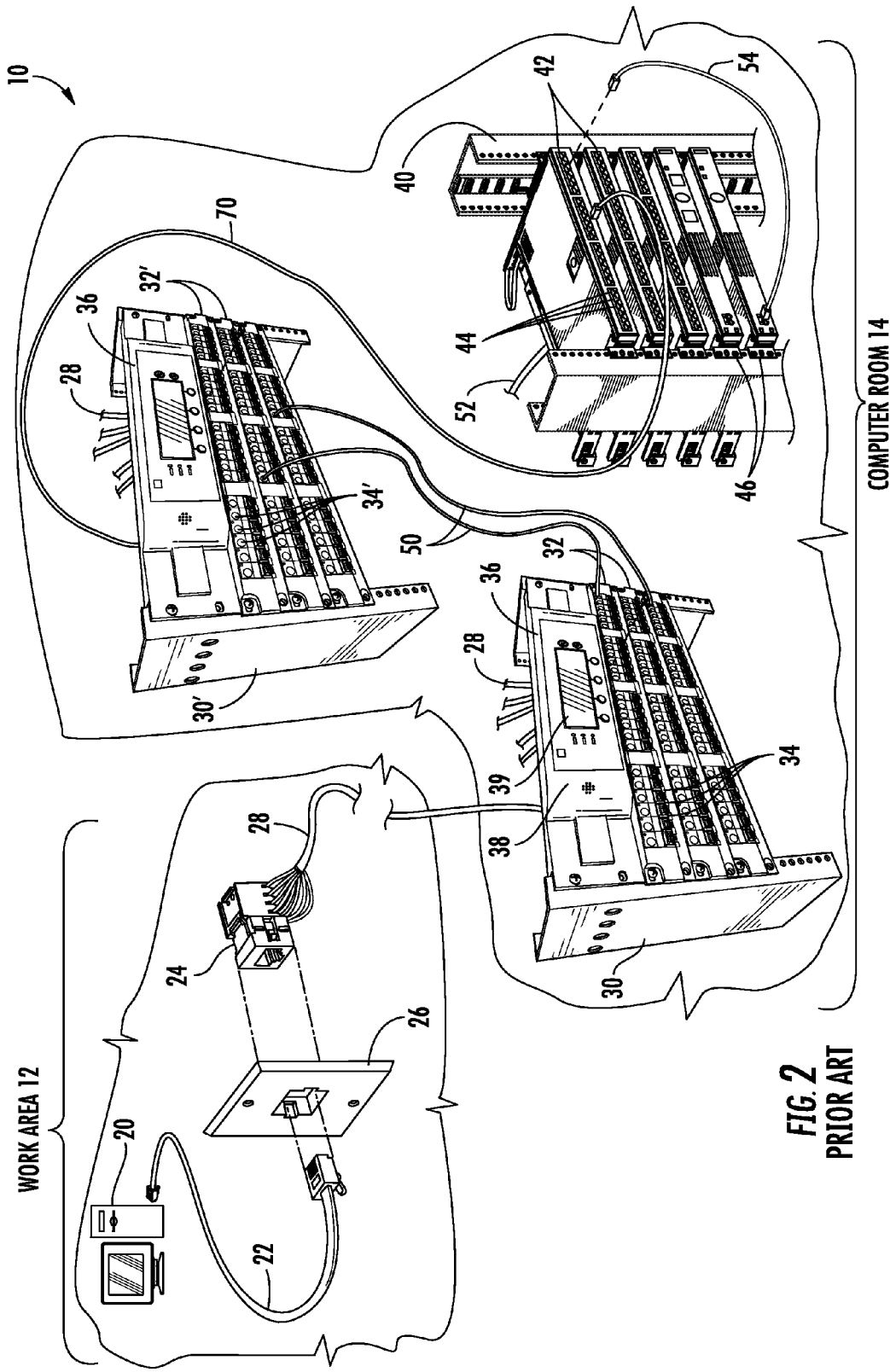
FIG. 2 is a simplified, schematic view of an exemplary cross-connect communications system on which the phantom mode signalling techniques according to certain embodiments of the present invention may be implemented.

FIG. 2 is a schematic view of a cross-connect communications system 10 that may be used to connect computers, printers, Internet telephones and other end devices that are located in work areas throughout a building to network equipment that is located, for example, in a computer room of the building. The phantom mode control signalling techniques discussed herein may be implemented on some or all of the channels of the communications system 10 of FIG. 2. As shown in FIG. 2, an exemplary computer 20 or other end device is located in a work area 12 of the building. The computer 20 is connected by a patch cord 22 to a modular wall jack 24 that is mounted in a wall plate 26 in work area 12. A communications cable 28 is routed from the back end of the wall jack 24 through, for example, the walls and/or ceiling of the building, to a computer room 14. As there may be hundreds or thousands of work area wall jacks 24 in an office building, a large number of cables 28 may be routed into the computer room 14. While only a single work area end device (computer 20) is shown in FIG. 2 to simplify the drawing, it will be appreciated that there would be dozens, hundreds or thousands of work area end devices in a typical communications system.

A first equipment rack 30 is provided in the computer room 14. A plurality of patch panels 32 are mounted on the first equipment rack 30. Each patch panel 32 includes a plurality of connector ports 34. Each cable 28 from the wall jacks 24 in the work area 12 is terminated onto the back end of one of the connector ports 34 of one of the patch panels 32. In FIG. 2, each connector port 34 comprises an RJ-45 jack. However, it will be appreciated that other types of connector ports may be used such as, for example, RJ-11 connector ports.

A rack controller 36 may also be mounted on the first equipment rack 30. The rack controller 36 may include a central processing unit ("CPU") 38 and a display 39. The rack controller 36 may be interconnected with rack controllers that are provided on other patch panel equipment racks of the communications system (only two such rack controllers 36 are shown in the example of FIG. 2) so that the rack controllers 36 can communicate in a common network as if they were a single controller. The CPU 38 of rack controller 36 may include a remote access port that enables the CPU 38 to be accessed by a remote computer such as, for example, a system administrator computer (not shown in FIG. 2). The rack controller 36 may, for example, gather data from intelligent tracking capabilities of the patch panels 32, as will be explained herein.

The communications patching system 10 further includes a second set of patch panels 32' that are mounted on a second equipment rack 30'. Each patch panel 32' includes a plurality of connector ports 34', and a rack controller 36 may also be mounted on the second equipment rack 30'. A first set of patch cords 50 is used to interconnect the connector ports 34 on the patch panels 32 to respective ones of connector ports 34' on the patch panels 32'.

As is further shown in FIG. 2, network devices such as, for example, one or more network switches 42 and network routers and/or servers 46 are mounted, for example, on a third equipment rack 40. Each of the switches 42 may include a plurality of connector ports 44, and each network router and/or server 46 may also include one or more connector ports. One or more external communications lines 52 are connected to at least some of the network devices 46 (either directly or through a patch panel that is not shown in FIG. 2). A second set of single-ended patch cords 70 connects the connector ports 44 on the switches 42 to respective ones of the back ends of the connector ports 34' on the patch panels 32'. A third set of patch cords 54 may be used to interconnect other of the connector ports 44 on the switches 42 with the connector ports provided on the network routers/servers 46. In order to simplify FIG. 2, only two patch cords 50, a single patch cord 70 and a single patch cord 54 are shown.

The communications patching system of FIG. 2 may be used to connect each work area computer 20 or other work area end device to the network switches 42, the network switches 42 to the network routers and servers 46, and the network routers/servers 46 to external communications lines 52, thereby establishing the physical connectivity required to give devices 20 access to both local and wide area networks. In the cross-connect patching system of FIG. 2, connectivity changes are typically made by rearranging the patch cords 50 that interconnect the connector ports 34 on the patch panels 32 with respective of the connector ports 34' on the patch panels 32'. It should also be noted that in many cases the patching connections may be between patch panels that are mounted on the same equipment rack or even between connector ports on the same patch panel. Thus, it will be understood that FIG. 2 illustrates the work area outlets being connected to patch panels that are on a first equipment rack and the network switches being connected to patch panels on a second equipment rack to provide a simple, easy to understand example. The present invention is not limited to such configurations.

FIG. 2 illustrates one exemplary, rather simple, communications system 10. It will be appreciated that many changes may be made to the communication system 10 without departing from the scope of the present invention. For example, the techniques disclosed herein can be employed on communications systems that are simpler than the exemplary communications system of FIG. 2. In other embodiments, the end-to-end connectivity between work area end devices and network end devices may be more complicated than shown in FIG. 2, with additional intervening patch panels, consolidation points, horizontal cables, patch cords, etc. As will be discussed in more detail below, phantom mode control signals may be used to automatically determine and/or confirm patching connections between the patch panels 32 mounted on the first equipment rack 30 and the patch panels 32' mounted on the second equipment rack 30', thereby allowing a network administrator to automatically generate and subsequently maintain the computer-based log of patching connections. Additionally, in some embodiments, the communications system 10 may also automatically track connections to the modular wall jacks 24 and/or end-to-end device connectivity, as will be explained in further detail below.

Figure 3:
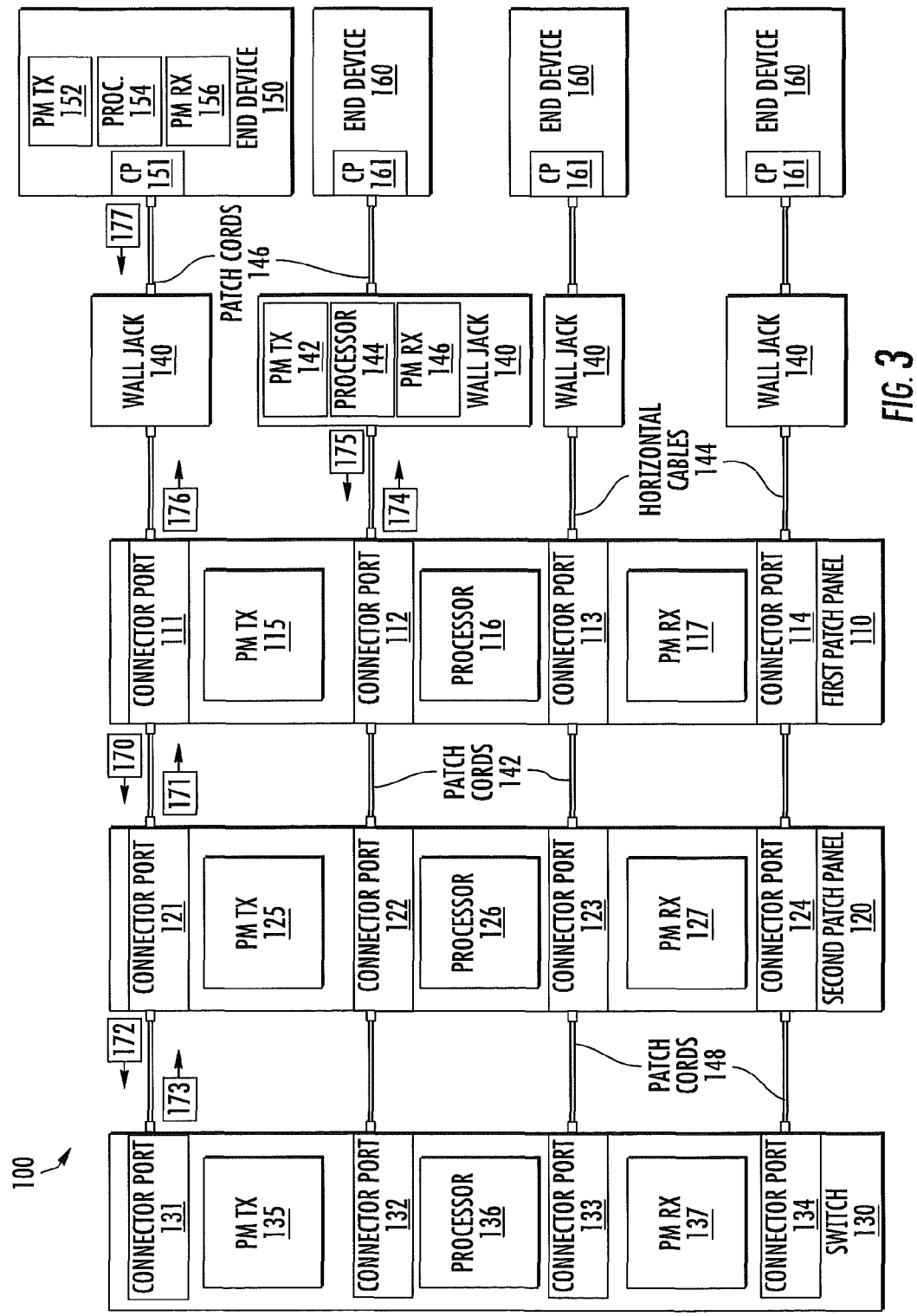
FIG. 3 is a block diagram of a simplified cross-connect communications patching system according to embodiments of the present invention that illustrates how common mode control signals may be used to track patching connections and end-to-end channel connectivity.

FIG. 3 is a block diagram illustrating a simplified communications patching system 100 that will be used to describe how phantom mode control signals may be used to track patch cord and/or cabling connections in communications systems according to certain embodiments of the present invention. Note that herein the terms "phantom mode control signal" and "phantom mode communications signal" are used interchangeably, and refer to a signal that is transmitted using phantom mode signalling techniques that includes control information therein such as, for example, information that may be used to track cabling connections. It will be appreciated that the phantom mode control signals may also carry data in some embodiments.

As shown in FIG. 3, the communications patching system 100 includes a first patch panel 110, a second patch panel 120, a network switch 130, a plurality of work area modular wall jacks 140 and various work area end devices 150, 160. Network end devices (not shown in FIG. 3) would also be provided that are connected through the network switch 130. Patch cords 142 are used to interconnect connector ports 111-114 on the first patch panel 110 with connector ports 121-124 on the second patch panel 120. The back ends of the connector ports 111-114 on the first patch panel 110 are connected to the wall jacks 140 by respective horizontal cables 144. Patch cords 146 are used to connect the wall jacks 140 to the respective connector ports 151, 161 on the end devices 150, 160. The back ends of the connector ports 121-124 on the second patch panel 120 are connected to respective connector ports 131-134 on the switch 130 by respective single-ended patch cords 148. It will be noted that the block diagram of FIG. 3 shows a very simple communications patching system with two four-connector port patch panels 110, 120 and a single network switch 130 for purposes of illustrating operation of embodiments of the present invention, and it will be appreciated that typical communications patching systems in which the present invention will be employed will be much larger and far more complex than the exemplary system shown in FIG. 3.

As shown in FIG. 3, a phantom mode transmitter 115, a processor 116 and a phantom mode receiver 117 are provided on the first patch panel 110, and a phantom mode transmitter 125, a processor 126 and a phantom mode receiver 127 are provided on the second patch panel 120. A switch, multiplexer or the like (not shown in FIG. 3) may also be provided on each of the first and second patch panels 110, 120 so that the phantom mode transmitters 115, 125 and phantom mode receivers 117, 127 may be used to send/receive signals from each of the connector ports 111-114, 121-124 on the respective patch panels 110, 120. In other embodiments, each connector port 111-114, 121-124 may have its own phantom mode transmitter and/or phantom mode receiver, and the switch or multiplexer may be omitted. Herein, the phantom mode transmitters, phantom mode receivers, processors and any associated switches or multiplexers that are used to generate, receive and/or distribute phantom mode control signals are referred to generically as "phantom mode control signalling circuitry."

As is also shown in FIG. 3, in some embodiments, a phantom mode transmitter 135, a processor 136 and a phantom mode receiver 137 may also be provided on or at the network switch 130, although these components may be omitted in other embodiments. A switch or multiplexer (not shown in FIG. 3) may likewise be provided on network switch 130 so that the phantom mode transmitter 135 and/or the phantom mode receiver 137 may be shared across all of the connector ports 131-134 on network switch 130. As is further shown in FIG. 3, the work area end device 150 may (optionally) include a phantom mode transmitter 152, a processor 154 and/or a phantom mode receiver 156. Other work area devices such as the depicted work area devices 160 may not include any phantom mode control signalling circuitry.

Operation of the phantom mode control channel will now be described with reference to FIG. 3. Operations may begin with the processor 116 on the first patch panel 110 sending a control signal to the phantom mode transmitter 115. In response to this control signal, the phantom mode transmitter 115 may generate and transmit a first phantom mode control signal 170 over a first phantom mode communications path that extends from the first connector port 111 on the first patch panel 110 to the first connector port 121 on the second patch panel 120. As discussed above, this first phantom mode communications path may comprise two of the differential pairs of the patch cord 142 that extends between connector port 111 and connector port 121, and the phantom mode control signal 170 may be carried over this first phantom mode communications path simultaneously with differential communications signals that are transmitted over the two differential pairs. (As will be discussed below, in other embodiments the phantom mode communications path may use more than two of the differential pairs of the patch cord 142.) The phantom mode control signal 170 may include, among other things, a unique identifier that is associated with the connector port 111. For example, in some embodiments, the unique identifier could be the serial number or MAC ID of the first patch panel 110 combined with a port number that identifies the connector port 111.

The first phantom mode control signal 170 is received at the connector port 121 on the second patch panel 120, and then is extracted from the connector port 121 in an appropriate manner (exemplary methods of extracting phantom mode control signals from a phantom mode communications path will be described later herein). The first phantom mode control signal 170 is then routed to the phantom mode receiver 127 on the second patch panel 120 (e.g., via a switch or multiplexer) where the signal is received and demodulated (if necessary). The received/demodulated version of the first phantom mode control signal 170 is then provided to the processor 126 on the second patch panel 120. As the processor 126 is able to determine that the received first phantom mode control signal 170 was routed through connector port 121, the processor 126 may use the first phantom mode control signal 170 to discover and/or confirm that a patch cord connection exists between the first connector port 111 on the first patch panel 110 (since the unique identifier for this connector port is contained in the first phantom mode control signal 170) and the first connector port 121 on the second patch panel 120. The processor 126 may provide this information to, for example, a rack manager (e.g., rack manager 36 of FIG. 2), a system manager (not shown) and/or other processing devices that create and/or maintain a log of the patch cord and cabling connections in the communications patching system 100.

In a similar fashion, the processor 126 on the second patch panel 120 may send a control signal to the phantom mode transmitter 125 on the second patch panel 120. In response to this control signal, the phantom mode transmitter 125 may generate a second phantom mode control signal 171 and transmit this second phantom mode control signal 171 over the first phantom mode communications path that extends between the first connector port 111 on the first patch panel 110 and the first connector port 121 on the second patch panel 120. The second phantom mode control signal 171 may include a unique identifier that is associated with the connector port 121.

The second phantom mode control signal 171 is received at the connector port 111 on the first patch panel 110, and then is extracted from the connector port 111 in an appropriate manner. The second phantom mode control signal 171 may then be routed to the phantom mode receiver 117 on the first patch panel 110, where the phantom mode control signal 171 is received and demodulated (if necessary). The received/demodulated version of the second phantom mode control signal 171 is then provided to the processor 116 on the first patch panel 110. As the processor 116 is able to determine that the received second phantom mode control signal 171 was routed through connector port 111, the processor 116 may use the second phantom mode control signal 171 to discover and/or confirm that a patch cord connection exists between the first connector port 111 on the first patch panel 110 and the first connector port 121 on the second patch panel 120 (based on the unique identifier for the first connector port 121 on the second patch panel 120 that is included in the second phantom mode control signal 171) The processor 116 may provide this information to, for example, a rack manager (e.g., rack manager 36 of FIG. 2), a system manager (not shown) and/or other processing devices that create and/or maintain a log of the patch cord and cabling connections in the communications patching system 100. By sending phantom mode control signals over each connector port included on the patch panels 110, 120, the processors 116, 126 can determine the connections between the patch panels 110 and 120.

In the above description of the operation of the automatic connection tracking capabilities of communications patching system 100, both the first patch panel 110 and the second patch panel 120 transmit phantom mode control signals that are used to discover and/or confirm the patching connections therebetween. However, it will be appreciated that in other embodiments the number of phantom mode control signals may be reduced or changed. By way of example, in some embodiments, only the first patch panel 110 (or, in a more complex system, each of the patch panels in the work area side patching field) will send phantom mode control signals to the second patch panel 120, as this may be sufficient to discover and provide to a connection database all of the patching connections between the first patch panel 110 and the second patch panel 120. As another example, the system may alternatively be designed so that only the second patch panel 120 (or, in the more complex system mentioned above, each of the patch panels in the network side patching field) sends phantom mode control signals to the first patch panel 110. Other configurations are also obviously possible. Thus, it will be appreciated that the description herein simply provides examples as to how the phantom mode control signalling techniques according to embodiments of the present invention may be used to automatically track patching connections, and that these examples are not intended to be exhaustive or limiting.

While changes in connectivity will typically be implemented in the communications system 100 by rearranging the connections formed by the patch cords 142 between the connector ports 111-114 and 121-124 on the first and second patch panels 110, 120, connection changes may occur in other locations. By way of example, network switches such as switch 130 typically include RJ-45 connector ports, and hence patch cords 148 are used to connect the connector ports 121-124 on the second patch panel to the respective connector ports 131-134 on the switch 130 (these patch cords 148 typically are one-sided patch cords that each have a first end that is directly terminated into the IDC array of one of the connector ports 121-124 of the second patch panel 120, and a second end that includes an RJ-45 plug that is plugged into one of the RJ-45 connector ports 131-134 on switch 130). The inclusion of patch cord connections at the connector ports 131-134 of switch 130 leaves the possibility that someone may intentionally or inadvertently rearrange the patching connections into the switch 130, and hence it may be desirable to automatically track the patching connections between the patch panels in the cross-connect field (e.g., patch panel 120 in the simplified example of FIG. 3) and the switch 130.

This tracking may be performed, for example, by having the processor 126 on the second patch panel 120 send a control signal to the phantom mode transmitter 125 that causes the phantom mode transmitter 125 to generate and transmit a third phantom mode control signal 172 over a second phantom mode communications path that extends from, for example, the first connector port 121 on the second patch panel 120 to the first connector port 131 on the switch 130. The second phantom mode communications path may comprise two of the differential pairs of the patch cord 148 that extends between connector port 121 and connector port 131. The third phantom mode control signal 172 may include a unique identifier that is associated with the connector port 121. For example, in some embodiments, the unique identifier could be the serial number or MAC ID of the second patch panel 120 combined with a port number that identifies the first connector port 121.

The third phantom mode control signal 172 is received at the connector port 131 on the switch 130, and then is extracted from the connector port 131 and routed to the phantom mode receiver 137 on the switch 130, where it is received and demodulated (if necessary). The received/demodulated version of the third phantom mode control signal 172 is then provided to the processor 136 on the switch 130. As the processor 136 is able to determine that the received signal was routed through the connector port 131, the processor 136 may use the third phantom mode control signal 172 to discover and/or confirm that a patch cord connection exists between the first connector port 121 on the second patch panel 120 and the first connector port 131 on the switch 130. The processor 136 may provide this information to, for example, a rack manager (not shown), a system manager (not shown) and/or other processing devices that create and/or maintain a log of the patch cord and cabling connections in the communications patching system 100.

The processor 136 on the switch 130 may also (or alternatively) send a control signal to the phantom mode transmitter 135 that causes the phantom mode transmitter 135 to generate and transmit a fourth phantom mode control signal 173 over the second phantom mode communications path that extends between the first connector port 121 on the second patch panel 120 and the first connector port 131 on the switch 130. This fourth phantom mode control signal 173 may include a unique identifier that is associated with the connector port 131 (e.g., the serial number or MAC ID of the switch 130 combined with a port number that identifies the first connector port 131). The fourth phantom mode control signal 173 is received at, and extracted from, the connector port 121 on the second patch panel 120, and is then routed to the phantom mode receiver 127 on the second patch panel 120, where it is received and demodulated (if necessary). The received/demodulated version of the fourth phantom mode control signal 173 is then provided to the processor 126 on the second patch panel 120, thereby allowing the processor 126 to discover and/or confirm that a patch cord connection exists between the first connector port 121 on the second patch panel 120 and the first connector port 131 on the switch 130. The processor 126 may provide this information to, for example, a rack manager (e.g., rack manager 36 of FIG. 2), a system manager (not shown) and/or other processing devices that create and/or maintain a log of the patch cord and cabling connections in the communications patching system 100.

It will be appreciated that while the above discussion envisions sending phantom mode control signals in both directions between the second patch panel 120 and the switch 130, in other embodiments the phantom mode control signals might only be sent in one direction. Thus, it will be appreciated that, in other embodiments, some of the hardware depicted in FIG. 3 may be omitted without degrading the capabilities of the system. As one example, the phantom mode receiver 137 on switch 130 (and perhaps the phantom mode transmitter 125 on the second patch panel 120) may be omitted and the connections between the second patch panel 120 and the switch 130 may be discovered solely by transmitting phantom mode control signals such as signal 173 from the switch 130 to the second patch panel 120.

As is further shown in FIG. 3, at least some of the wall jacks 140 may include a phantom mode transmitter 142, a processor 144 and/or a phantom mode receiver 146. The provision of phantom mode signalling capabilities at the wall jacks 140 may allow the automatic discovery and/or confirmation of the connections of the horizontal cables 144 that connect the wall jacks 140 (or other work area outlets) to the patch panels in the work area patch panel field (e.g., patch panel 110) in the computer room, and various other capabilities may also be provided over such a phantom mode control channel (e.g., the ability for a system administrator to determine from a remote location whether or not a patch cord is plugged into one of the wall jacks 140).

A horizontal cabling connection such as the connection between connector port 112 on the first patch panel 110 and wall jack 140 may be tracked as follows. First, the processor 116 on the first patch panel 110 sends a control signal to the phantom mode transmitter 115 that causes the phantom mode transmitter 115 to generate and transmit a fifth phantom mode control signal 174 over a third phantom mode communications path that extends from the connector port 112 on the first patch panel 110 to the wall jack 140. The third phantom mode communications path may comprise two of the differential pairs of the horizontal cable 144 that extends between connector port 112 and wall jack 140.

The fifth phantom mode control signal 174 is received at the wall jack 140, and then is extracted from the channel and routed to the phantom mode receiver 146, where it is received and demodulated (if necessary). The received/demodulated version of the fifth phantom mode control signal 174 is then provided to the processor 144. The fifth phantom mode control signal 174 prompts the processor 144 to send a control signal to the phantom mode transmitter 142 that causes the phantom mode transmitter 142 to generate and transmit a sixth phantom mode control signal 175 over the third phantom mode communications path that extends between the wall jack 140 the connector port 112. This sixth phantom mode control signal 175 may include a unique identifier that is associated with the wall jack 140 (e.g., an office number where the wall jack is located and the port number of the wall jack). The sixth phantom mode control signal 175 is received at, and extracted from, the connector port 112 on the first patch panel 110, and is then routed to the phantom mode receiver 117 on the first patch panel 110, where it is received and demodulated (if necessary). The received/demodulated version of the sixth phantom mode control signal 175 is then provided to the processor 116 on the first patch panel 110, thereby allowing the processor 116 to discover and/or confirm the horizontal cabling connection between connector port 112 and wall jack 140. The processor 116 may provide this information to, for example, a rack manager (e.g., rack manager 36 of FIG. 2) or a system manager (not shown).

The horizontal cables 144 that extend between the work area wall jacks 140 and the work area patch panel field (i.e., patch panel 110 in the simplified example of FIG. 3) are typically directly terminated into back end wire connection assemblies of the connector ports 111-114 on the first patch panel 110 and on the wall jacks 140, and hence cannot readily be removed and connected to other connector ports or jacks. Consequently, the horizontal cables 144 typically are not rearranged, and hence once a communications network has been installed, there may not be a compelling need to automatically track the connections between the first patch panel 110 and the wall jacks 140 that is sufficient to justify the added expense of providing phantom mode signalling capabilities at each wall jack 140. However, if phantom mode signalling capabilities are provided at the wall jacks 140, they may be used for a variety of purposes such as, for example, confirming that all of the horizontal cables were properly connected during the installation of the network and/or for detecting patch cord insertions and/or removals using various techniques that are described below.

Most intelligent communications patching systems do not have the capability to track connections to work area end devices such as the end devices 150, 160 of FIG. 3. However, according to some embodiments of the present invention, phantom mode control channels may be provided that extend all the way to work area end devices which may be used to automatically identify the work area end devices that are connected to a communications network. While not shown in FIG. 3, phantom mode control channels may also be provided that extend to network end devices such as network servers, memory storage devices, etc. These phantom mode control channels may be used to track the actual end devices that are connected to the communications system 100. This may be advantageous for a variety of reasons, as it allows a system administrator to discover the full end-to-end connectivity of the devices that are communicating over the communications system 100. This information may be used to, for example, provide enhanced security, automatically provision services to certain end devices, confirm that redundancy requirements and other network rules are being followed, and prohibit unauthorized access to the network, as will be discussed in greater detail below.

The capability of communications systems according to embodiments of the present invention to discover and track end devices will now be described with respect to the work area end device 150 of FIG. 3. As shown in FIG. 3, the processor 116 on the first patch panel 110 may send a control signal to the phantom mode transmitter 115 that causes the phantom mode transmitter 115 to generate and transmit a seventh phantom mode control signal 176 over a fourth phantom mode communications path that extends from the first connector port 111 on the first patch panel 110, through a wall jack 140, to a connector port 151 that is provided on the end device 150. The fourth phantom mode communications path may comprise, for example, two of the differential pairs on the horizontal cable 144 that extends between connector port 111 and wall jack 140, the corresponding two differential pairs in the wall jack 140, and the corresponding two differential pairs on the patch cord 146 that extends between wall jack 140 and connector port 151. The seventh phantom mode control signal 176 is received at the connector port 151 on the end device 150, and then is extracted from the connector port 151 and routed to the phantom mode receiver 156, where it is received and demodulated (if necessary). The received version of the seventh phantom mode control signal 176 is provided to the processor 154 on the work area end device 150, and is used to prompt the processor 154 to cause the phantom mode transmitter 152 to send an eighth phantom mode control signal 177 back to the first patch panel 110 over the fourth phantom mode communications path. This eighth phantom mode control signal 177 may include a unique identifier that is associated with the end device 150 such as, for example, the MAC ID of the device. The eighth phantom mode control signal 177 is received at, and extracted from, the connector port 111 on the first patch panel 110, and is then routed to the phantom mode receiver 117 on the first patch panel 110, where it is received and demodulated (if necessary). The received/demodulated version of the eighth phantom mode control signal 177 is then provided to the processor 116 on the first patch panel 110, thereby allowing the processor 116 to discover which particular work area end device 150 is connected through connector port 111. The processor 116 may provide this information to, for example, a rack manager (e.g., rack manager 36 of FIG. 2), a system manager (not shown) and/or other processing devices that create and/or maintain a log of the patch cord and cabling connections in the communications patching system 100. It will be appreciated that in some embodiments, the control signal 176 may be omitted, and the processor 154 on work area device may instead simply periodically (or non-periodically) transmit the eighth phantom mode control signal 177 without prompting.

Thus, in the exemplary manner described above, phantom mode control signals may be used to discover and/or confirm patching connections in the communications patching system 100, and/or to discover which specific end devices are connected on each channel.

While the discussion above regarding operation of the communications system of FIG. 3 discusses having modulated signals that include a data stream therein, it will be appreciated that the present invention is not so limited. For example, in other embodiments, the presence of a carrier or a phantom mode control signal can be used in of itself to, for example, confirm a patching connection.

It will be appreciated that once a phantom mode control signal is injected onto one or more of the differential pairs of a particular channel, that phantom mode control signal may propagate all the way from one end of the channel to the other end of the channel through multiple cable segments and connectors. By way of example, in the communications patching system of FIG. 3, the eighth phantom mode control signal 177 will propagate all the way from the end device 150 to the connector port 131 on the network switch 130 over the channel extending therebetween. Moreover, as shown in FIG. 3, more than one device can inject phantom mode control signals onto a particular channel. For example, in the communications patching system 100 of FIG. 3, the end device 150, the first patch panel 110, the second patch 120, and the switch 130 (and even the wall jacks 140 in some embodiments) can inject phantom mode control signals onto the channel extending, for example, between connector port 151 on end device 150 and connector port 131 on switch 130. Consequently, techniques may be used that prevent the multiple phantom mode control signals that may be transmitted on a particular channel from interfering with each other, and/or which allow the devices in the communications system 100 to distinguish between these different phantom mode control signals. For example, in one such embodiment, each device on a particular channel may be assigned a particular time slot in a time division multiple access communication scheme that allows the devices on a particular channel to send phantom mode control signals without interference and which allows each device to distinguish between the different phantom mode control signals. In other embodiments, frequency division multiple access schemes may be used. In still other embodiments, arbitration procedures may be used that prevent the transmission of interfering signals, and identification information may be included in the phantom mode control signals that allow the devices that receive such signals to determine the source of the signal. Other procedures and techniques may also be used.

A variety of different phantom mode control signals may be used. For example, the phantom mode control signal may or may not be modulated onto a carrier frequency. In one particular embodiment, the phantom mode control signal may comprise a frequency shift keyed ("FSK") alternating current signal that is modulated onto, for example, a 50 MHz carrier signal. In other embodiments, higher, out-of-band frequencies may be used (e.g., 800 MHz) to reduce the possibility that the phantom mode control signals interfere with the differential information signals that are also carried on the conductors of the phantom mode communications path. It will also be appreciated that other carrier frequencies and/or modulation types may be used. Modulated signals may be preferred in some embodiments because the magnitude of the phantom mode control signal may be reduced significantly (e.g., by 70 dB) through the capacitive coupling techniques that may be used to both inject the phantom mode control signal into a channel and to extract the phantom mode control signal from the channel in certain embodiments of the present invention. Such modulated signals may be less susceptible to corruption by noise. The magnitude of the phantom mode control signal may be set at a variety of levels. In some embodiments, the magnitude may be between about 0.5 volts and 3 volts, although a wide variety of magnitudes may be used. In typical implementations the phantom mode control signal is an alternating current signal, as such a signal will not be blocked by coupling capacitors and is compatible with Power-over-Ethernet patching systems.

It has further been discovered that in some embodiments the use of phantom mode control signals having a carrier frequency of between 25 MHz and 100 MHz may be preferred in certain situations. In particular, if higher frequency phantom mode control signals are used, excessive mode conversion may occur where a portion of the phantom mode control signal is converted to a differential mode signal that can potentially interfere with an information signal being transmitted differentially on a pair of conductors in the channel due to, for example, an imbalance in the transmission lines. This mode conversion can deleteriously impact channel performance, and can also lead to alien crosstalk problems on other channels in cabling that is bundled with the cables that carry the phantom mode control signal. Such mode conversion problems may be reduced for phantom mode control signals in the 25 MHz to 100 MHz range. Additionally, while even higher frequencies may be used such as, for example, frequencies greater than 800 MHz or 1 GHz that may fall outside of the band of the information signals carried on the differential pairs, the transmission losses over copper conductors may be prohibitively high at these frequencies, particularly where long cabling runs are used as may be commonplace in data centers and large commercial office buildings.

Figure 4A:
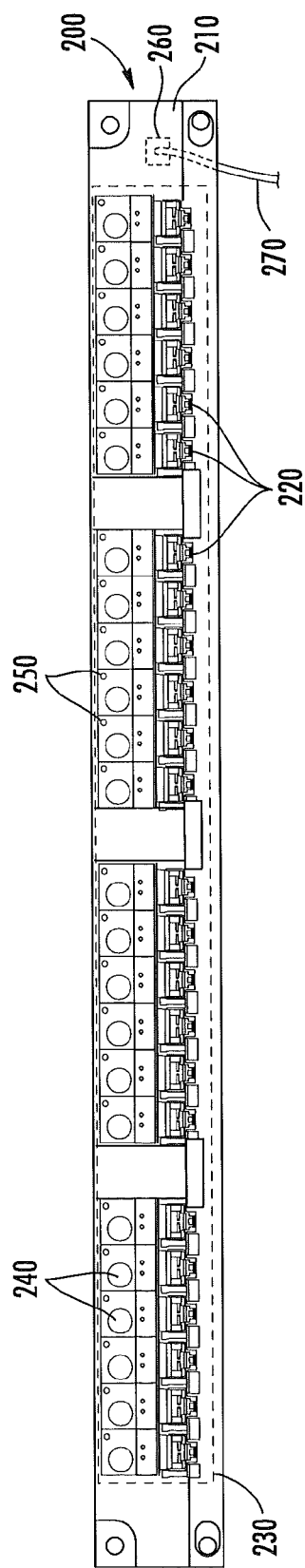
FIG. 4A is a schematic front view of a patch panel according to embodiments of the present invention that may be used as one of the patch panels in FIG. 2 or 3.
Figure 4B:
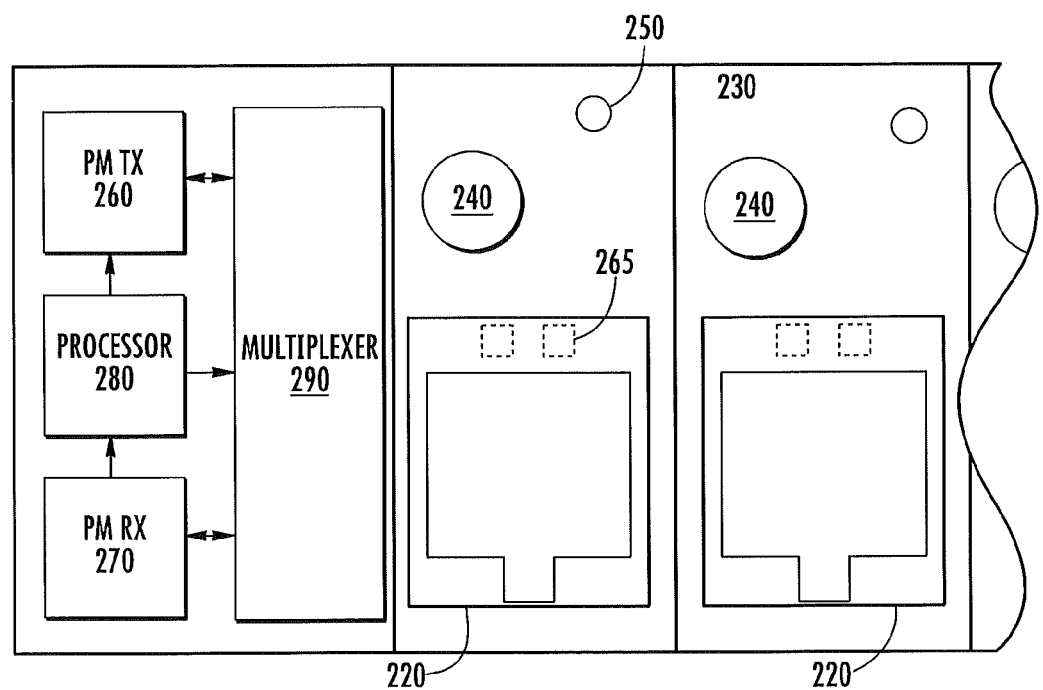
FIG. 4B is an enlarged front view of a portion of a printed circuit board of the patch panel of FIG. 4A.

FIGS. 4A-4B illustrate a patch panel 200 that may be used, for example, as one of the patch panels 32, 32' of FIG. 2 or as one of the patch panels 110, 120 of FIG. 3. FIG. 4A is a front view of the patch panel 200, while FIG. 4B is a schematic front view of a portion of a printed circuit board 230 of patch panel 200.

As shown in FIG. 4A, the exemplary patch panel 200 includes a mounting frame 210 and twenty-four connector ports 220 that are, in this embodiment, arranged as four groups of six connector ports 220. Each connector port 220 is implemented as an RJ-45 jack. A printed circuit board 230 is mounted on the front face of the mounting frame 210 and includes cut-out areas for each of the connector ports 220. The printed circuit board 230 is shown in outline representation in FIG. 4A as it may be partly or completely hidden beneath a cover or other protective or aesthetic housing. Trace buttons 240 and light emitting diodes ("LED") 250 may be mounted on the printed circuit board 230 adjacent each of the connector ports 220. The trace buttons 240 and LEDs 250 may be electrically connected to a microprocessor 280 (see FIG. 4B), and may be used, for example, to perform line tracing functions. In some embodiments, the trace buttons 240 and/or the LEDs 250 may be omitted. As is also shown in FIG. 3, the patch panel 200 further includes a connection 260 that receives one end of a communications cable 270 (e.g., a ribbon cable, an RJ-45 patch cord, etc.). The other end of the communications cable 270 may be connected directly or indirectly to, for example, a rack manager 36 (see FIG. 2). The connection 260 and communications cable 270 provide a communications path that allows information to be communicated to and from the components that are mounted on the printed circuit board 230 of patch panel 200 and the rack controller 36 (or other external processing device). A power connection may also be provided (not shown) that provides power to the patch panel 200.

FIG. 4B is an enlarged schematic front view of a portion of the printed circuit board 230 of the intelligent patch panel 200 of FIG. 4A. The printed circuit board 230 may be generally rectangular in shape, and is mounted on top of the connector ports 210 (which are accessible through apertures in the printed circuit board 230 in the particular embodiment of FIGS. 4A-4B). The trace buttons 240 and the LEDs 250 are mounted on the printed circuit board 230 and are positioned to be above a respective one of the connector ports 220. The patch panel 200 may also include a plug insertion/removal detection circuit for each of the connector ports 220 (not shown in FIGS. 4A-4B). Exemplary embodiments of such plug insertion/removal detection circuits will be described below.

As shown in FIG. 4B, a phantom mode transmitter 260, a phantom mode receiver 270, a microprocessor 280 and a multiplexer 290 may also be mounted on the printed circuit board 230. The printed circuit board 230 may also include first and second contact pads 265 for each connector port 220 that are mounted on a back side of printed circuit board 230 (and hence are shown using dotted lines in FIG. 4B). Each pair of contact pads 265 is configured to mate with a pair of phantom mode contacts that are provided on each connector port 220 included on the patch panel 200 (see FIG. 5A, which shows phantom mode contacts 366, 376 that are implemented on a modular RJ-45 wall jack that may be used to implement each connector port 220). As will be discussed in detail below, the phantom mode contacts may be used to couple phantom mode control signals to and from the connector ports 220 and the phantom mode transmitter 260 and/or the phantom mode receiver 270.

As shown in FIG. 4B, the microprocessor 280 includes an output that is connected to the phantom mode transmitter 260. This output may be used to send control signals to the phantom mode transmitter 260 that control operation of the phantom mode transmitter 260. The microprocessor 280 further includes an input (which may be a serial or parallel input) that may receive data that is extracted from phantom mode control signals that are received by the phantom mode receiver 270. The multiplexer 290 is coupled to both the phantom mode transmitter 260 and the phantom mode receiver 270, and includes input/output lines (not shown in FIGS. 4A-4B) that are coupled to each pair of contact pads 265. The multiplexer 290 may be used to pass a phantom mode control signal that is transmitted by the phantom mode transmitter 260 to the pair of contact pads 265 that are associated with a specific connector port 220. The multiplexer 290 may also be used to pass a phantom mode control signal that is received at a specific one of the connector ports 220 by connecting the pair of contact pads 265 associated with that specific connector port 220 to the phantom mode receiver 270. The microprocessor 280 may be used to control the settings on the multiplexer 290. By providing the multiplexer 290, which is used to selectively connect the pair of contact pads 265 associated with the various connector ports 220 to the phantom mode transmitter 260 and/or the phantom mode receiver 270, it may only be necessary to provide a single phantom mode transmitter 260 and phantom mode receiver 270 per patch panel 200. This can substantially reduce the cost of the patch panel 200. The multiplexer 290 may comprise, for example, an analog multiplexer (or a cascaded set of analog multiplexers).

While in the particular embodiment depicted in FIG. 4B the multiplexer 290 is used as a switching device that allows the phantom mode transmitter 260 and/or the phantom mode receiver 270 to be selectively connected to the connector ports 220, it will be appreciated that any appropriate switching device may be used. By way of example, the switching circuits disclosed in co-pending U.S. patent application Ser. No. 11/871,448, filed Oct. 12, 2007, that are used to selectively connect an RFID transceiver to the connector ports on a patch panel could be used in place of the multiplexer 290 in alternative embodiments of the present invention. The disclosure of U.S. patent application Ser. No. 11/871,448 is incorporated by reference here in its entirety.

While not shown in FIG. 4B to simplify the drawing, it will be appreciated that the microprocessor 280 may include control lines that are used to send and receive control and/or power signals to the trace buttons 240 and/or the LEDs 250. Individual control lines may be provided for each trace button/LED, and or common control lines may be provided that are selectively routed through a multiplexer or switching circuit.

While in the embodiment of FIGS. 4A-4B the phantom mode transmitter 260, the phantom mode receiver 270, the microprocessor 280 and the multiplexer 290 are mounted on the patch panel 200, it will be appreciated that some or all of these components may be mounted in other places. As one example, some or all of these components could be mounted on the rack manager and the signals could be routed to and from the patch panels on the rack via a bus or other means. Such an implementation could further reduce the number of active components required (although perhaps with a corresponding increase in the size of the multiplexer/switching circuits).

Figure 5A:
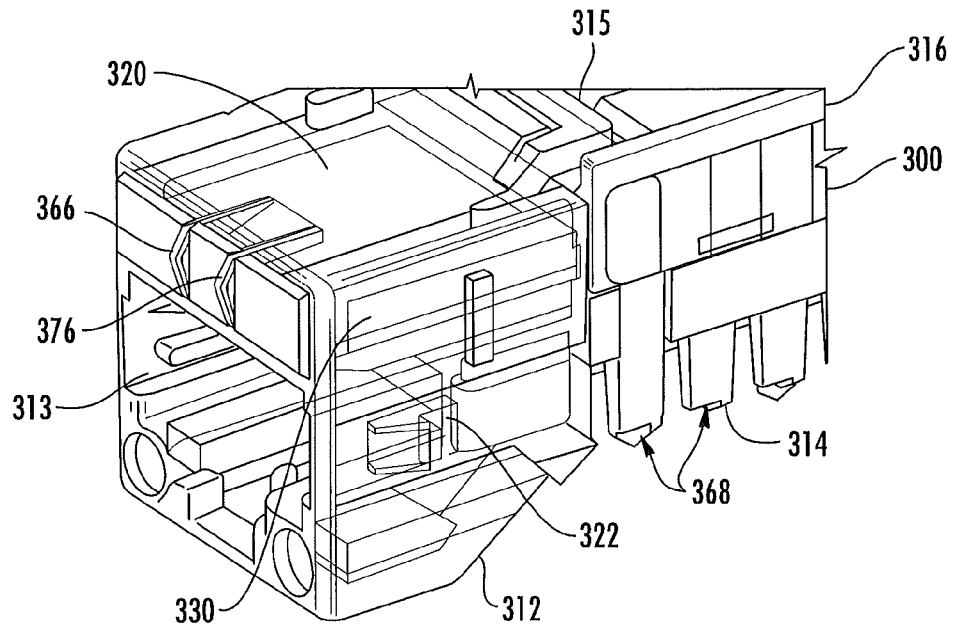
FIG. 5A is a partial perspective view of a jack according to certain embodiments of the present invention.
Figure 5B:
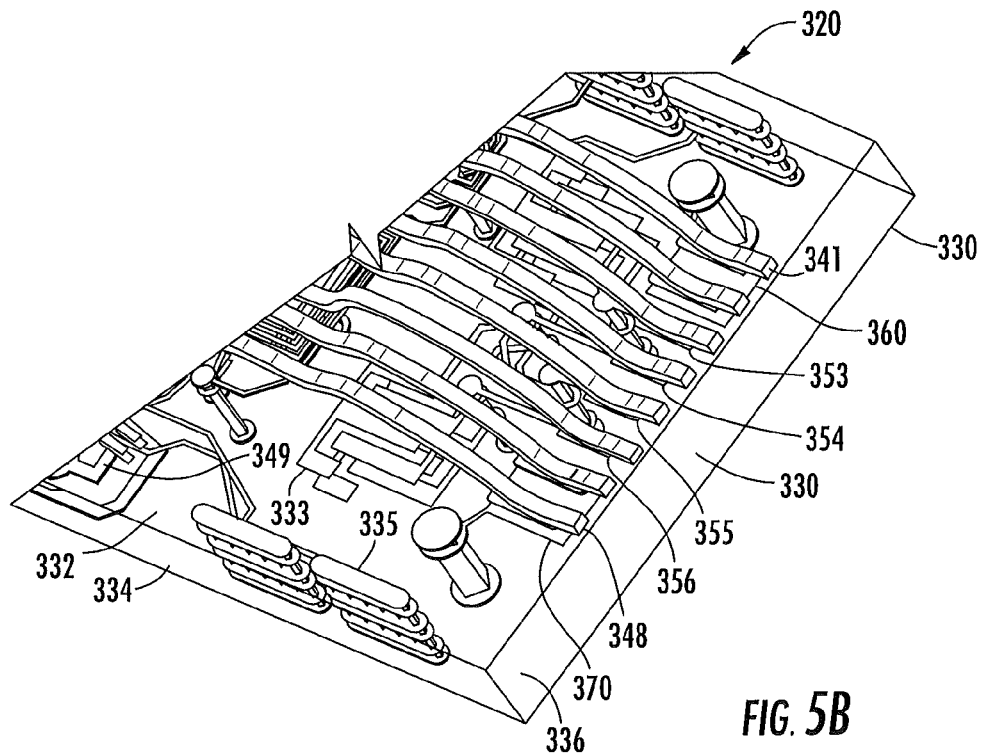
FIG. 5B is a partial perspective view of a communications assembly that is included in the jack of FIG. 5A.
Figure 5C:
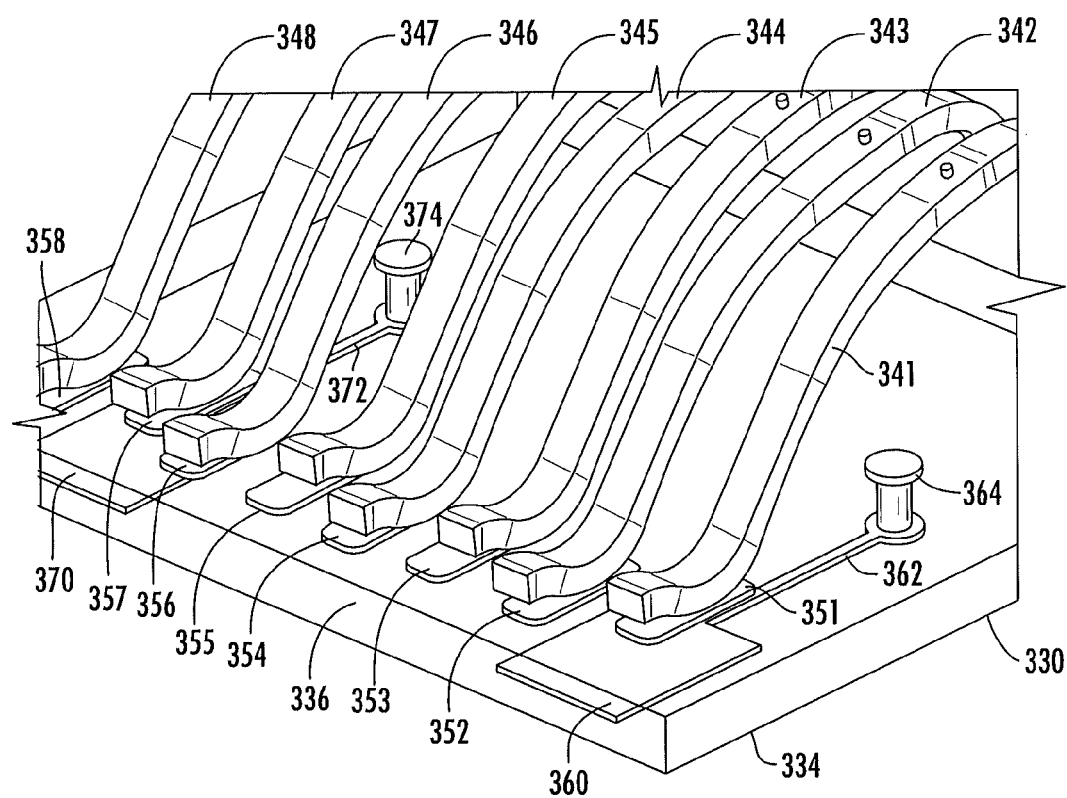
FIG. 5C is a simplified, enlarged perspective view of a portion of the communications assembly of FIG. 5B.

FIGS. 5A-5C illustrate a modular jack 300 according to certain embodiments of the present invention. In particular, FIG. 5A is a perspective view of the jack 300, FIG. 5B is a partial perspective view of a communications assembly 320 that is included in the jack 300 of FIG. 5A, and FIG. 5C is a simplified and enlarged perspective view of a portion of the communications assembly 320 of FIG. 5B. The modular jack 300 may be used, for example, as the connector ports 34, 34' that are included on patch panels 32, 32' of FIG. 2, as the connector ports 111-114, 121-124 on the patch panels 110, 120 of the communications patching system 100 of FIG. 3 (and also as the wall jacks 140), and/or as the connector ports 220 on the patch panel 200 of FIG. 4.

Turning first to FIG. 5A, it can be seen that the jack 300 includes an electrically insulative or dielectric jack housing 312, terminal housing 314 and cover 316. The parts 312, 314 and 316 may be collectively referred to herein as the "connector housing." The jack housing 312 includes a plug aperture opening 313 that is sized and configured to receive a modular plug (not shown in the figures) that is inserted into the jack housing 312. The jack housing 312 receives a front part of the communications assembly 320, which is inserted into an opening in the rear of the jack housing 312. The terminal housing 314 is fitted over and protects a first surface of the communications assembly 320. Cover 316 fits beneath the communications assembly 320 and attaches to the terminal housing 314 to protect a second surface of the communications assembly 320 that is opposite the first surface.

As is further shown in FIG. 5A, the jack 300 also includes a pair of phantom mode contacts 366, 376. Each of the phantom mode contacts 366, 376 may comprise a conductive wire. A termination end of each of these conductive wires may be mounted into the bottom surface of a printed circuit board 330 (see FIGS. 5B and 5C) of the communications assembly 320. The termination ends of the phantom mode contacts 366, 376 may each have, for example, an eye-of the needle configuration so that they may be press fit into respective metal-plated apertures in the printed circuit board 330. Those skilled in the art will appreciate, however, that as an alternative to the method illustrated in FIGS. 5A-5C, the termination ends of the phantom mode contacts 366 may form spring contacts that are configured to contact respective pads, located on the bottom surface 334 of the printed circuit board 330, which are connected by conductive traces to the posts 364 and 374. In some embodiments, the termination ends of the phantom mode contacts 366, 376 may form the respective posts 364, 374 that are discussed below with respect to FIGS. 5B and 5C. The conductive wires that form the respective phantom mode contacts 366, 376 make a 90-degree bend as they exit the printed circuit board 330 so that they run along the bottom of the printed circuit board 330 towards the front of the jack 300. At the front of the jack 300, each of the phantom mode contacts 366, 376 is bent downwardly to form a shallow "V" shape. The distal end of each of the phantom mode contacts 366, 376 rests against a front part of the jack housing 312. As such, the V-shaped portion of each phantom mode contacts 366, 376 forms a spring contact that is configured to contact a respective one of the contact pads 265 that are mounted on the reverse side of the patch panel printed circuit board 230. Thus, the phantom mode contacts 366, 376 provide electrical paths that may be used to transmit the two components of a phantom mode control signal between the patch panel printed circuit board 230 and the printed circuit board 330 of the jack 300 when the jack 300 is used to form the connector ports 220 of patch panel 200.

Turning to FIGS. 5B-5C, it can be seen that the communications assembly 320 includes a printed circuit board 330. The printed circuit board 330 may comprise any conventional or non-conventional printed circuit or wiring board. In the depicted embodiment, the printed circuit board 330 is a conventional printed circuit board that includes a multi-layered dielectric substrate that has a top surface 332, a bottom surface 334, a forward edge 336 and a rear edge (note that the printed circuit board 330 is inverted in FIGS. 5B and 5C as compared to its orientation in FIG. 5A; for ease of description the discussion of FIGS. 5A-5C below will use words such as "top," "bottom," etc. to match the orientation shown in FIGS. 5B and 5C). A plurality of spring contacts 341-348 are mounted in cantilevered fashion to extend from the top surface 332 of printed circuit board 330. Each spring contact 341-348 may be mounted in a metal-plated hole in the top surface 332 of the printed circuit board 330. Herein, the term "contact", when used as a noun, refers to an electrically conductive element that is designed to establish physical and electrical contact with an external electrically conductive element. The contacts 341-348 are referred to as "spring" contacts because the contacts 341-348 are configured to resiliently deflect from a resting position when contacted by a mating plug, then spring back to the resting position when the plug is removed. The free ends of the spring contacts 341-348 terminate near the forward edge 336 of printed circuit board 330, and may be offset vertically from the top surface 332 of printed circuit board when the spring contacts 341-348 are in their normal resting position (i.e., in the position that they assume when not engaged by a mating plug). The spring contacts 341-348 may be formed, for example, of a copper alloy such as spring-tempered phosphor bronze, beryllium copper, or the like. A typical cross-section of each spring contact 341-348 may be, for example, 0.015 inch wide by 0.010 inch thick, although other sized and/or shaped (e.g., round) contacts may be used.

The communications assembly 320 also includes a plurality of wire connection terminals 368 (see FIG. 5A) that are likewise mounted into respective ones of additional plurality of metal-plated holes in the top surface 332 of printed circuit board 330. The wire connection terminals 368 may be implemented, for example, as conventional insulation displacement contact terminals (IDCs). The IDCs 368 may include a base having a "needle-eye" construction that allows the base to be press-fit into its respective metal-plated hole in the printed circuit board 330 or, alternatively, may be soldered in place. While the IDCs 368 are not depicted in FIGS. 5B-5C (and are barely visible in FIG. 5A as they are recessed within the terminal housing 314) in order to simplify the drawings, the IDCs may, for example, be identical to the IDCs 242, 244, 246, 248 illustrated in U.S. Pat. No. 7,204,722, the contents of which are incorporated herein by reference. The IDCs 368 may be positioned in two rows located along the side edges of the printed circuit board 330, where each row extends from approximately the middle of the printed circuit board 330 to the rear edge of the board 330 (i.e., in the same configuration as the IDCs depicted in the above-mentioned U.S. Pat. No. 7,204,722). As shown in FIG. 5A, the terminal housing 314 mounts over the IDCs 368 to protect the IDCs 368 and the top surface 332 of the printed circuit board 330. The terminal housing 314 also includes slots that allow the conductors of a communications cable to be inserted into the respective IDCs 368.

The cover 316 may protect the bottom surface 334 of at least part of the printed circuit board 330. The cover 316 may be permanently joined to the terminal housing 314 (e.g., by ultrasonic welding) such that the communications assembly 320 is "sandwiched" or captured between the terminal housing 314 and the cover 316.

As also shown in FIG. 5A, the jack housing 312 has a latch 315 protruding below its rear opening. The bottom forward edge of the cover 316 includes a raised protrusion that mates with the latch 315. The terminal housing 314 likewise has a pair of side catches 322 protruding from the forward part of both sides of the housing 314 (only one side catch 322 is visible in FIG. 5A). The side catches 322 may comprise, for example, snap clips that have hooked projecting ends that are configured to snap into and lock within respective recesses provided in the side walls of the jack housing 312. The terminal housing 314 may be joined to the cover 316 with the communications assembly 320 captured therebetween, and then the forward edge 336 of the communications assembly 320 may be inserted into the rear opening in the jack housing 312 until the side catches 322 of terminal housing 314 snap into place in their respective recesses in the jack housing 312 and until the latch 315 snaps over and onto the raised protrusion on the bottom of cover 316 to securely join the jack housing 312 to the remainder of the jack 300.

The jack housing 312, the terminal housing 314 and the cover 316 may be formed, for example, of a plastic material that meets applicable standards with respect to electrical insulation and flammability, such as Polyvinyl Chloride (PVC), Acrylonitrile Butadiene Styrene (ABS), or polycarbonate. It will be appreciated that many other electrically insulative or dielectric materials may be used.

While the jack housing 312, the terminal housing 314 and the cover 316 provide one example of a housing structure that may enclose the communications assembly 320, it will be appreciated that a wide variety of different housing structures could be used, and/or that the communications assembly 320 may be constructed as part of the housing itself as opposed to as a separate piece or pieces. Thus, embodiments of the present invention need not be limited to any particular housing structure, and the above-provided detailed description of one particular housing structure is only provided so that the present disclosure will be thorough and complete.

The printed circuit board 330 further includes a plurality of additional elements. These elements may include a plurality of conductive traces or paths 349 (shown partially in FIG. 5B) that extend between and electrically connect the metal-plated holes that receive the spring contacts 341-348 to a respective one of the metal-plated holes that receive the IDCs 368. Each conductive trace/path 349 provides a communications path that allows an information signal that is input on a respective one of the spring contacts 341-348 to be carried through the jack 300 and output onto a respective one of the IDCs 368, and vice versa. The conductive trace/paths 349 may simply comprise a copper trace that resides on a single layer of the printed circuit board 330, or alternatively may comprise, for example, a series of conductive vias and conductive trace segments that reside on multiple layers of the printed circuit board 330 that together electrically connect one of the metal-plated holes that receive the spring contacts 341-348 to a respective one of the metal-plated holes that receive the IDCs 368. A plurality of crosstalk compensation circuits (e.g., element 333) and alien crosstalk compensation circuits (e.g., element 335) may also be provided on or within the printed circuit board 330. For example, crosstalk compensation circuits such as those depicted in U.S. Pat. No. 7,190,594 may be provided, and alien crosstalk compensation circuits such as those depicted in U.S. Pat. No. 7,179,115 may be provided. The entire contents of the aforementioned U.S. Pat. Nos. 7,190,594 and 7,179,115 are incorporated in their entireties herein by reference.

Figure 1:
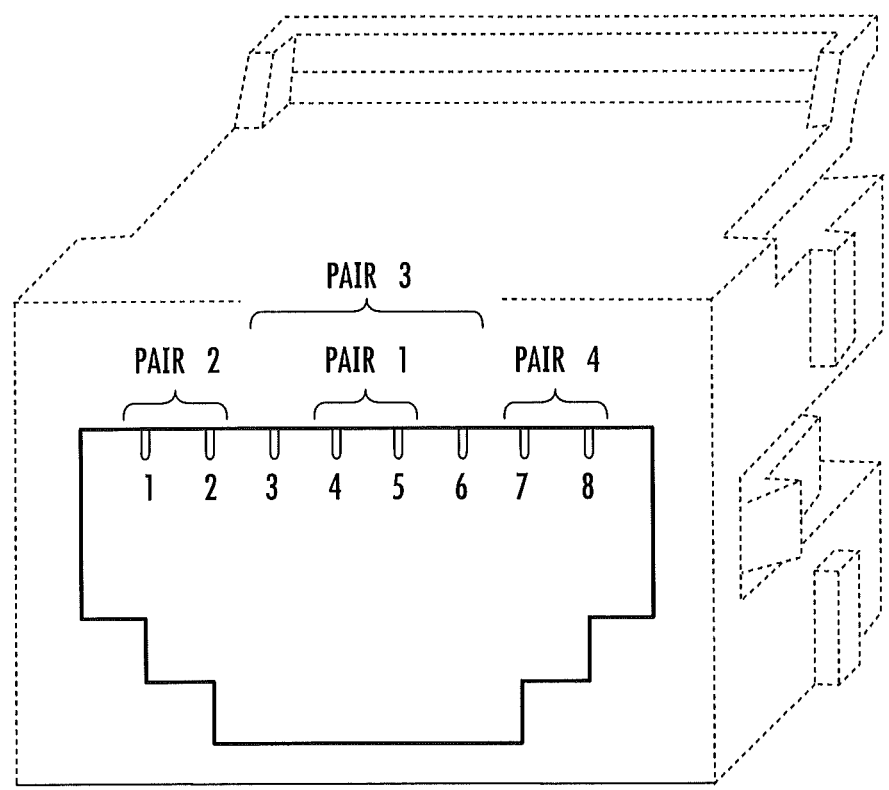
FIG. 1 is a schematic diagram illustrating the contact arrangement for a conventional 8-position communications jack (TIA 568B) as viewed from the front opening (plug aperture) of the jack.

Turning again to FIGS. 5B-5C, it can be seen that a plurality of contact pads 351-358 are provided on the top surface 332 of the printed circuit board 330 (and/or within the printed circuit board 330). Each of the contact pads 351-358 is arranged so as to mate with the distal end of a respective one of the spring contacts 341-348 when a modular plug is inserted into plug aperture 313 of the jack 300. When the modular plug is inserted, the distal ends of each of the spring contacts 341-348 are deflected downwardly so as to come into mechanical and electrical contact with a respective one of the contact pads 351-358. In the particular embodiment depicted in FIGS. 5A-5C, the middle four contact pads 353-356 are used to electrically connect the middle four contact wires 343-346 to crosstalk compensation capacitors 333 (see FIG. 5B) that are embedded within the printed circuit board 330 near the front edge 336 thereof. The remaining four contact pads 351-352 and 357-358 are used to capacitively couple a phantom mode control signal either onto, or off of, pairs 2 and 4 of the connector 300 (as discussed with respect to FIG. 1 above, pairs 2 and 4 are the outside pairs of contacts in the TIA/EIA 568 type B contact configuration), as will be discussed in further detail below. The contact pads 351-358 may be implemented as any conductive pad or other structure that makes reliable electrical contact with its respective one of the spring contacts 341-348 under appropriate conditions (e.g., when a plug is inserted into the jack). The contact pads 351-358 may comprise generally two-dimensional plated metal pads or may comprise three-dimensional structures such as, for example, conductive nails, blocks, columns or the like that extend above the top surface 332 of the printed circuit board 330.

The distal ends of the spring contacts 341-348 are normally not in contact with their respective contact pads 351-358. However, when a modular plug (not shown in the figures) is inserted into the plug aperture 313, blades or other contacts of the plug physically contact respective ones of the spring contacts 341-348. The spring contacts 341-348 are resiliently deflected by the plug blades downwardly toward the top surface 332 of the printed circuit board 330, thereby bringing each spring contact 341-348 into mechanical and electrical contact with a respective one of the contact pads 351-358.

When the spring contacts 341-348 mate with respective ones of the contact pads 351-358, an electrical connection is established such that an electrical signal may pass from each spring contact 341-348 to its respective contact pad 351-358 (or vice versa). The contact pads 351-358 may be formed of a variety of conductive materials such as, for example, copper or copper alloys (with or without plating). In certain embodiments of the present invention, the contact pads 351-358 may comprise a gold or nickel plated copper alloy. In the particular embodiment depicted in FIGS. 5A-5C, the contact pads 351-358 comprise generally rectangular pads that are deposited on the top surface 332 of the printed circuit board 330. While an insulative layer is typically deposited on top of the conductive traces 349 that are provided on the top surface 332 or bottom surface 334 of a printed circuit board 330 in order to, among other things, protect such traces 349 and/or to prevent inadvertent short circuits, it will be appreciated that such an insulative layer, if provided, is not present at the location of each contact pad 351-358. This allows each contact pad 351-358 to make an electrical connection with a respective one of the spring contacts 341-348 when a modular plug is inserted in the jack 300.

As shown in FIGS. 5B and 5C, first and second plates 360, 370 are embedded in interior layers of the printed circuit board 330. The first plate 360 is positioned under the contact pads 351-352, and the second plate 370 is positioned under the contact pads 357-358. Plate 360 is electrically connected by a printed circuit board trace 362 to a conductive post 364. This conductive post 364 is electrically connected to a phantom mode contact 366 (see FIG. 5A) which, as discussed above, mates with one of the contact pads 265 that are associated with the jack 300 on the patch panel printed circuit board 230. Likewise, plate 370 is electrically connected by a printed circuit board trace 372 to a conductive post 374. This conductive post 374 is electrically connected to a phantom mode contact 376 (see FIG. 5A) which, as discussed above, mates with the other one of the contact pads 265 that are associated with the jack 300 on the patch panel printed circuit board 230. In some embodiments, the conductive posts 364, 374 may be replaced with, for example, respective metal-plated vias, and the phantom mode contacts 366, 376 may be mounted in the respective metal-plated vias to establish the electrical connections between the phantom mode contacts 366, 376 and the respective printed circuit board traces 362, 372.

The plate 360 and the contact pads 351 and 352 reside on different layers of the printed circuit board 330, and are thus separated by a dielectric substrate form each other. These components together form a first capacitor that may be used to capacitively couple a portion of a phantom mode control signal to and/or from one of the four differential pairs of conductive paths that run through jack 300. In particular, the plate 360 forms a first capacitor electrode and the contact pads 351 and 352 form respective second and third electrodes of the capacitor that may be used to connect to two of the conductive paths through the jack 300. The capacitor formed by plate 360 and contact pads 351-352 comprises a "three-terminal" capacitor as it capacitively couples energy between three distinct electrical paths. The plate 370 and the contact pads 357-358 form a second three-terminal capacitor that may be used to capacitively couple another portion of a phantom mode control signal to and/or from another one of the four differential pairs of conductive paths that run through jack 300. The first capacitor formed by elements 360, 351, 352, the second capacitor formed by elements 370, 357, 358 and the corresponding electrical connections (e.g., traces 362, 372 and posts 364, 374 and phantom mode contacts 366, 376) together form a control signal input circuit that may be used to inject a control signal into the channel that passes through jack 300. Note that the above-described three-terminal capacitors may also be viewed as two separate standard capacitors (e.g., the first three-terminal capacitor described above may alternatively be viewed as a first capacitor that has electrodes 360 and 351 and a second capacitor that has electrodes 360 and 352).

A phantom mode control signal that is carried into the jack 300 on pairs 2 and 4 of a patch cord that is plugged into jack 300 may be coupled from the channel that passes through the jack 300 as follows. For the purposes of this example, it will be assumed that the positive component of the phantom mode control signal is carried on pair 2 and the negative component of the phantom mode control signal is carried on pair 4. Note that since the phantom mode control signal may be an alternating current signal, in some cases the signal on each pair may oscillate between being a positive signal and a negative signal. Consequently, it will be appreciated that references herein to a "positive component" or a "negative component" of a phantom mode signal are used to refer to the components of the phantom mode signal at a given point in time in order to conveniently be able to distinguish between the two components of the differential phantom mode signal.

The positive component of the phantom mode control signal passes through the plug blades of pair 2 onto spring contacts 341-342, and the negative component of the phantom mode control signal passes through the plug blades of pair 4 onto spring contacts 347-348. The plug blades press the spring contacts 341-348 downwardly so that the distal end of each spring contact 341-348 makes firm mechanical and electrical contact with its respective mating contact pad 351-358. Some of the signal energy of the positive component of the phantom mode control signal that is present on spring contacts 341-342 and mating contact pads 351-352 will capacitively couple from the contact pads 351-352 through the dielectric substrate of printed circuit board 330 to the plate 360. Likewise, some of the signal energy of the negative component of the phantom mode signal that is present on spring contacts 347-348 and mating contact pads 357-358 will capacitively couple from the contact pads 357-358 through the dielectric substrate of printed circuit board 330 to the plate 370. In this manner, a reduced magnitude version of the positive component of the phantom mode control signal (e.g., a magnitude that is reduced by 70 dB) is transferred to plate 360 and a reduced magnitude version of the negative component of the phantom mode control signal (e.g., a magnitude that is reduced by 70 dB) is transferred to plate 370.

The positive and negative components of the reduced magnitude version of the phantom mode control signal are then coupled to the patch panel printed circuit board 230 via their respective printed circuit board traces 362, 372, posts 364, 374, phantom mode contacts 366, 376 and contact pads 265. From the contact pads 265, the phantom mode control signal may be provided to the phantom mode receiver 270 via circuit traces on the patch panel printed circuit board 230 (not shown on FIG. 4B) and the multiplexer 290 (or other switching circuit). Thus, the contact pads 351-352, 357-358, the plates 360, 370, the printed circuit board traces 362, 372, the posts 364, 374, the phantom mode contacts 366, 376, the contact pads 265, and the multiplexer 290 (and associated traces on patch panel printed circuit board 230) provide a communications path that allows a phantom mode control signal that is present on the channel associated with jack 300 to be received and demodulated (if necessary) by the phantom mode receiver 270 on the patch panel 200. The same communications path from the multiplexer 290 to the spring contacts 341-342 and 347-348 may be used (in the reverse direction) to transfer phantom mode control signals that are generated by the phantom mode transmitter 260 onto the spring contacts 341-342 and 347-348 of pairs 2 and 4 of the jack 300.

While FIGS. 5A-5C illustrate one exemplary jack that includes circuitry for capacitively coupling a phantom mode control signal to and/or from the contact wires 341-342 and 347-348 of pairs 2 and 4 of jack 300, it will be appreciated that (1) any suitable connector port design may be used, (2) that numerous different control signal input circuits may be used to inductively and/or capacitively couple the phantom mode control signals to and from the channel at the connector port and/or (3) that numerous different capacitor designs may be employed which may result in different amounts of loss without departing from the scope of the present invention.

By way of example, in other embodiments, different control signal input circuits may be used that capacitively couple the phantom mode control signal directly to or from conductive traces on printed circuit board 330, metal-plated apertures in printed circuit boards 330, and/or onto the IDCs 368 and/or the spring contacts 341-348 that are mounted on printed circuit board 330 as opposed to (or in addition to) using the contact pads 351-352 and 357-358. Thus, it will be appreciated that the contact pads 351-352 and 357-358 are not required, but merely provide one convenient way for capacitively coupling a phantom mode control signal to/from the phantom mode transmitter/receiver and the channel. It will likewise be appreciated that the plates 360, 370, the printed circuit board traces 362, 372, the posts 364, 374, the phantom mode contacts 366, 376 and/or the contact pads 265 may be removed or replaced with other structures. Likewise, the coupling structures could couple to signal current carrying portions of the conductive paths through the jack 300 (as opposed to dead-end branches that are not on the direct path between spring contacts and their corresponding IDCs) such that the phantom mode control signal may be both capacitively and inductively coupled to or from the jack. Thus, it will be appreciated that the present invention is not limited to any particular circuit structure that is used to, for example, capacitively couple the phantom mode signal to and/or from the jack 300.

Figure 6A:
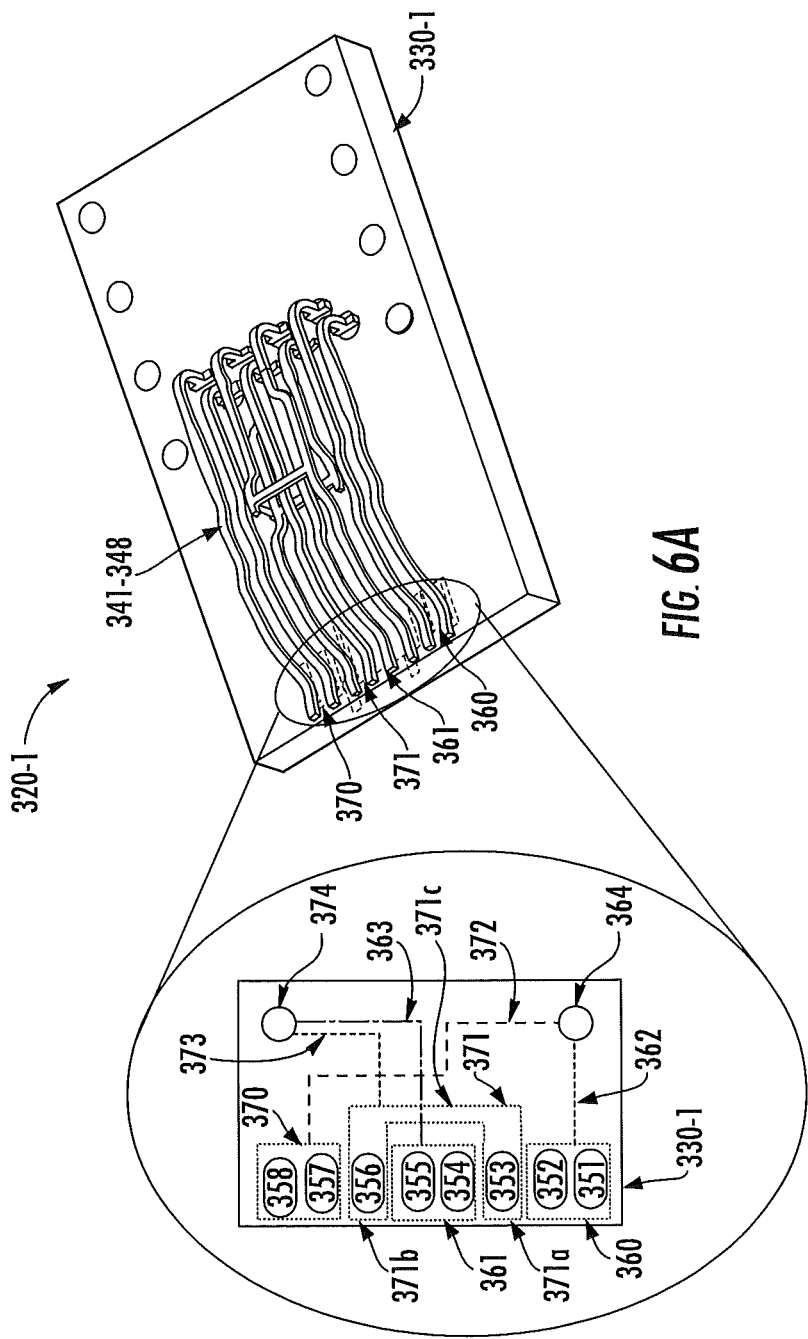
FIGS. 6A-6B are views of alternative communications assemblies according to embodiments of the present invention that may be used in the jack of FIG. 5A.
Figure 6B:
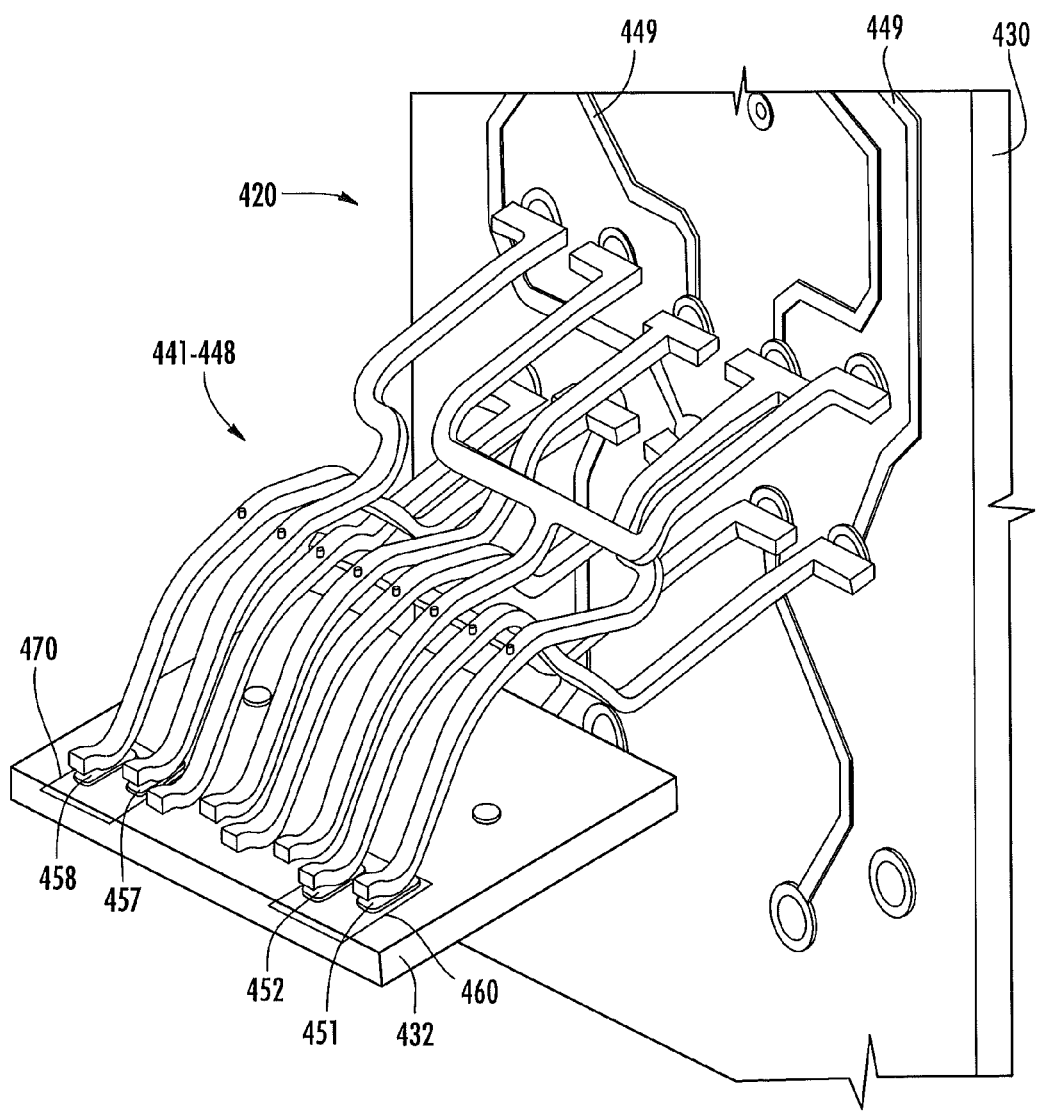

FIGS. 6A-6B illustrate communications assemblies (or portions thereof) of communications connectors according to further embodiments of the present invention that illustrate additional exemplary changes that may be made to the jack 300.

Turning first to FIG. 6A, a partial view of a printed circuit board 330-1 of a communications assembly 320-1 is illustrated. The communications assembly 320-1 may be used in place of the communications assembly 320 of FIGS. 5B-5C in the jack of FIG. 5A.

As shown in FIG. 6A, the communications assembly 320-1 is very similar to the communications assembly 320 that is discussed above with respect to FIG. 5B. In particular, communications assembly 320-1 includes a plurality of spring contacts 341-348 which may be identical to the spring contacts 341-348 that are discussed above with respect to FIG. 5B.

The communications assembly 320-1 also includes a printed circuit board 330-1 that is similar to the printed circuit board 330 that is discussed above with reference to FIG. 5B. The printed circuit board 330-1 may include traces/paths, crosstalk compensation circuits and alien crosstalk compensation circuits, which are not shown to simplify the figure. The printed circuit board 330-1 may further include contact pads 351-358 and plates 360, 370 that are discussed above with reference to FIG. 5B. As these elements may be identical to their correspondingly numbered elements in FIG. 5B, further description of these elements will be omitted.

The printed circuit board 330-1 differs from the printed circuit board 330, however, in that printed circuit board 330-1 further includes a third plate 361 and a fourth plate 371 that are embedded in an interior layer of the printed circuit board 330-1. The third plate 361 is positioned under the contact pads 354-355 that electrically connect to the conductors of pair 1, and the fourth plate 371 is positioned under the contact pads 353 and 356 that electrically connect to the conductors of pair 3. As contact pads 353 and 356 are not adjacent to each other, plate 371 comprises two smaller plates 371a and 371b that are positioned underneath contact pads 353 and 356, respectively, that are connected by a conductive connector 371c. The callout in FIG. 6A is a plan view of the front portion of printed circuit board 330-1 that better illustrates the shapes and locations of plates 360, 361, 370, 371 in relationship to the contact pads 351-358.

As is further shown in FIG. 6A, conductive posts 364 and 374 are provided on printed circuit board 330-1, and may be similar or identical to the correspondingly numbered posts included in the printed circuit board 330 of FIG. 5B. Plate 360 is electrically connected by a printed circuit board trace 362 to the conductive post 364, and plate 370 is electrically connected by a printed circuit board trace 372 to the conductive post 364 (which differs from printed circuit board 330, where trace 372 connects plate 370 a second conductive post 374). A second conductive post 374 is provided, and a third printed circuit board trace 363 is provided that electrically connects plate 361 to post 374 and a fourth printed circuit board trace 373 is provided that electrically connects plate 371 to post 374. The conductive posts 364, 374 may be electrically connected to respective phantom mode contacts 366, 376 (see FIG. 5A) that mate with the respective contact pads 265 on patch panel printed circuit board 230 that are associated with the jack 300.

The communications assembly 320-1 of FIG. 6A may operate as follows. A phantom mode control signal may be coupled into the communications assembly via the phantom mode contacts 366, 376. In particular, the positive component of the phantom mode control signal may be carried, for example, by phantom mode contact 366 and the negative component of the phantom mode control signal may be carried by phantom mode contact 376. The positive component of the phantom mode control signal travels through conductive post 364 and conductive traces 362, 372 to plates 360 and 370, where it capacitively couples to contact pads 351-352 and 357-358. So long as a plug is present in the plug aperture of jack 300 (thereby resiliently deflecting the spring contacts 341-348 into physical contact with their respective contact pads 351-358), then the capacitively coupled component of the positive component of the phantom mode control signal will be transferred onto the spring contacts 341-342 and 347-348, where it can travel along the conductors of pairs 2 and 4 of the patch cord inserted into jack 300 and along the conductors of pairs 2 and 4 of any cable that is terminated into the back end of jack 300. Similarly, the negative component of the phantom mode control signal travels from the phantom mode contact 376, through the contact post 374 and conductive traces 363, 373 to plates 361 and 371, where it capacitively couples to contact pads 353-356. So long as a plug is present in the plug aperture of jack 300 (thereby resiliently deflecting the spring contacts 341-348 into physical contact with their respective contact pads 351-358), then the capacitively coupled component of the negative component of the phantom mode control signal will be transferred onto the spring contacts 343-346 where it can travel along the conductors of pairs 1 and 3 of the patch cord inserted into jack 300 and along the conductors of pairs 1 and 3 of any cable that is terminated into the back end of jack 300.

Thus, with the communications assembly 320-1 of FIG. 6A, a reduced magnitude version of the positive component of the phantom mode control signal is transferred onto each of the four conductors included in pairs 2 and 4 of the channel, and a reduced magnitude version of the negative component of the phantom mode control signal is transferred onto each of the four conductors included in pairs 1 and 3 of the channel. The same communications path may be used (in the reverse direction) to transfer a phantom mode control signal that is carried into jack 300 on a patch cord or cable to the phantom mode contacts 366, 376, which can carry the signal to a phantom mode receiver such as, for example, the phantom mode receiver 270 on the printed circuit board 230 of patch panel 200.

The printed circuit board 330-1 may be advantageous in some implementations because it can be used to approximately double the magnitude of the phantom mode control signal that is coupled to and from a particular channel. In particular, in many cases the small printed circuit boards that are commonly used in communications connectors such as, for example, Category 6 and Category 6A RJ-45 jacks, can become quite crowded or "real estate limited" due to the space required for the input terminals, the output terminals, crosstalk compensation circuits and the like. Additionally, care must be taken to appropriately locate the various terminals, traces, circuits and the like with respect to each other to avoid, for example, undesired capacitive and/or inductive couplings between different elements on the printed circuit board that may negatively impact the crosstalk performance, return loss performance or other performance characteristics of the connector. The above considerations may make it difficult to increase the size of the capacitors that are used to capacitively couple the phantom mode control signal to and from the connector.

Unfortunately, since capacitive coupling is used to inject and extract the phantom mode control signal from the channel, only a small portion of the phantom mode control signal is passed through the capacitor. For example, it is estimated that the capacitor formed by the plate 360 and the contact pads 351, 352 will have a total injection capacitance of approximately 2×0.37 pF=0.74 pF. Such a capacitor value may be too low to ensure that the received phantom mode control signal reception will be distinguishable over other noise that may be added in the channel. Consequently, it may be desirable in certain embodiments to increase the capacitance of the capacitors that are used to inject/extract the phantom mode control signals from the connectors according to embodiments of the present invention or to otherwise increase the coupling (e.g., by increasing an inductive coupling element).

The capacitance of the printed circuit board capacitors that are used in the illustrative embodiments provided above may be increased in a variety of ways. By way of example, the size of the plates 360, 370 and the contact pads 351-352, 357-358 could be increased and/or the capacitors could be implemented across multiple layers of the printed circuit board to provide increased capacitance. However, the aforementioned crowding problems on printed circuit boards may limit this option, as the larger capacitors may negatively impact various performance characteristics due to, for example, increased coupling between the larger capacitor electrodes and other elements on the connector printed circuit board. While there are potential ways of mitigating such performance degradation, including increasing the size of the printed circuit board or the number of layers included in the printed circuit board, these solutions have their own potential drawbacks in terms of larger connector footprints and/or increased connector cost. Likewise, higher dielectric constant printed circuits boards could be used, or special dielectric materials could be deposited on the printed circuit board between the electrodes of the capacitors used in the control signal input circuit. These options, however, also tend to increase the cost of the connector.

The printed circuit board 330-1 of FIG. 6A takes advantage of the fact that the phantom mode control signal may, if desired, be transmitted over all four differential pairs of conductors of jack 300 instead of over only two of the differential pairs. In particular, with the printed circuit board 330-1, one component of the phantom mode control signal (e.g., the positive component) is coupled onto all four conductors of pairs 2 and 4 while the other component of the phantom mode control signal (e.g., the negative component) is coupled onto all four conductors of pairs 1 and 3. While two additional capacitors (or other coupling elements) are required to allow coupling one component of the phantom mode control signal onto (or off of) pairs 1 and 3, the contact pads 353-356 that are used to implement part of these capacitors may already be provided on the printed circuit board 330-1 in order to couple the spring contacts 343-346 to crosstalk compensation capacitors (capacitors 333 in FIG. 5B) that are located near the front of printed circuit boards 330 and 330-1. Thus, the only extra components required to add these capacitors are the plates 361, 371—which are located in otherwise unused real estate on the printed circuit board, and the small traces 363, 373. The number of added components using this method may be further reduced, and the printed circuit board conductive trace artwork further simplified, by replacing plates 361 and 371 and the conductive traces 363 and 372 connecting them to the contact post 374 with a single plate that is positioned under, and spanning, the four contact pads 353-356 and a single trace (e.g., trace 373) connecting this plate to the contact post 374. Thus, pursuant to embodiments of the present invention, the amount of signal energy coupled to and from the connector 300 on the phantom mode control channel may be approximately doubled by implementing the phantom mode control signal on all four differential pairs without requiring significant additional real estate on the printed circuit board.

As the phantom mode control signal is injected as a differential signal having a component (e.g., the positive component) that is injected as a common mode signal onto pairs 2 and 4, the differential information signals that are carried by pairs 2 and 4 will not be disturbed, as this common mode component is subtracted off of each differential pair during the subtraction processes that are used to recover the respective differential information signals. The component of the phantom mode control signal (e.g., the negative component) that is injected as a common mode signal onto pairs 1 and 3 will likewise not disturb the underlying differential information signals that are carried by pairs 1 and 3 as this common mode component is subtracted off of each differential pair during the subtraction processes that are used to recover the respective differential information signals.

As noted above, the capacitor formed by the contact pads 351, 352 and the plate 360 and the capacitor formed by the contact pads 357, 358 and the plate 370 that are provided on printed circuit board 330 of FIG. 5B are referred to herein as 3-terminal capacitors as these capacitors have a total of three electrodes (e.g., contact pads 351 and 352 and plate 360). In contrast, the capacitor formed by the contact pads 351, 352, 357, 358 and the plates 360/370 and the capacitor formed by the contact pads 353, 354, 355, 356 and the plates 361/371 that are provided on printed circuit board 330-1 of FIG. 6A are referred to as "5-terminal capacitors" as these capacitors have a total of five electrodes (e.g., contact pads 351, 352, 357 and 358 and the electrically interconnected plates 360/370). Alternatively, each 5-terminal capacitor may be viewed as four separate capacitors.

Tables I-III below compare the simulated performance of a prototype jack 300 that includes the communications assembly 320 versus another prototype jack that includes the communications assembly 320-1. In particular, Table I illustrates the capacitance values of the 3-terminal and 5-terminal capacitors (labeled "Capacitor 1" and "Capacitor 2" in Table I) that are used to inject/extract the phantom mode control signal from the connector. As shown in Table I, use of the 5-terminal capacitors that are provided in communications assembly 320-1 approximately doubles the capacitance. Table II illustrates the near end crosstalk ("NEXT") margins relative to the ISO connector specification for each combination of differential pairs. Here, the performance of the two prototype jacks is virtually indistinguishable for all pair combinations with the exception pairs 1 and 3, where the communications assembly 320-1 exhibits an improvement of over 1 dB in near end crosstalk performance. Finally, Table III illustrates the return loss performance for each pair of the communications assemblies 320 and 320-1. As shown in Table III, the use of the 5-terminal capacitor designs degrades the return loss on pairs 1 and 3 by about 0.5-1.0 dB, with somewhat smaller reductions on the other two pairs. However, the return loss on all four pairs is still well within the specified margins.

TABLE I

| Connector | Capacitance of Phantom Mode Injection Circuit (pF) | |
| --- | --- | --- |
| | Capacitor 1 | Capacitor 2 |
| Jack with Assembly 320 | 0.72 | 0.77 |
| Jack with Assembly 320-1 | 1.80 | 1.49 |

TABLE II

| Connector | NEXT Margins (dB) for Each Pair Combination | | | | | |
| --- | --- | --- | --- | --- | --- | --- |
| | 1&2 | 1&3 | 1&4 | 2&3 | 2&4 | 3&4 |
| Jack with Assembly 320 | 5.66 | 0.08 | −0.65 | −0.45 | 6.48 | 0.65 |
| Jack with Assembly 320-1 | 5.66 | 1.25 | −0.66 | −0.45 | 6.46 | 0.64 |

TABLE III

| Connector | Return Loss Margins (dB) | | | |
| --- | --- | --- | --- | --- |
| | Pair 1 | Pair 2 | Pair 3 | Pair 4 |
| Jack with Assembly 320 | 2.98 | 6.55 | 2.67 | 4.37 |
| Jack with Assembly 320-1 | 1.89 | 6.21 | 2.10 | 4.07 |

FIG. 6B is a schematic perspective view of a portion of a communications assembly 420 of an alternative jack that could be used to implement each connector port 220 on patch panel 200. The communications assembly 420 differs from the communications assembly 320 in that it includes two printed circuit boards 430, 432 instead of the single printed circuit board 330 provided in communications assembly 320. In communications assembly 420, the spring contacts 441-448 and IDCs (not shown) are mounted in printed circuit board 430, and the conductive traces/paths 449 connecting the spring contacts 441-448 to the IDCs are likewise provided on printed circuit board 430. The printed circuit board 432 includes contact pads 451-452, 457-458 and plates 460, 470 that may be identical to contact pads 351-352, 357-358 and plates 360, 370 of communications assembly 320. The communications assembly 420 further includes conductive connections (not shown) that connect the plates 460, 470 to the contact pads 265 on patch panel printed circuit board 230.

The jack 300 of FIGS. 5A-5C (or the alternative versions of the jack 300 discussed with respect to FIGS. 6A-6B) provide examples of jacks that could be used as the connector ports 220 of patch panel 200 in order to provide a communication system having the phantom mode control signaling capabilities according to embodiments of the present invention. It will likewise be appreciated, however, that the jacks of FIGS. 5A-5C and FIGS. 6A-6B may likewise be used in other environments such as, for example, in consolidation points, as connector ports on a network switch, as modular wall jacks, and/or as the connector ports of end devices. In each case, appropriate electrical connections would be made to any phantom mode control signaling circuitry in a similar fashion to the electrical connections that are shown above with respect to FIGS. 5A-5C in order to connect the control signal input circuit on jack 300 to the phantom mode control signaling circuitry on patch panel 200.

The discussion with respect to FIGS. 4A-4B, FIGS. 5A-5C and FIGS. 6A-6B illustrates several exemplary ways of implementing a patch panel having phantom mode control signaling capabilities. A cross-connect communications patching system that uses, for example, the above-described patch panel 200 of FIGS. 4A-4B that is populated with the jacks 300 of FIGS. 5A-5C may automatically track patch cord connections between two or more such patch panels 200 in the manner described above with respect to patch panels 110, 120 of FIG. 3 (i.e., the patch panel 200 may be used to automatically track patch cord connections in a cross-connect patching system). Pursuant to further embodiments of the present invention, the phantom mode control signaling techniques disclosed herein may also be used to automatically track patching connections in inter-connect communications patching systems and/or to track patching connections between patch panels and network switches such as, for example, the patch panel 120 and switch 130 of FIG. 3.

Figure 7:
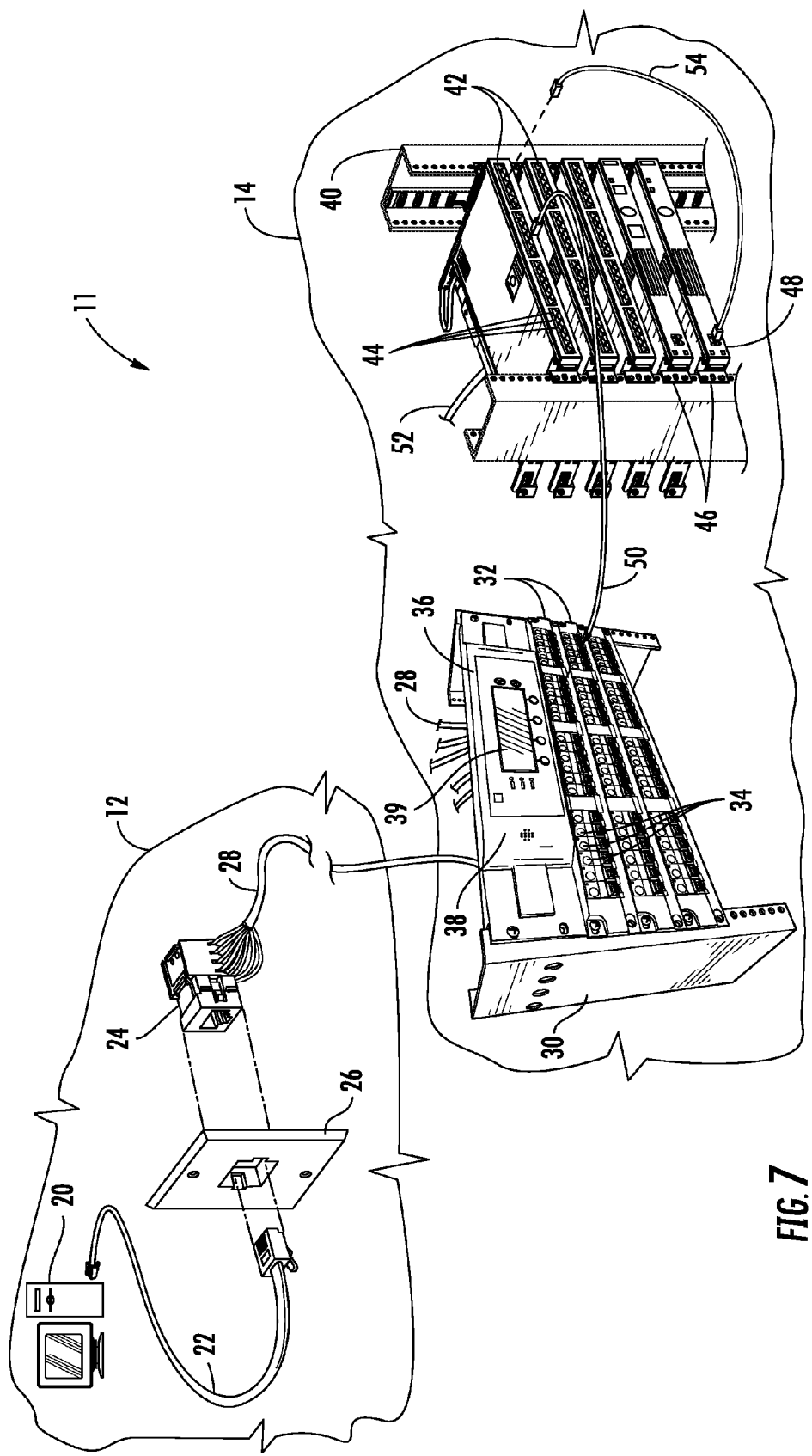
FIG. 7 is a schematic view of an inter-connect communications patching system according to certain embodiments of the present invention.

In particular, FIG. 7 is a schematic view of an inter-connect communications system 11 according to certain embodiments of the present invention that may be used to connect computers, printers, Internet telephones and other end devices that are located in work areas throughout a building to network equipment that is located, for example, in a computer room of the building. The exemplary inter-connect communications system 11 depicted in FIG. 7 is quite similar to the exemplary cross-connect communications system 10 illustrated in FIG. 2, and hence like reference numerals will be used to identify like elements in these figures, and the description below will focus on the differences between the systems 10, 11 depicted in FIGS. 2 and 7, respectively.

Specifically, as shown in FIG. 7, the inter-connect communications system 11 omits the second equipment rack 30' that is provided in the cross-connect communication system 10 of FIG. 2. Consequently, in the communications system 11 of FIG. 7, the connector ports 34 on the patch panels 32 on equipment rack 30 are directly connected to respective ones of the connector ports 44 on the network switches 42 by the first set of patch cords 50. Connectivity changes are typically made in the communication system 11 by rearranging the patch cords 50 that interconnect the patch panels 32 and the network switches 42.

Unfortunately, network switches are not available that include the phantom mode control signal circuitry discussed above that may be provided on the patch panels according to embodiments of the present invention. As such, pursuant to further embodiments of the present invention, "interposer" communications connectors are provided that may be used on network switches or other network equipment (and also on work area end devices, as will be discussed below) to facilitate automatically tracking patching connections and/or automatically identifying end devices according to certain embodiments of the present invention.

Figure 8A:
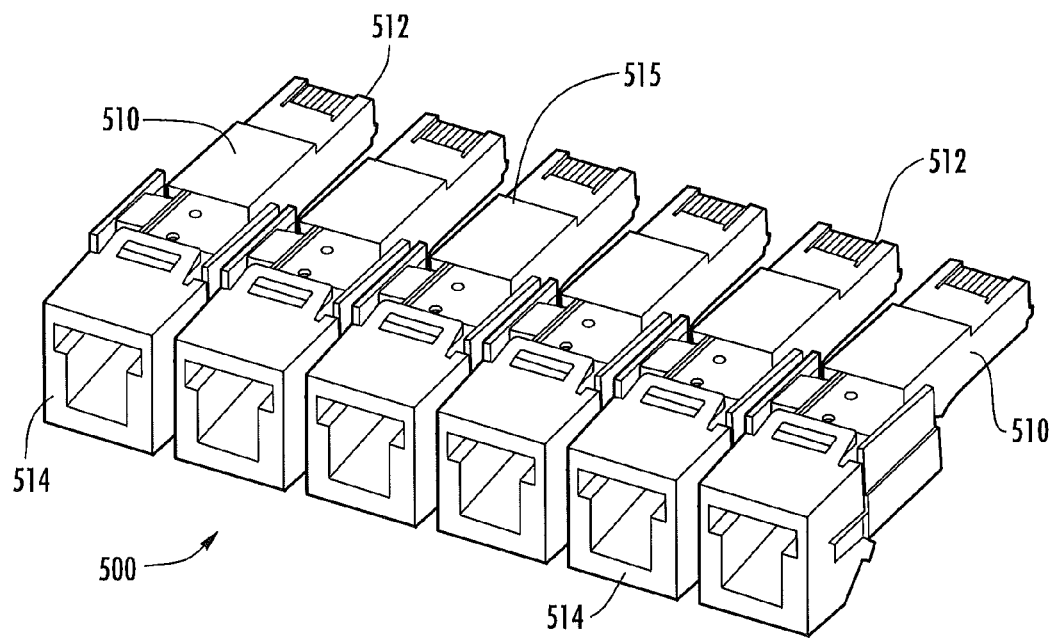
FIG. 8A is a schematic perspective view of an interposer according to embodiments of the present invention.
Figure 8B:
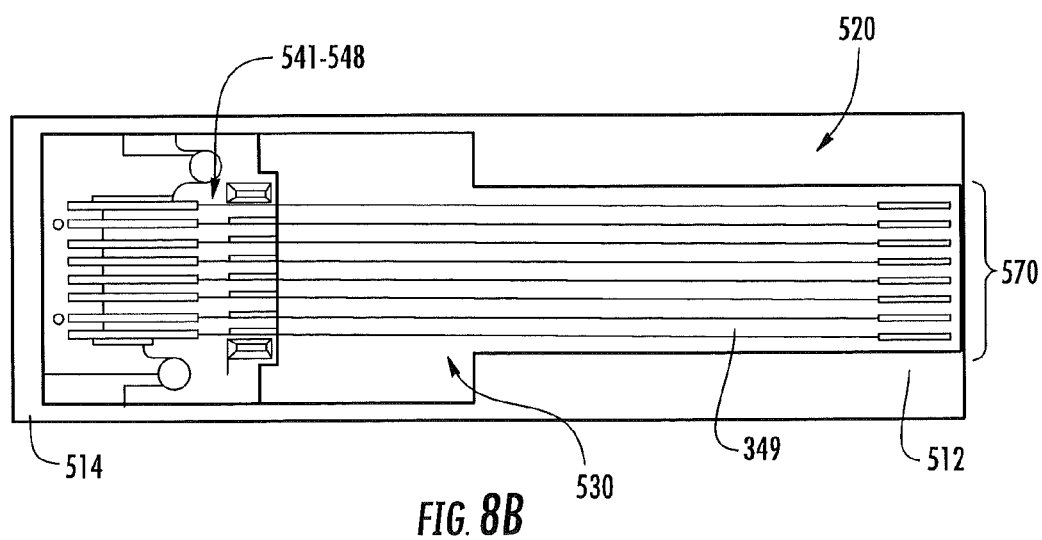
FIG. 8B is a top view of a communications assembly of one of the connectors of the interposer of FIG. 8A.
Figure 8C:
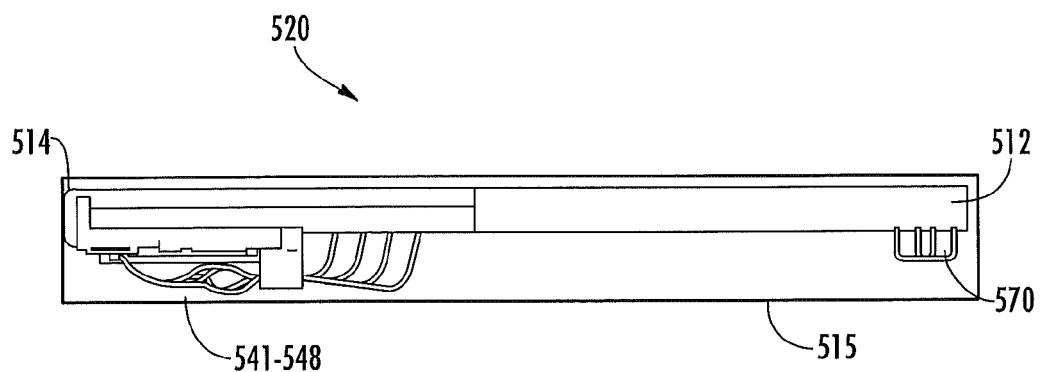
FIG. 8C is a side view of the communications assembly of FIG. 8B.
Figure 8D:
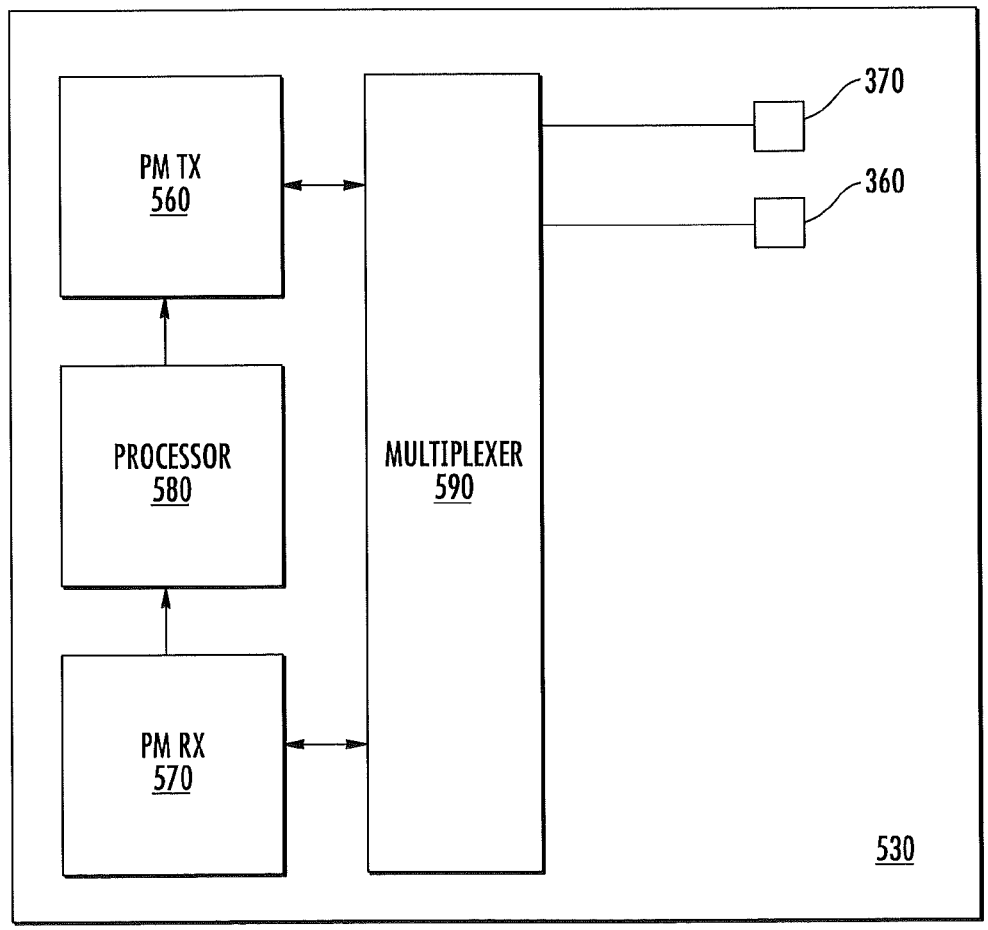
FIG. 8D is a schematic block diagram that illustrates phantom mode control signalling circuitry that may be included in the interposer of FIGS. 8A-8C.

FIGS. 8A-8D illustrate one exemplary interposer 500 according to embodiments of the present invention. FIG. 8A is a schematic perspective view of the interposer 500 that includes six (6) connectors 510, FIG. 8B is a top view of a communications assembly 520 of one of the connectors 510 of interposer 500, and FIG. 8C is a side view of the communications assembly 520 of FIG. 8B. FIG. 8D is a schematic block diagram that illustrates a phantom mode control signal circuit that may be included within or on the interposer 500.

Referring first to FIG. 8A, it can be seen that interposer 500 includes a plurality of connectors 510. Each connector 510 comprises a combination plug-jack connector that includes a plug end 512 that is terminated with a communications plug (e.g., an RJ-45 plug) and a jack end 514 that is terminated with a communications jack (e.g., an RJ-45 jack). Each plug-jack connector 510 may comprise a communications assembly 520 (see FIGS. 8B-8C) and a protective dielectric housing 515. The plug end 512 of each plug-jack connector 510 may be plugged into a connector port (e.g., an RJ-45 jack) on a network switch or other piece of network equipment. While the interposer 500 includes a total of six plug-jack connectors 510 that are linearly arranged, it will be appreciated that interposers may be provided that have any number of plug-jack connectors 510, and that the spacing and arrangement of the connectors 510 may be varied. Typically, the number, spacing and arrangement of the connectors 510 on interposer 500 will be designed to match the number, spacing and arrangement of the connector ports on the network equipment that the interposer 500 is to be used with. As will be explained in more detail below, the interposer 500 may include circuitry that facilitates sending and/or receiving phantom mode control signals, and thus the interposer 500 may facilitate tracking patching connections between network switches and patch panels such as the connections formed by patch cords 50 in the interconnect communications system 11 of FIG. 7. It will also be appreciated that interposers 500 may be used on work area end devices and or network end devices in addition to on network switches.

Turning now to FIGS. 8B-8C, it can be seen that the jack end portion 514 of each communications assembly 520 may be nearly identical to the communications assembly 320 of jack 300 of FIGS. 5A-5C. The primary difference between the communications assembly 320 of jack 300 and the communications assembly 520 of connector 510 is that assembly 520 does not include any IDCs. Instead, in communications assembly 520, the conductive printed circuit board traces/ paths 349 of printed circuit board 530 electrically connect the respective spring contacts 541-548 to a plurality of plug blades 570 that are provided on the plug end 512 of assembly 520. Note that the spring contacts 541-548 are shown schematically in FIG. 8B (and hence the crossovers therein are not illustrated in FIG. 8B). Any appropriate design may be used for spring contacts 541-548, specifically including the design of contacts 341-348 of jack 300 of FIGS. 5A-5C. It will also be appreciated that the connector 510 will typically include other appropriate circuitry such as crosstalk compensation circuits.

When the plug end 512 of connector 510 is inserted into a connector port on the network switch, the plug blades 570 and conductive printed circuit board traces 349 electrically connect the spring contacts of the connector port on the network switch to the spring contacts 541-548 of connector 510. While not visible in FIGS. 8A-8C, connector 510 further includes the contact pads 351-352 and 357-358 and plates 360, 370 that are discussed above with respect to jack 300, which operate in the same manner described above with respect to FIGS. 5A-5C.

Referring now to FIG. 8D, it can be seen that the interposer 500 may include circuitry similar to the circuitry included on patch panel printed circuit board 230. In particular, the interposer 500 may also include a phantom mode transmitter 560, a phantom mode receiver 570, a microprocessor 580 and a multiplexer 590. While these components are not illustrated in FIGS. 8A-8C in order to simplify the drawings, it will be appreciated that they can be built in or added to the interposer 500 in a variety of ways. For example, in one embodiment, the connectors 510 of interposer 500 could be designed to share a single, common printed circuit board (in the embodiment depicted in FIGS. 8A-8C each connector 510 includes its own printed circuit board 530), and the phantom mode transmitter 560, phantom mode receiver 570, microprocessor 580 and multiplexer 590 could be mounted on this common printed circuit board and connected by conductive traces/paths to plates similar to the plates 360, 370 shown in FIGS. 5B-5C. In such an embodiment, features similar to the printed circuit board traces 362, 372, the conductive posts 364, 374 (or, alternatively, metal-plated vias) and the phantom mode contacts 366, 376 of FIGS. 5A-5C could potentially be omitted from the interposer 500. In other embodiments, the phantom mode transmitter 560, phantom mode receiver 570, microprocessor 580 and multiplexer 590 could be mounted on a separate "phantom mode" printed circuit board that is connected, for example, to the top sides or the bottom sides of the connector housings 515. In such an embodiment, additional circuitry will be necessary that electrically connects the phantom mode circuit board to the printed circuit boards 530 of the individual connectors 510 so that the phantom mode control signals may be passed between the individual connectors 510 and the phantom mode circuitry on the phantom mode circuit board.

In any event, regardless of the specific implementation, each connector 510 on interposer 500 may include a pair of conductive paths that electrically connect the respective plates 360, 370 (see FIG. 5C) to the multiplexer 590 (or other selective switching circuit). One such exemplary pair of conductive paths is illustrated in the schematic block diagram of FIG. 8D. It will thus be understood that the interposer 500 may be used to upgrade a network switch to have the capability to transmit and/or receive phantom mode control signals in the same fashion that the patch panel 200 described above can transmit and/or receive phantom mode control signals to automatically track patching connections. Given that a network switch that includes an interposer 500 may function in exactly the same manner as the patch panel 200 described above, further discussion of the operation of the interposer 500 will be omitted.

It will be appreciated that the phantom mode transmitters 260, 560, the phantom mode receivers 270, 570, the microprocessors 280, 580 and the multiplexers 290, 590 that are described above may all comprise active components that require a direct current operating voltage. Current intelligent patch panels (i.e., patch panels that have the ability to automatically track patching connections) already typically include active components, and connections for providing power to such intelligent patch panels are already well known in the art and need not be described further herein. Power may be provided to the phantom mode transmitter 560, the phantom mode receiver 570, the microprocessor 580 and the multiplexer 590 of interposer 500 in a variety of ways. For example, in some embodiments a power cord may be used that connects the active circuits on interposer 500 to a power or operating voltage connection on the equipment rack on which the network switch that the interposer 500 is used with is mounted. In other embodiments, Power-over-Ethernet technology may be used to provide power to the active components of interposer 500.

It should be noted that the interposer 500 preferably should be nearly invisible electrically so that the inclusion of the interposer 500 does not appear as another connection in the channel. This may be accomplished, for example, by designing different interposers 500 for use with different network switches, where the connector 510 is specifically tuned to provide a high degree of crosstalk cancellation and low return losses when used in the connector port on the switch at issue.

Figure 23A:
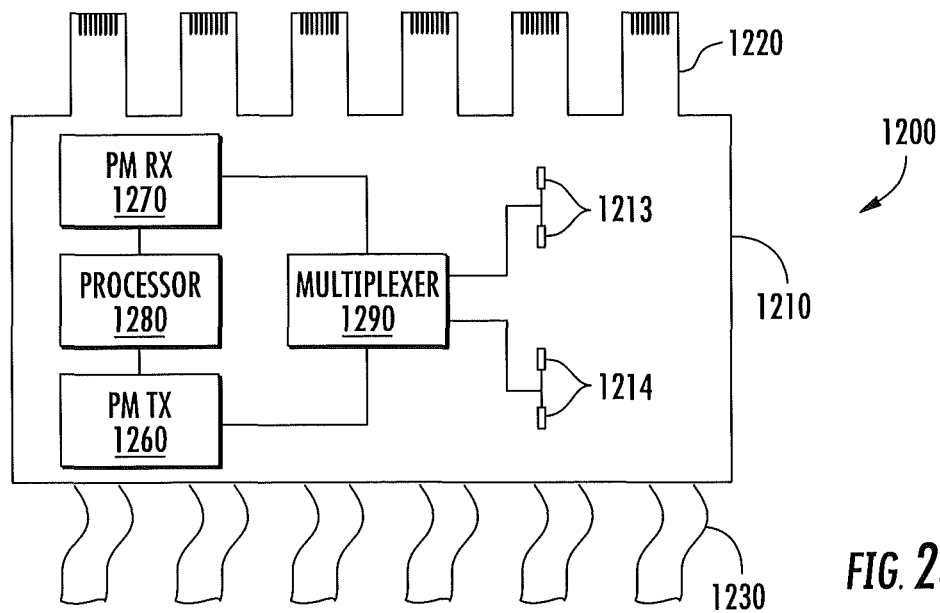
FIG. 23A is a schematic block diagram of an interposer according to further embodiments of the present invention.
Figure 23B:
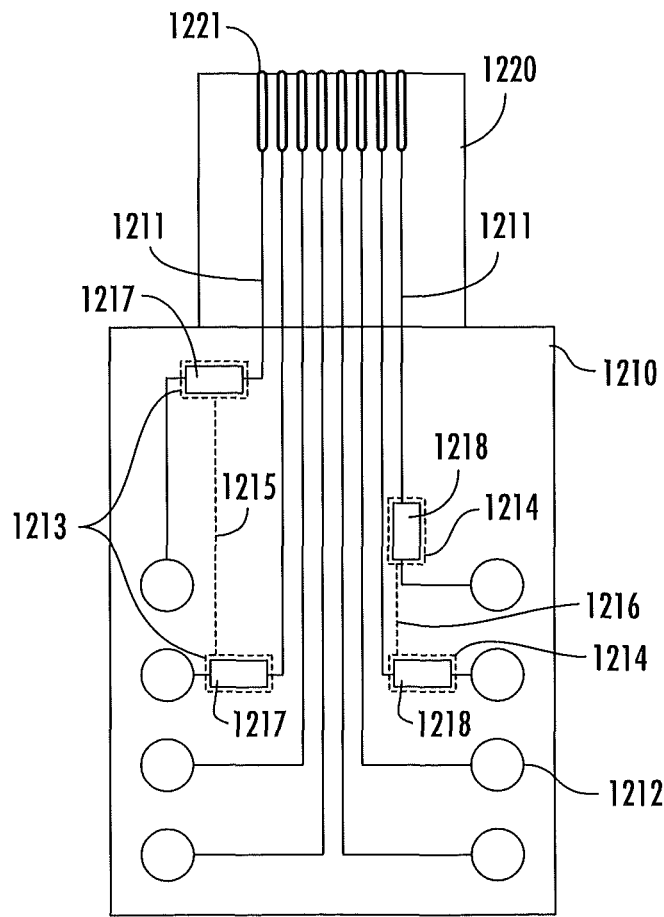
FIG. 23B is a schematic diagram illustrating the electrical connections for one of the patch cords that is connected to a network device using the interposer of FIG. 23A.

It will also be appreciated that the interposer 500 depicted in FIGS. 8A-8D simply illustrates one possible interposer design, and that numerous other interposers could be used in place of the interposer 500. By way of example, FIGS. 23A and 23B illustrate an interposer 1200 according to further embodiments of the present invention. In particular, FIG. 23A is a schematic block diagram of an interposer 1200, while FIG. 23B is a schematic diagram illustrating the electrical connections for one of the patch cords (not shown) that is connected to a network device using the interposer 1200. The interposer 1200 may be used to track patching connections between network switches and patch panels such as the connections formed by patch cords 50 in the interconnect communications system 11 of FIG. 7. It will also be appreciated that interposers 1200 may be used on work area end devices and or network end devices in addition to on network switches.

As shown in FIGS. 23A and 23B, the interposer 1200 includes a printed circuit board 1210. In the particular embodiment shown, the eight conductors (not shown) of each of six patch cords 1230 (i.e., a total of 48 conductors) are terminated into respective wire connection terminals such as insulation piercing contacts or IDCs that are mounted in the printed circuit board 1210. While the wire connection terminals are not shown in FIGS. 23A and 23B to simplify the diagrams, apertures 1212 in which the eight wire connection terminals for one of the six patch cords are illustrated in FIG. 23B Each patch cord 1230 may comprise a standard patch cord. However, in the embodiment of FIGS. 23A and 23B, the patch cords 1230 would only have a plug connector on one side thereof, since the conductors of the patch cord are connected to the printed circuit board 1210 using wire connection terminals such as insulation piercing contacts or IDCs.

The interposer 1200 also include a plurality (here 6) of plug connectors 1220 that each include eight plug blades 1221. Each plug connector 1220 acts as the plug connector for a respective one of the patch cords 1230. While not shown in FIG. 23A-23B, each plug connector 1220 would include a conventional RJ-45 plug housing and would be configured to mate with a conventional RJ-45 connector port on, for example, a network switch. As shown in FIG. 23B, the aperture 1212 for each wire connection terminal for a particular patch cord 1230 is connected to a respective one of the plug blades 1221 for its corresponding plug connector 1220, thereby providing the electrical connections between each patch cord 1230 and a connector port that the patch cords respective plug connector 1220 is plugged into.

The spacing between the plug connectors 1220 may be designed to match the spacings between connector ports on conventional network switches (note that more than one design would be necessary as different switch manufacturers have different connector port configurations). The printed circuit board 1210 may also be encased in a protective housing (not shown) that may hold the conductors of the patch cords 1230 in place once those conductors are attached to their respective wire connection terminals. While the interposer 1200 includes a total of six plug connectors 1220 that are linearly arranged, it will be appreciated that interposers 1200 may be provided that have any number of plug connectors 1220, and that the spacing and arrangement of the plug connectors 1220 may be varied.

As is also shown in FIG. 23A, a phantom mode transmitter 1260, a phantom mode receiver 1270, a microprocessor 1280 and a multiplexer 1290 may be mounted on the printed circuit board 1210 and interconnected by conductive traces on the printed circuit board 1210. The phantom mode transmitter 1260, the phantom mode receiver 1270, the microprocessor 1280 and the multiplexer 1290 may be identical to the phantom mode transmitter 560, phantom mode receiver 570, microprocessor 580 and multiplexer 590 of the interposer 500 of FIGS. 8A-D, and hence additional description of these components and the operation thereof will be omitted here. As shown in FIG. 23A, the multiplexer 1290 has a pair of outputs for each plug connector 1220 that are connected to respective ones of a pair of conductive plates 1213, 1214 for each plug connector 1220 (that the multiplexer outputs and conductive plates 1213, 1214 are illustrated for only one of the six plug connectors 1220 in FIG. 23A to simplify the drawing).

FIG. 23B illustrates how the conductive plates 1213, 1214 may be used to couple a phantom mode control signal from phantom mode transmitter 1260 onto two of the differential pairs of one of the plug connectors 1220. As shown in FIG. 23, the conductive plates 1213 that receive the first component (e.g., the positive component) of a phantom mode control signal are electrically connected to each other by a trace 1215. Likewise, the conductive plates 1214 that receive the second component (e.g., the negative component) of the phantom mode control signal are electrically connected to each other by a trace 1216. Additionally, the conductive traces 1211 for a first of the differential pairs (i.e., the traces that connect each wire connection terminal of the pair to its respective plug blade) each have a widened area 1217 that is located directly above a respective one of the conductive plates 1213. The plates 1213 and the widened areas 1217 act like plate capacitors to couple the first component of a phantom mode control signal transmitted by phantom mode transmitter 1260 onto the first differential pair (and hence into the channel). The conductive traces 1211 for a second of the differential pairs each similarly have a widened area 1218 that is located directly above a respective one of the conductive plates 1214. The plates 1214 and the widened areas 1218 also act like plate capacitors that may be used to couple the second component of the phantom mode control signal transmitted by phantom mode transmitter 1260 onto the second differential pair (and hence into the channel). These structures likewise may be used to couple a phantom mode control signal from the channel to the phantom mode receiver 1270 through multiplexer 1290.

Thus, the interposer 1200 can be used to upgrade a network switch or an end device to have the capability to transmit and/or receive phantom mode control signals in the same fashion that the patch panel 200 described above can transmit and/or receive phantom mode control signals to automatically track patching connections. Given that a network switch that includes an interposer 1200 may function in exactly the same manner as the patch panel 200 described above, further discussion of the operation of the interposer 1200 will be omitted.

The interposer 1200 may have an advantage over the interposer 500 in that it can more easily be designed to be nearly invisible electrically so that the inclusion of the interposer 1200 does not appear as another connection in the channel (this may be more difficult with the interposer 500 of FIGS. 8A-D). However, the interposer 1200 requires an added installation step, as the six patch cords must be manually terminated into the wire connection terminals of the interposer 1200. An appropriate interposer design may be selected based on the considerations of any given communications system.

Pursuant to further embodiments of the present invention, circuits may be provided that can be used to detect the insertion and/or removal of patch cords at various connector ports in a communications channel. By automatically identifying such plug insertions and removals, the connection tracking systems according to embodiments of the present invention may operate as event-driven systems and may generate additional tracking information that may be used by, for example, network administrators.

Figure 9:
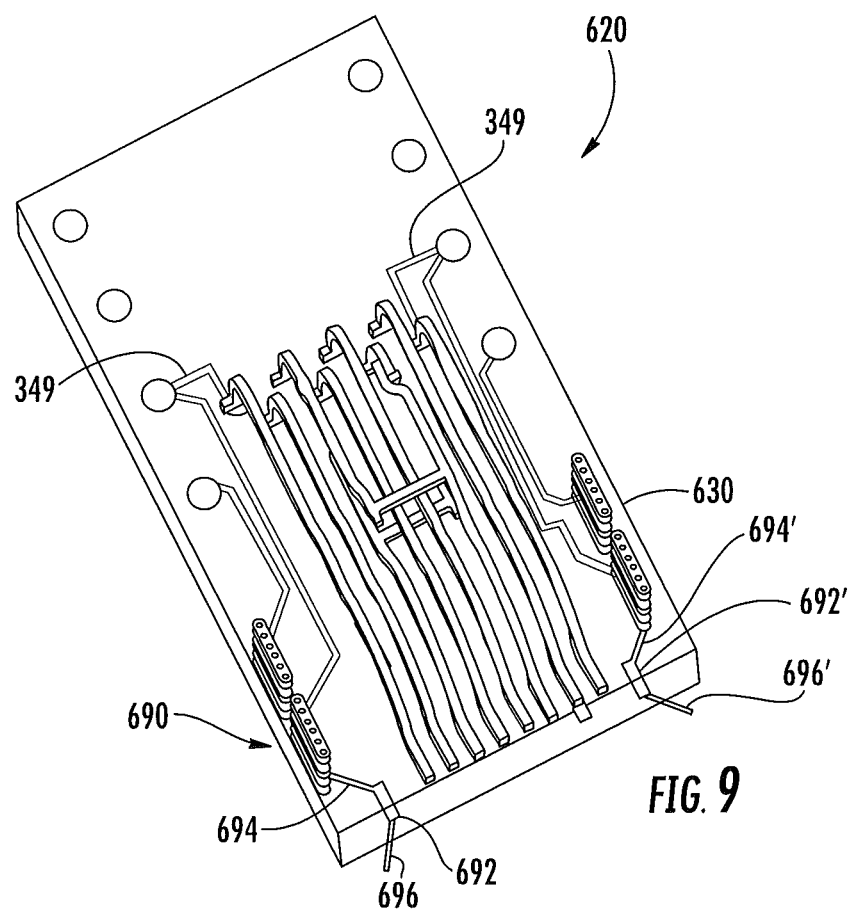
FIG. 9 is a simplified perspective view of a communications assembly of a jack that includes a plug insertion/removal detection circuit according to certain embodiments of the present invention.

FIG. 9 is a simplified perspective view of a communications assembly 620 of a jack 600 that includes a plug insertion/removal detection circuit 690. The jack 600 may be identical to the jack 300 discussed above with respect to FIGS. 5A-5C (or to the alternative embodiments thereof shown in FIGS. 6A-6B) except that the jack 600 additionally includes the plug insertion/removal detection circuit 690. In order to simplify the drawings, all of the internal electrical connections on the printed circuit board 630 of communications assembly 620 have been omitted in FIG. 9 except for the electrical connection to the plug insertion/removal detection circuit 690. It will also be appreciated that the plug insertion/removal detection circuit 690 may be implemented on any other conventional or non-conventional jack. In some embodiments, the jack 600 may be used, for example, as one of the connector ports 220 on patch panel 200, as a connector port that is used in a modular wall jack or consolidation point (e.g., wall jack 140 of FIG. 2), as one of the connectors 510 (suitably modified to have a plurality of plug blade output terminals as opposed to IDCs) of interposer 500, or as a connector port of an interposer that is installed on a work area or network end device. Typically, the jack 600 will have an associated phantom mode transmitter, phantom mode receiver and microprocessor (not shown in FIG. 9). By way of example, if the jack 600 is used as one of the connector ports on patch panel 200, the jack 600 may operate in conjunction with the phantom mode transmitter 260, phantom mode receiver 270 and microprocessor 280 that are mounted on patch panel printed circuit board 230.

As shown in FIG. 9, the communications assembly 620 includes a printed circuit board 630. The plug insertion/removal detection circuit 690 comprises an externally accessible contact 692 and a conductive trace 694 that may be implemented on printed circuit board 630. The conductive trace 694 is physically and electrically connected to a spur off of one of the conductive paths that connects spring contact 348 to its corresponding IDC. Consequently, any signal that is present on spring contact 348 will flow through conductive trace 694 to the externally accessible contact 692. The plug insertion/removal detection circuit 690 further includes a contacting structure 696 (which is schematically depicted and only partially shown in FIG. 9) that electrically connects the externally accessible contact 692 to the microprocessor 280 via the multiplexer 290 (not shown in FIG. 9). In the depicted embodiment, the contact 692 is located near the front of the printed circuit board 630 so that the externally accessible contact 692 may be in close proximity to the patch panel printed circuit board 230 on which multiplexer 290 may be mounted. As further shown in FIG. 9, the communications assembly 620 may also include a second externally accessible contact 692', a second conductive trace 694' and a second contacting structure 696' that are identical to elements 692, 694 and 696, respectively, except that they are connected to one of the conductive paths of a different one of the differential pairs of conductive paths through the communications assembly 620. These additional structures 692', 694' and 696' may be used to map horizontal cabling connections, as will be discussed in further detail later in this application Operation of the plug insertion/removal detection circuit 690 will now be described with reference to FIGS. 4A-4B, 5A-5C and 9.

When the phantom mode transmitter 260 transmits a phantom mode control signal to the jack 600, that signal is input to the plates 360, 370 of jack 600 via the contact pads 265 on the patch panel printed circuit board 230, the phantom mode contacts 366, 376, the conductive posts 364, 374 and the circuit traces 362, 372. If a plug is inserted within the plug aperture of jack 600, then the spring contacts 341-348 will be deflected downwardly to come into contact with the contact pads 351-358 in the manner discussed above with reference to FIGS. 5A-5C. In such a case, the phantom mode control signal that is input from the phantom mode transmitter 260 to the plates 360, 370 is capacitively coupled to the pads 351-352 and 357-358, where it is then coupled to the spring contacts 341-342 and 347-348. This capacitively coupled phantom mode control signal, which may have a magnitude that is, for example, on the order of 70 dB less than the magnitude of the phantom mode control signal that is input to jack 600, is then coupled onto the conductive traces/paths 349 (only one of which is shown in FIG. 9) associated with each of spring contacts 341-342 and 347-348, and hence will travel to the externally accessible contact 692 and contacting structure 696 (since contact 692 and contacting structure 696 are electrically connected to the conductive path through the jack 600 that connects spring contact 348 to its respective IDC). As discussed above, the contacting structure 696 connects the externally accessible contact 692 to an input port on the microprocessor 280. Thus, if a plug is received within the plug aperture of jack 600, a phantom mode control signal that is generated by phantom mode transmitter 280 and injected into jack 600 via the plates 360, 370 will pass back out of the jack via contacting structure 696 and is fed to the microprocessor 280, where it can be detected.

If, on the other hand, a plug is not inserted within the plug aperture of jack 600, then the spring contacts 341-348 will remain in their normal resting position where they do not come into contact with the contact pads 351-358 (which are shown best in FIG. 5B, and which are also present in FIG. 9, but hidden from view by the distal ends of the spring contacts 341-348). As such, the phantom mode control signal that is input from phantom mode transmitter 260 to the plates 360, 370 is not capacitively coupled onto the spring contacts 341-342 and 347-348, and hence no phantom mode control signal will travel to the microprocessor 280 via the externally accessible contact 692 and contacting structure 696 and other connecting structures.

In light of the above operating characteristics, the microprocessor 280 may use the signal provided via the contacting structure 696 to make a determination as to whether or not a plug is presently inserted in jack 600. This determination may be performed in a variety of different ways. In some embodiments, the microprocessor 280 may perform an analog comparison of the relevant portion (e.g., positive or negative) of the phantom mode control signal that it provides to the jack 600 with any signal that is present on the contacting structure 696. By way of example, if the phantom mode control signal that is injected into the phantom mode control channel of jack 600 comprises a 50 MHz FSK modulated signal, the presence of the positive or negative component of such a 50 MHz FSK modulated signal on the contacting structure 696 (reduced in magnitude due to the capacitive coupling) may indicate that a plug is currently inserted in the plug aperture of jack 600, since such a signal should not be present if no plug is inserted because the injected phantom mode control signal will only be injected onto the spring contacts if a plug is present in the plug aperture and therefore forcing the spring contacts 341-348 into direct contact with the contact pads 351-358.

In other embodiments, the signal present on contacting structure 696 may be provided to the phantom mode receiver 270 where it is demodulated. The demodulated baseband packetized digital data stream may be compared to the digital data stream that was sent by the phantom mode transmitter 260 to jack 600 or, alternatively, can be scanned for identification information embedded therein that indicates that the signal originated from the patch panel associated with jack 600. In this manner, the microprocessor 280 may reliably identify plug insertions and removals from the plug aperture of jack 600.

As should be clear from the above discussion, in some embodiments, the communications jack 600 may include a plurality of spring contacts 341-348 that have plug contact regions that comprise input ports of the jack 600 and a plurality of wire connection contacts that include wire contact regions that comprise output ports of the jack 600. A plurality of conductive paths 349 (e.g., printed circuit board traces and layer transferring structures) may connect respective ones of the spring contacts to respective ones of the wire connection contacts. These conductive paths 349 may be arranged as a plurality of differential pairs of conductive paths. A control signal input circuit such as a capacitor may be provided that is used to inject a common mode control signal onto a first of the differential pairs of conductive paths. A control signal output circuit is provided (e.g., an externally accessible contact 692 and/or contacting structure 696) that is configured to output at least a portion of the injected common mode control signal. A plug insertion detection circuit is provided (e.g., the phantom mode receiver and associated processor) that is coupled to the control signal output circuit.

As should be clear from the above discussion, the plug insertion/removal detection circuit 690 may detect the presence or absence of a plug regardless of whether or not the far end of the patch cord that includes the plug in question is plugged into another connector port. This may be advantageous in that it may, for example, help network administrators identify improperly installed patch cords where one of the plugs on the patch cord was not fully inserted into the plug aperture on the connector port the plug was supposed to mate with. Moreover, the plug insertion/removal detection circuit 690 may be implemented quite cheaply. In the depicted embodiment, all that is required are a trace 694, a contact pad 692 and a contacting structure 696, each of which may be very inexpensive, along with software that analyzes the signal received on contacting structure 696 to determine if it corresponds to the transmitted phantom mode signal (or a component thereof).

Approaches that demodulate the signal present on contacting structure 696 and extract unique data therefrom may be preferred in embodiments where more than one phantom mode transmitter is provided along a channel, to avoid the possibility that the microprocessor 280 detects a phantom mode control signal on contacting structure 696 that was injected by a phantom mode transmitter other than the phantom mode transmitter associated with microprocessor 280 (i.e., the phantom mode transmitter 260). In addition, noise and/or electromagnetic interference may be present that may distort the above-described direct analog comparison (particularly as the capacitively coupled phantom mode control signal may be reduced in magnitude on the order of 70 dB and hence more susceptible to noise). The impact of such noise may be reduced by demodulating the received signal.

A method of detecting the insertion and/or removal of a plug from a communications connector according to embodiments of the present invention will now be described with reference to the flow chart diagram of FIG. 18. This method may be performed, for example, using the plug insertion/removal detection circuit 690 depicted in FIG. 9.

Figure 18:
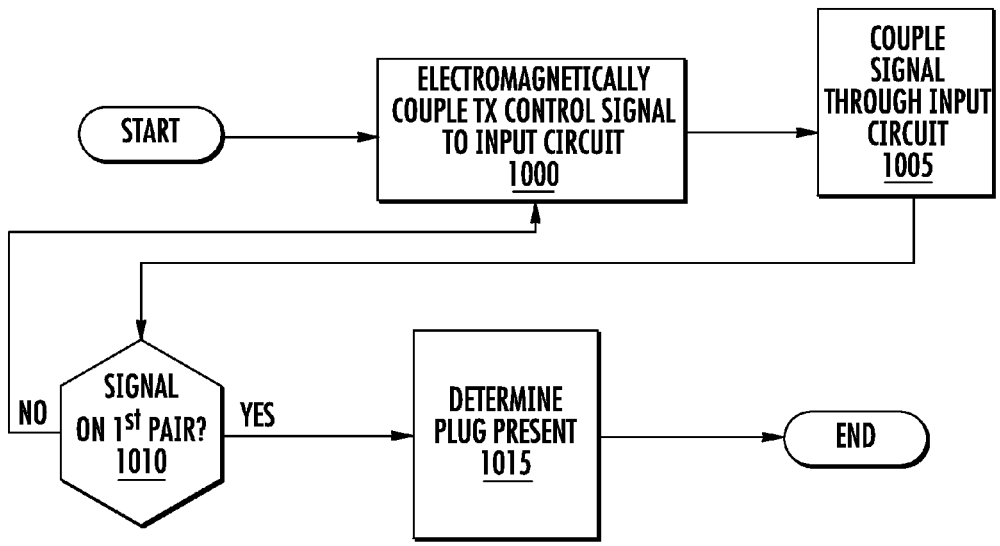
FIG. 18 is a flow chart diagram illustrating methods of detecting the insertion and/or removal of a plug from a communications connector according to embodiments of the present invention.

As shown in FIG. 18, operations may begin with a control signal being transmitted to a control signal input circuit of the communications connector (block 1000). This control signal may then be electromagnetically coupled through the control signal input circuit (block 1005). A determination may then be made as whether or not the electromagnetically coupled control signal is present on a first differential pair of conductive paths that are included in the communications connector (block 1010). If they are not, operations may proceed back to block 1000. If it is determined at block 1010 that the electromagnetically coupled control signal is present on the first differential pair of conductive paths, then a determination is made that a mating plug is present in the plug aperture (block 1015). This determination may be based at least in part on detecting the electromagnetically coupled control signal on the first differential pair of conductive paths through the communications connector.

In some embodiments, the control signal may be a common mode control signal that is electromagnetically coupled onto both conductive paths of the first differential pair of conductive paths. In some embodiments, a second control signal may be electromagnetically coupled from a second control signal input circuit onto a second differential pair of conductive paths through the connector, and the control signal and the second control signal may together comprise a differential control signal such as, for example, a phantom mode control signal. In such embodiments, the control signal input circuit may be a first three-terminal capacitor that electromagnetically couples a first component of the phantom mode control circuit onto the first differential pair of conductive paths and a second three-terminal capacitor that electromagnetically couples the a second component of the phantom mode control circuit onto the second differential pair of conductive paths.

It will be appreciated that the plug insertion/removal detection circuit 690 depicted in FIG. 9 is exemplary in nature, and that numerous possible modifications thereto are possible. For example, while the externally accessible contact 692 is implemented as a contact pad on the lower surface of the jack printed circuit board 630 in the depicted embodiment, it will be appreciated that any conductive contact can be used such as, for example, a conductive post or a metal plated aperture that receives the contacting structure 696 (e.g., the contacting structure 696 may include an eye-of-the-needle termination that is mounted in such a metal-plated aperture in printed circuit board 630). It will likewise be appreciated that the conductive trace 694 may have a different configuration or may be omitted (i.e., if the externally accessible contact 692 or contacting structure 696 is connected directly to the conductive path for spring contact 348). It will likewise be understood that the plug insertion/removal detection circuit 690 may connect directly to a portion of the conductive path for spring contact 348 that is not on the printed circuit board 630 such as, for example, the spring contact 348 or its corresponding IDC. Moreover, while the plug insertion/removal detection circuit 690 is depicted as connecting to the conductive path for spring contact 348, it will be appreciated that it can be implemented as any circuit that provides access to one or more of the conductive paths through jack 600 that are configured to carry a phantom mode control signal so that the path may be monitored to determine if a control signal is in fact present. While in the above example, a conductive trace 694 is used to connect the externally accessible contact 692 to the conductive path 349 that connects the appropriate spring contact to the corresponding IDC, it will be appreciated that a capacitor can used instead. Such a capacitor can be implemented in a number of ways such a for example by depositing parallel plates on different layers of the printed wiring board.

As another example, the plug insertion/removal detection circuit 690 depicted in FIG. 9 could be modified to provide a differential plug insertion/detection signal that is less immune to noise. For instance, a second externally accessible contact 692' (not shown), a second conductive trace 694' (not shown), and a second contacting structure 696' (not shown), that may be substantially identical to contacts and traces 692, 694, 696, except that contacts/traces 692', 694', 696' are electrically connected to a spur off of one of the conductive paths that connects, for example, spring contact 341 to its corresponding IDC. In such an embodiment, the plug insertion/removal detection signal will comprise a differential signal in that it will include, for example, the positive component of the phantom mode control signal on externally accessible contact 692' and the negative component of the phantom mode control signal on externally accessible contact 692. This differential plug insertion/removal detection signal may then be fed to the microprocessor 280 via, for example, the multiplexer 290. The use of a differential plug insertion/removal detection signal may be preferred in some embodiments because it may be less susceptible to corruption by noise.

It will also be appreciated that different signals may be transmitted over the phantom mode control channel for purposes of detecting plug insertions/removals versus phantom mode control signals that are transmitted to identify patching connectivity. Moreover, in some embodiments, each patch panel, interposer and other device on a channel that has a phantom mode transmitter may use a different frequency to transmit the phantom mode control signals that are used to detect plug insertions and removals by setting the phantom mode transmitter on each such device to transmit, for example, at slightly different frequencies. Such an approach may be advantageous because the phantom mode control signals that are transmitted on a channel may traverse the entire channel, and hence in some cases it may not otherwise be apparent which phantom mode transmitter is transmitting a plug insertion/removal detection signal. By having the phantom mode transmitters transmit at pre-defined frequencies, the frequency of the received signal may be used to identify the corresponding transmitter, which in turn may be used to determine which connector port along a channel a plug was inserted into. In other embodiments, other identification means may be used such as, for example, having each phantom mode transmitter include a unique identifier when sending a plug insertion/removal detection signal.

Figure 10A:
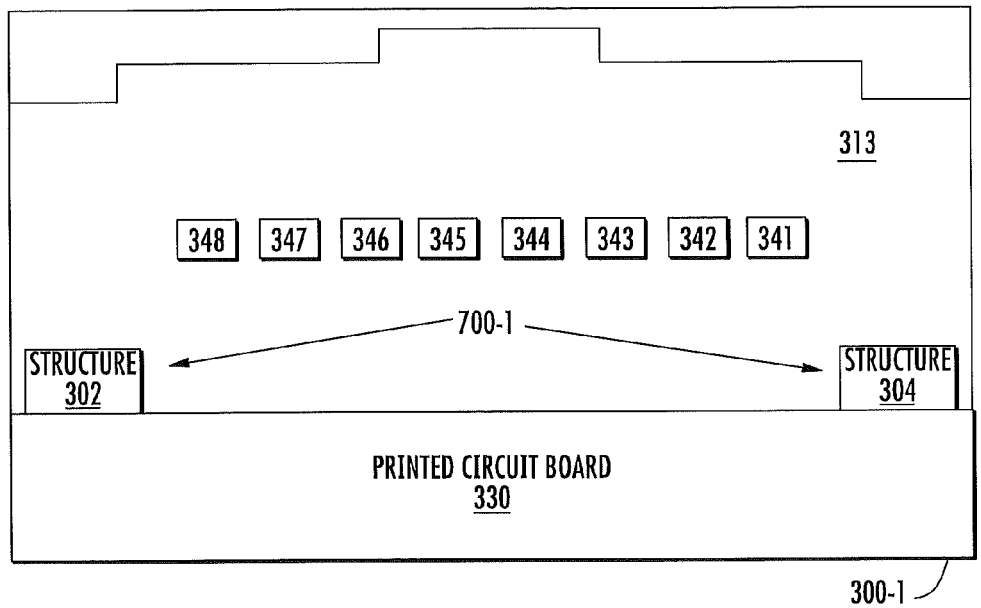
FIG. 10A is a schematic front view of part of a plug aperture of a jack that includes a plug insertion/removal detection circuit according to further embodiments of the present invention that illustrates the positions of the distal ends of the spring contacts when no plug is received within the plug aperture.
Figure 10B:
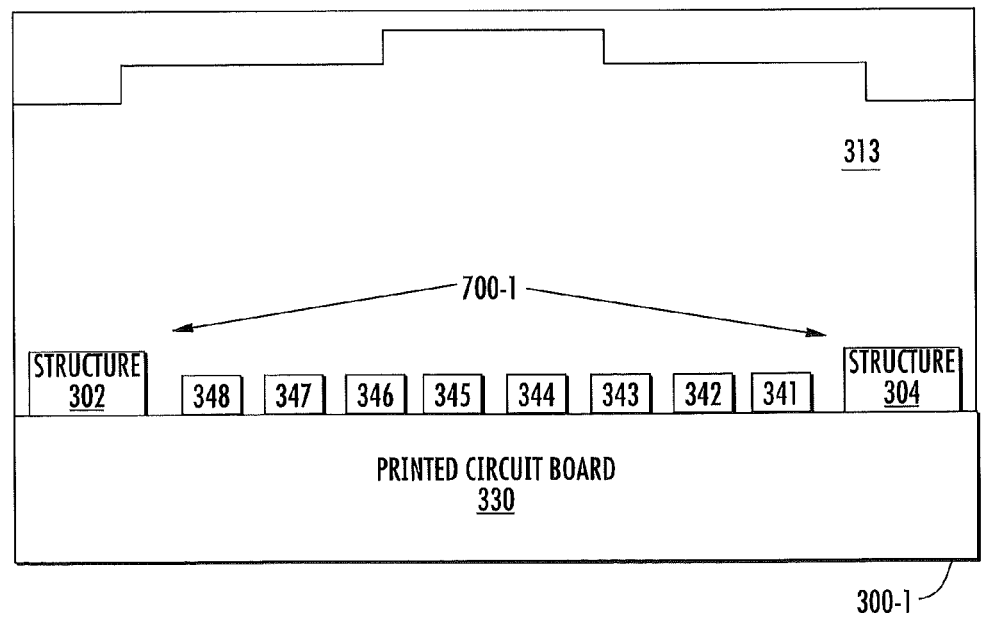
FIG. 10B is a schematic front view of the plug aperture of the jack of FIG. 10A that illustrates the positions of the distal ends of the spring contacts when a plug is present within the plug aperture.
Figure 10C:
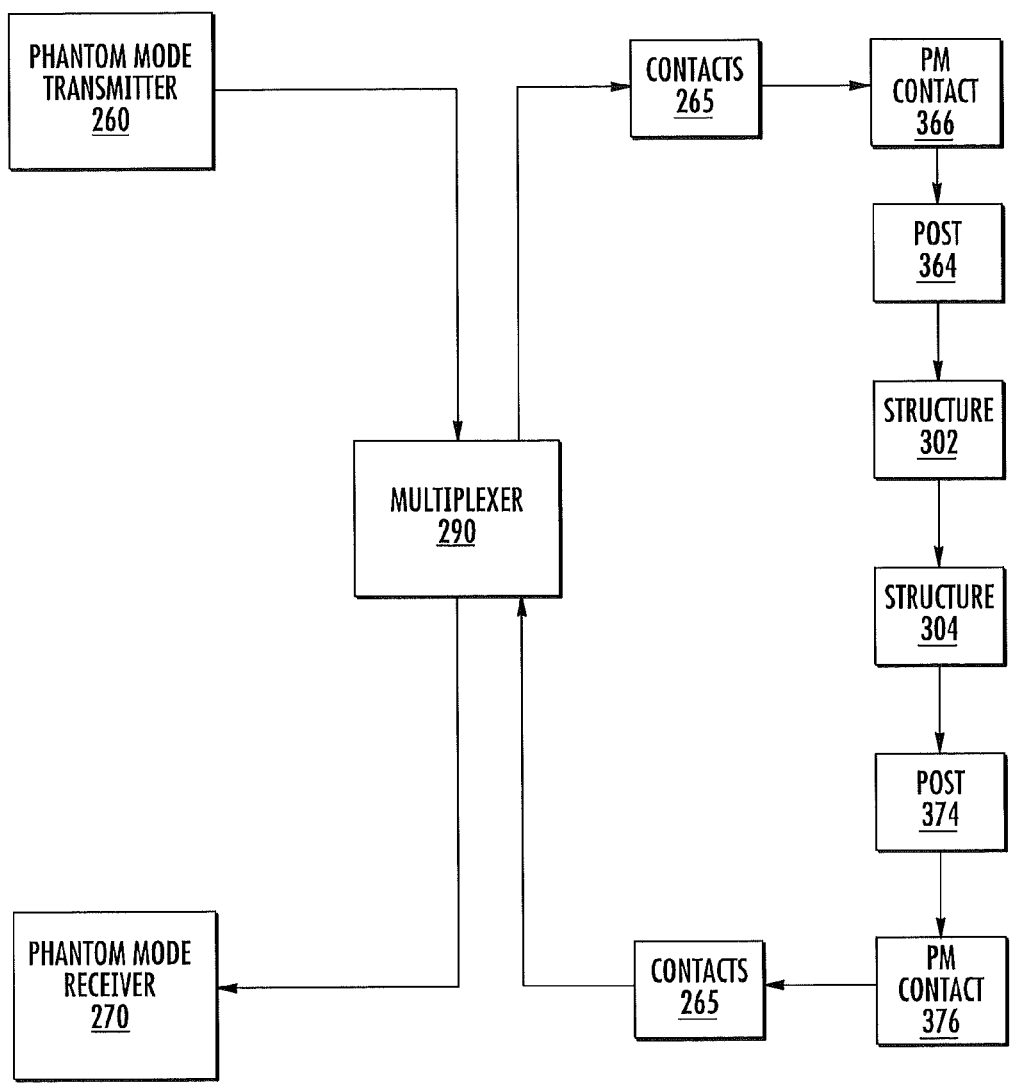
FIG. 10C is a block diagram illustrating how the phantom mode control signalling circuitry may be used to send an excitation signal to the plug insertion/removal detection circuit of FIGS. 10A-10B.

FIGS. 10A-10B are schematic diagrams that illustrate a jack 300-1 that includes a plug insertion/removal detection circuit 700-1 according to further embodiments of the present invention that may be used to detect when a plug is inserted into, or removed from, a connector port. The jack 300-1 may be identical to the jack 300 of FIGS. 5A-5C (or the modified versions of jack 300 explained above with reference to FIGS. 6A-6B) with the exception that the jack 300-1 further includes the plug insertion/removal detection circuit 700-1, and hence further description of the features of jack 300-1 will be omitted herein. FIG. 10C is a block diagram illustrating how the phantom mode control signalling circuitry may be used to send an excitation signal to the plug insertion/removal detection circuit 700-1.

Starting first with FIG. 10A, this schematic front view of the plug aperture of jack 300-1 illustrates the positions of the distal ends of spring contacts 341-348 when no plug is inserted in the plug aperture 313 of jack 300-1. As shown in FIG. 10A, structures such as conductive posts, plates or the like 302, 304 may be mounted on or embedded in the printed circuit board 330 on either side of the spring contacts 341-348 (or alternatively, mounted on sidewalls of the jack housing or in any other appropriate manner). These conductive structures 302, 304 may be viewed as two electrodes of a capacitor. The dielectric constant of the whatever is between the structures 302, 304 will necessarily change based on whether or not the spring contacts 341-348 have or have not been deflected downwardly to reside between the structures 302, 304. As shown in FIG. 10A, if no plug is received within the plug aperture 313 of jack 300-1, then air is disposed between the structures 302, 304, and hence the dielectric constant of the capacitor formed by structures 302, 304 and the air therebetween will be the dielectric constant of air (here secondary effects, such as the effect the top surface of printed circuit board 330 will have on the dielectric constant, are ignored to simplify the explanation).

FIG. 10B is a similar schematic front view of the plug aperture of the jack 300-1 that illustrates the positions of the distal ends of spring contacts 341-348 when a plug is present in the plug aperture 313 of jack 300-1. As shown in FIG. 10B, when a plug is present, the distal end portions of the spring contacts 341-348 are forced downwardly toward the printed circuit board 330 so that they occupy the space between the conductive structures 302, 304. When this occurs, the dielectric constant for the capacitor formed by structures 302, 304 changes, as the spring contacts 341-348 have a dielectric constant that differs from the dielectric constant of air.

Referring now to the block diagram of FIG. 10C, a control signal can be transmitted to structure 302 from, for example, the phantom mode transmitter 260 of patch panel 200. The phantom mode transmitter 260 may be coupled to structure 302 via any appropriate electrical connection such as, for example, the multiplexer 290 (see FIG. 4B), the contacts 265 (see FIG. 4B), the phantom mode contact 366 (see FIG. 5A), the post 364 (see FIG. 5B) and a conductive trace (not shown in the figures) that connects the post 364 to structure 302. Some portion of the signal from the phantom mode transmitter 260 that is received at structure 302 is capacitively coupled to structure 304. The signal that is received on structure 304 may then be provided to, for example, the phantom mode receiver 270 and/or processor 280 of patch panel 200 via any appropriate electrical connection such as, for example, a conductive trace (not shown in the figures) that connects the structure 304 to the post 374 (see FIG. 5B) so that the signal may be passed to the phantom mode contact 376 (see FIG.

5A), to the contacts 265 (see FIG. 4B) to the multiplexer 290 (see FIG. 4B) and on to the phantom mode receiver 270. As the magnitude of the received signal will vary based on whether or not the spring contacts 341-348 are in the position of FIG. 10A or in the position of FIG. 10B due to the above-described variation in the dielectric constant, the magnitude of the signal received on structure 304 that is passed on to the phantom mode receiver 270 may be used to determine whether or not a plug is inserted in the plug aperture 313 of jack 300-1.

Note that it may be necessary to take steps to ensure that the magnitude of the signal on structure 304 that is measured is the signal energy of the signal that was transmitted to structure 302 that capacitively couples to structure 304. This may be accomplished in some embodiments by, for example, transmitting the signal to structure 302 at an out-of-band frequency (e.g., 800 MHz) and then filtering out other frequencies at the receiver in order to measure the magnitude of the signal that is capacitively coupled to structure 304.

Figure 11A:
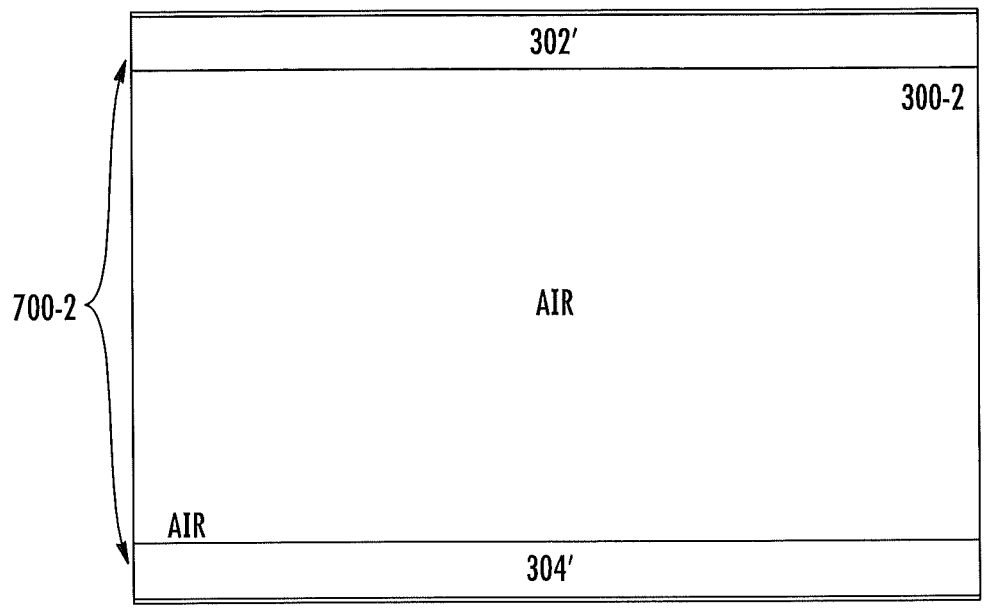
FIG. 11A is a schematic front view of the plug aperture of a jack that includes a plug insertion/removal detection circuit according to still further embodiments of the present invention.
Figure 11B:
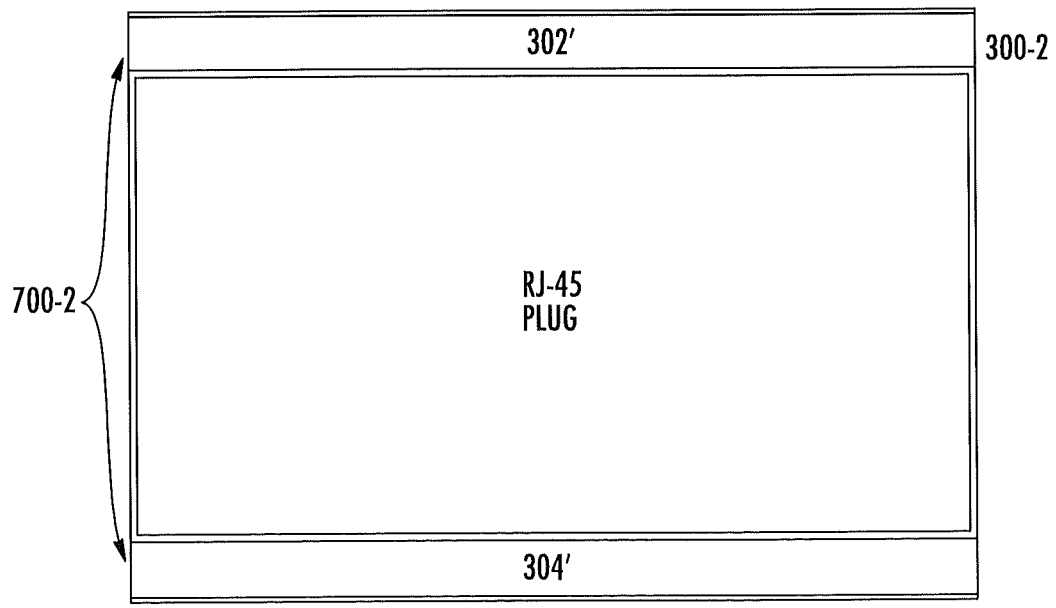
FIG. 11B is a schematic front view of the plug aperture of the jack of FIG. 11A that illustrates the plug aperture when a plug is present within the plug aperture.

FIGS. 11A-11B are schematic diagrams that illustrate a jack 300-2 that includes another plug insertion/removal detection circuit 700-2 that is similar to the circuit 700-1 shown in FIGS. 10A-10B. In particular, FIG. 11A is a schematic front view of a jack 300-2 with no plug inserted therein, and FIG. 11B is a schematic front view of a jack 300-2 with a plug inserted in the plug aperture. The plug detection circuit 700-2 may be coupled to the phantom mode transmitter 270 and the phantom mode receiver 260 in the same manner, discussed above with reference to FIG. 10C, that plug detection circuit 700-1 is coupled to the phantom mode transmitter 270 and the phantom mode receiver 260.

As shown in FIGS. 11A-11B, the plug insertion/removal detection circuit 700-2 comprises a first plate 302' of a capacitor that is mounted at the top of the plug aperture and a second plate 304' of the capacitor that is mounted at the bottom of the plug aperture. The plug insertion/removal detection circuit 700-2 may operate in essentially the same fashion as the plug insertion/removal detection circuit 700-1 of FIGS. 10A-10B. In particular, the dielectric constant of the plug insertion/removal detection circuit 700-2 changes based on whether or not a plug or air is present in the plug aperture. An out-of-band control signal is transmitted to plate 302', and some portion of that control signal is capacitively coupled to plate 304'. The signal on plate 304' may then be provided to a receiver where, for example, the magnitude of the received signal is determined. As the magnitude of the received signal will vary based on the dielectric constant of the material (i.e., either air or a plug) that is present in the plug aperture, the magnitude of the received signal may be used to determine whether or not a plug is inserted in the plug aperture 313 of jack 300-2.

While FIGS. 11A-11B illustrate an embodiment in which the structures 302', 304' are located at the top and bottom of the plug aperture, it will be appreciated that these structures may be located in different positions and/or sized differently in various alternative embodiments. By way of example, in one alternative embodiment the structures 302', 304' may be located on the opposing left and right sides of the plug aperture 313.

It should also be noted that the plug insertion/removal detection circuit 700-2 of FIGS. 11A-11B works on fiber optic connectors as well as on RJ-45 (and RJ-11) style connectors. Thus, it will be appreciated that the "plug" referred to in the description above may comprise, for example, a fiber optic connector that is mounted on the end of a fiber optic patch cord. Additionally, in some embodiments, the plug may not actually be inserted directly between the structures 302', 304'. Instead, the structures 302', 304' may be positioned so that when the plug is inserted into the plug aperture the plug comes close to the structures 302', 304', but does not actually end up between the structures (or is only partially between the structures). As long as the plug comes relatively close to the structures 302', 304', it will cause "fringe" effects that change the capacitance between the structures 302', 304' in a manner that can be detected.

FIGS. 21A-21B are schematic diagrams that illustrate a jack 300-3 that includes yet another plug insertion/removal detection circuit 700-3 according to embodiments of the present invention. In particular, FIG. 21A is a schematic front view of the jack 300-3 with no plug inserted therein, and FIG. 21B is a top schematic view of two electrodes 1104, 1108 that form a capacitor when a plug is inserted within the plug aperture of jack 300-3. The plug detection circuit 700-3 may be coupled to the phantom mode transmitter 270 and the phantom mode receiver 260 in the same manner, discussed above with reference to FIG. 10C, that plug detection circuit 700-1 is coupled to the phantom mode transmitter 270 and the phantom mode receiver 260.

As shown in FIGS. 21A-21B, the plug insertion/removal detection circuit 700-3 comprises a hinged flap mechanism 1102 that includes a plate portion 1104 and a hinge 1106. The hinged flap mechanism 1102 may be spring loaded by a spring (not shown) that contacts the back surface of plate portion 1104. The hinge 1106 may comprise any suitable hinge structure including one piece hinges that are formed using a resilient and/or flexible material. The hinge 1106 may be used to move the plate portion 1104 between a resting position (which is the position illustrated in FIG. 21A) and an activated position in which the plate portion 1104 is rotated 90 degrees backwards into the plug aperture (such that the plate portion 1104 would no longer be visible in FIG. 21A). The reverse side of plate portion 1104 (i.e., the major surface of plate 1104 that is not visible in FIG. 21A) may be coated with a conductive material such as copper. The plug insertion/removal detection circuit 700-3 further comprises a conductive plate 1108. The conductive plate 1108 is positioned so that it is parallel to and slightly spaced apart from plate portion 1104 when plate portion 1104 is in its activated position. The plate portion 1104 and the conductive plate 1108 may form the electrodes of a capacitor. The plate portion 1104 and the conductive plate 1108 may be coupled to the phantom mode transmitter 270 and the phantom mode receiver 260 by any suitable electrical connections (not shown) so that a signal may be transmitted through the capacitor formed by plate portion 1104 and the conductive plate 1108.

The plug insertion/removal detection circuit 700-3 may operate as follows. When no plug is present in the plug aperture of jack 300-3, the plate portion 1104 of hinged flap mechanism 1102 will be biased by the spring (not shown) in its resting position. When an out-of-band control signal is transmitted from the phantom mode transmitter 270 to the phantom mode receiver 260 through the capacitor formed by plate portion 1104 and the conductive plate 1108 the received signal will be very weak (if even detectable), since the electrodes 1104, 1108 of the capacitor will be positioned at a 90 degree angle with respect to each other, and hence very little signal energy will couple from electrode 1104 to electrode 1108. In contrast, when a plug is inserted into the plug aperture, the front portion of the plug housing forces the plate portion 1104 to rotate backwardly 90 degrees into the plug aperture into its activated position. When this occurs, as shown in FIG. 21B, the plate portion 1104 is located parallel to, and directly below, the conductive plate 1108 so that plates 1104 and 1108 will operate like a conventional plate capacitor. When plate portion 1104 is in this activated position, the coupling between electrodes 1104 and 1108 will be significantly greater than the coupling that occurs between these two electrodes when plate portion 1104 is in its resting position. The phantom mode receiver 260 may sense this difference in received signal strength and interpret this difference as meaning that a plug has been inserted into the plug aperture of jack 300-3.

FIGS. 22A-22B are schematic diagrams that illustrate a jack 300-4 that includes a plug insertion/removal detection circuit 700-4 according to still further embodiments of the present invention. The plug insertion/removal detection circuit 700-4 is quite similar to the plug insertion/removal detection circuit 700-3 discussed above. FIG. 22A is a schematic front view of the jack 300-4 with no plug inserted therein, and FIG. 22B is a top schematic view of two electrodes 1110, 1112 that, in conjunction with plate portion 1104, form a capacitor when a plug is inserted within the plug aperture of jack 300-4. The plug detection circuit 700-4 may be coupled to the phantom mode transmitter 270 and the phantom mode receiver 260 in the same manner, discussed above with reference to FIG. 10C, that plug detection circuit 700-1 is coupled to the phantom mode transmitter 270 and the phantom mode receiver 260.

As shown in FIGS. 22A-22B, the plug insertion/removal detection circuit 700-4 comprises a hinged flap mechanism 1102 that may be identical to the hinged flap mechanism 1102 discussed above with respect to FIGS. 21A-21B, and hence further description thereof will be omitted. The plug insertion/removal detection circuit 700-4 further comprises a pair of conductive plates 1110, 1112 that replace the conductive plate 1108 of plug insertion/detection circuit 700-3 of FIGS. 21A-21B. The conductive plates 1110, 1112 are positioned adjacent to each other in the same plane, and serve as the two electrodes of a capacitor. The conductive plates 1110, 1112 may be coupled to the phantom mode transmitter 270 and the phantom mode receiver 260 by any suitable electrical connections (not shown) so that a signal may be transmitted through the capacitor formed by plates 1110 and 1112.

The plug insertion/removal detection circuit 700-4 may operate as follows. When no plug is present in the plug aperture of jack 300-4, the plate portion 1104 of hinged flap mechanism 1102 will be biased by the spring (not shown) in its resting position. When an out-of-band control signal is transmitted from the phantom mode transmitter 270 to the phantom mode receiver 260 through the capacitor formed by the conductive plates 1110, 1112, the received signal will be very weak (if even detectable), since the electrodes 1110, 1112 of the capacitor, while located adjacent to each other, are positioned end-to-end and hence will only exhibit fringe coupling. In contrast, when a plug is inserted into the plug aperture, the front portion of the plug housing forces the plate portion 1104 to rotate backwardly 90 degrees into the plug aperture into its activated position. When this occurs, as shown in FIG. 22B, the plate portion 1104 is located parallel to, and directly below, the adjacent conductive plates 1110, 1112. Consequently, significant capacitive coupling will occur between plate 1104 and plate 1110 and between plate 1104 and plate 1112. Thus, an out-of-band control signal that is transmitted from the phantom mode transmitter 270 to the plate 1110 will capacitively couple to plate portion 1104, and may then capacitively couple from plate portion 1104 to plate 1112 where it is carried to the phantom mode receiver 260. Thus, when plate portion 1104 is in its activated position, the coupling between electrodes 1110 and 1112 will be significantly greater than the coupling that occurs between these two electrodes when plate portion 1104 is in its resting position. The phantom mode receiver 260 may sense this difference in received signal strength and interpret this difference as meaning that a plug has been inserted into the plug aperture of jack 300-4.

While the plug insertion/removal detection circuits 700-3 and 700-4 are positioned in the top of the jacks 300-3 and 300-4, it will be appreciated that in other embodiments, these circuits could be positioned elsewhere within the plug aperture. It will likewise be understood that components other than the phantom mode transmitter 270 and the phantom mode receiver 260 could be used to transmit the sensing signal through the various plug insertion/removal detection circuits described above. It will also be appreciated that the plug insertion/removal detection circuits 700-3 and 700-4 illustrated with respect to FIGS. 21A-22B may be used with both copper patch cords and fiber optic patch cords. It will also be appreciated that the hinged flap mechanism 1102 that is included in these circuits may be mounted on the housing of the jack or, alternatively, may be mounted on another structure such as face plate for a wall jack or a printed circuit board for an intelligent patch panel.

Method of detecting the insertion and/or removal of a plug from a communications connector according to further embodiments of the present invention will now be described with reference to the flow chart diagrams of FIGS. 19-20.

Figure 19:
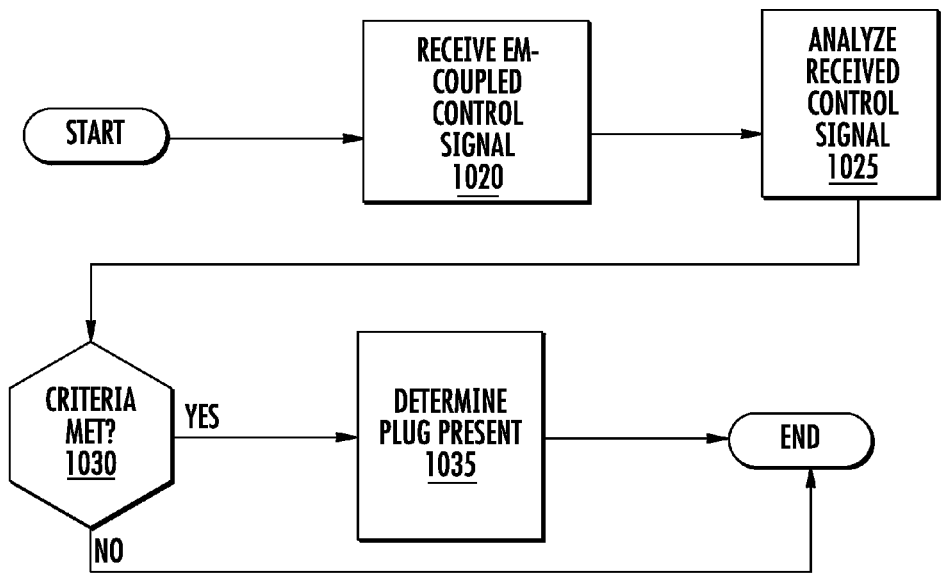
FIG. 19 is a flow chart diagram illustrating methods of detecting the insertion and/or removal of a plug from a communications connector according to further embodiments of the present invention.

As shown in FIG. 19, operations for one of these methods may begin with a control signal being received that was electromagnetically coupled through a reactive coupling element of the communications connector (block 1020). This received control signal may then be analyzed (block 1025). If this analysis determines that one or more criteria are met (block 1030), then a determination may be made that a mating plug has been inserted into the plug aperture (block 1035). The criteria may comprise, for example, a signal strength of the received control signal meeting a threshold or merely the detection of the presence of the received control signal.

In some embodiments, the reactive coupling element may be a capacitor that has a first electrode that is mounted adjacent a first side of the plug aperture (e.g., a side wall or a top surface) and a second electrode that is mounted adjacent a second side of the plug aperture (e.g. the other side wall or the bottom surface), where the second side is opposite the first side. In some embodiments, the connector may be an RJ-45 jack that has a plurality of spring contacts, and the first and second electrodes may be mounted such that the plurality of spring contacts are not positioned between the first and second electrodes when the plurality of spring contacts are in their respective resting positions, and portions of the plurality of spring contacts are positioned between the first and second electrodes when the mating plug is received within the plug aperture.

Figure 20:
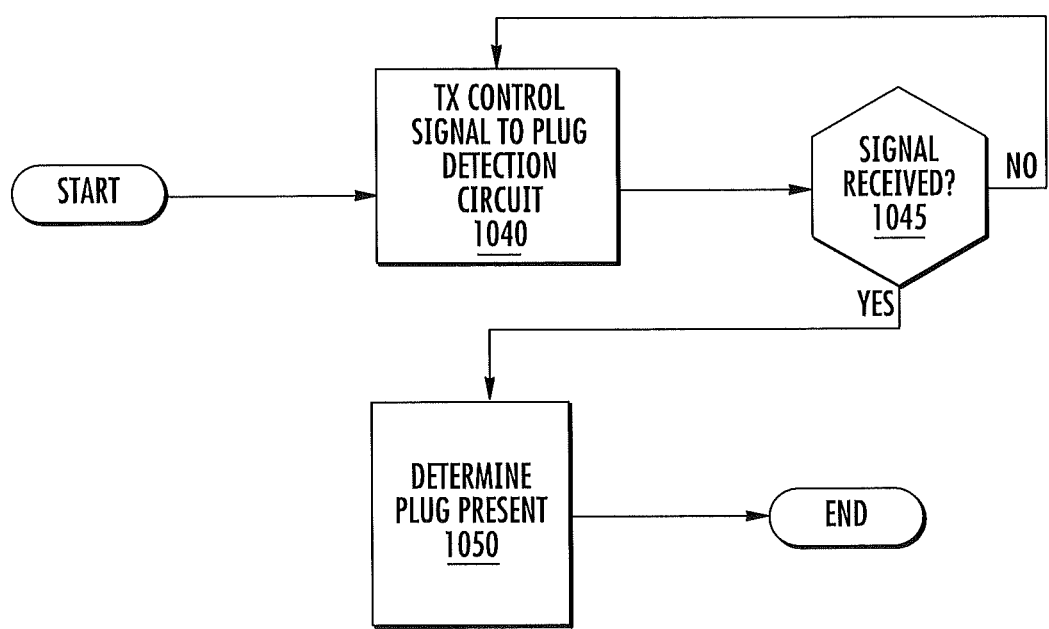
FIG. 20 is a flow chart diagram illustrating methods of detecting the insertion and/or removal of a plug from a communications connector according to still further embodiments of the present invention.

The flow chart of FIG. 20 illustrates methods of detecting plug insertions into a plug aperture of a communications jack according to still further embodiments of the present invention. As shown in FIG. 20, operations may begin with the transmission of a plug insertion detection signal to a plug insertion detection circuit that includes a switch that selectively opens and closes the plug insertion detection circuit (block 1040). Thereafter, a determination is made as to whether or not the plug insertion detection signal has been received at a receiver (block 1045). If it has not, operations return to block 1040. If the plug insertion detection signal is received at the receiver at block 1045, then it may be determined that the plug is present within the plug aperture (block 1050).

In some embodiments of these methods, the plug insertion detection circuit may include a capacitor that capacitively couples the plug insertion detection signal onto at least a first conductor of a first differential pair of conductive paths through the communications jack. Moreover, the switch may be a spring contact and a mating contact pad, where the contact pad is positioned so that insertion of a mating plug within the plug aperture resiliently deflects the spring contact into physical and electrical contact with the contact pad.

It will be appreciated that in further embodiments of the present invention a variety of other plug insertion/removal detection circuits may be used other than the exemplary circuits 690, 700-1 and 700-2 that are described above. By way of example, in other embodiments, plug insertions and/or removals may be detected using infrared emitters and detectors that are provided across each plug aperture or through the use of a combined infrared emitter/detector that detects the presence or absence of a reflected infrared signal, both of which techniques are disclosed, for example, in the above-referenced U.S. patent application Ser. No. 12/787,486 and in U.S. Pat. No. 6,424,710. Likewise, in still further embodiments, the plug insertion/removal detection circuit may be implemented using, for example, optical emitters and detectors, magnetic detectors, mechanical and/or electromechanical switches and the like that are triggered when plugs are inserted into, or removed from, the jack 600. However, the exemplary circuits 690, 700-1 and 700-2 that are described above may be advantageous in certain embodiments as the added cost per connector port may be very small when such circuits are added to devices that already include phantom mode control signalling circuitry (or other circuitry that may be used to transmit and receive a signal that capacitively couples through the plug aperture).

One potential advantage of including plug insertion/removal detection circuits on some or all of the connector ports of a channel is that it permits the intelligent tracking system to operate as an event-driven system. In particular, instead of performing periodic scans to determine all patching connections in a communications network, the system can monitor for plug insertions and/or removals and only send common mode and/or phantom mode control signals after the detection of such plug insertions and removals to update the connectivity information. In some embodiments, connectivity information could be tracked and updated using both event driven signalling and periodic scans that may be performed on a less frequent basis.

A simplified, exemplary method by which an event driven scan may be performed will now be discussed with reference to FIG. 12, which is a schematic block diagram of two patch panels 200-1, 200-2 that are part of a cross-connect communications patching system 720.

Figure 12:
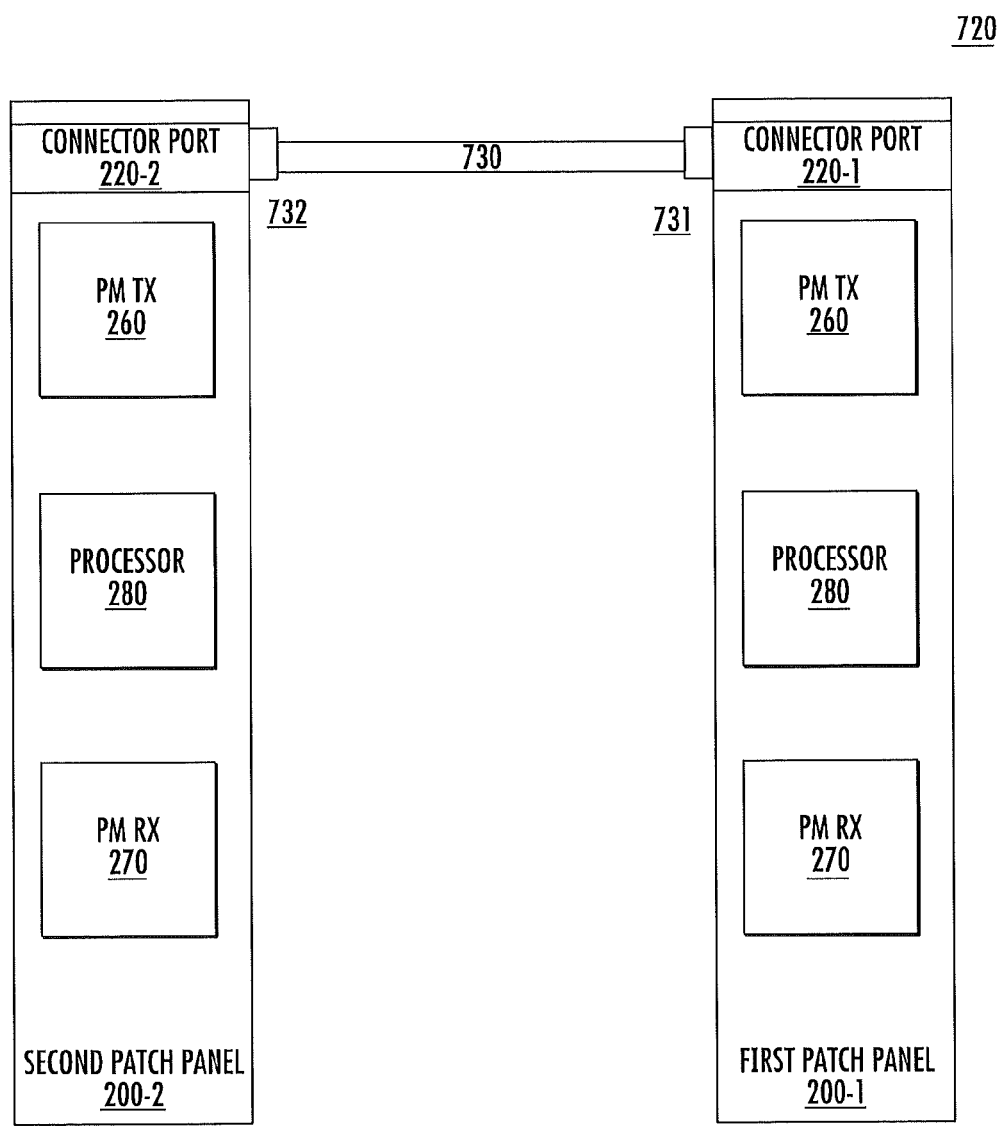
FIG. 12 is a block diagram of the cable, connector ports, devices and control elements associated with a portion of one exemplary channel in an interconnect communications patching system.

As shown in FIG. 12, the patch panels 200-1, 200-2 each include a plurality of connector ports 220 (only a single connector port 220-1, 220-2 is shown on the respective patch panels 200-1, 200-2 in FIG. 12 to simplify the drawing). Additionally, each of the patch panels 200-1 further includes a phantom mode transmitter 260, a processor 280 and a phantom mode receiver 270. A patch cord 730 having plugs 731, 732 on either end thereof is used to interconnect connector port 220-1 of the first patch panel 200-1 with connector port 220-2 of the second patch panel 200-2. For purposes of this example, it will be assumed that the connector ports 220-1, 200-2 are each implemented using the jack 600 described earlier herein.

When the plug 731 on patch cord 730 is inserted into connector port 220-1 (which, as noted above, is assumed to have the design of jack 600 of FIG. 9) of the first patch panel 200-1, the plug will deflect the spring contacts 341-348 of connector port 220-1 downwardly, driving them into direct physical contact with the corresponding contact pads 351-358. A phantom mode control signal is periodically transmitted from the phantom mode transmitter 260 to the connector port 220-1. If a plug is present in the connector port 220-1, this phantom mode signal is capacitively coupled via plates 360, 370 onto contact pads 351-352 and 357-358, from which it is coupled onto the signal carrying paths though connector port 220-1. Thus, when plug 731 is inserted into connector port 220-1, the relevant component of the phantom mode control signal from phantom mode transmitter 260 (i.e., the positive or negative component of the phantom mode control signal) will appear on contacting structure 696 which feeds this signal to the phantom mode receiver 270 and/or microprocessor 280 on patch panel 200-1. A comparison or analysis is performed on this signal (see above discussion) and, based on that comparison/analysis, a determination is made that a plug has been inserted into the connector port 220-1. The microprocessor 280 may then notify its associated rack manager 36 (see FIG. 2) that a patch cord has been plugged into connector port 220-1.

Once the plug 731 is inserted into connector port 220-1, the phantom mode control signal which is being periodically injected into connector port 220-1 by phantom mode transmitter 260 will be injected onto the patch cord 730 via the plug 731, and will travel down the conductors of pairs 2 and 4 of the patch cord 730. Once the plug 732 on the far end of the patch cord is plugged into the connector port 220-2 on the second patch panel 200-2, the injected phantom mode control signal will travel from the blades of the plug 732 onto the spring contacts 341-348 of the connector port 220-2 on the second patch panel 200-2. This phantom mode control signal may be capacitively coupled onto the plates 360, 370 of the connector port 220-2, and is then coupled to the phantom mode receiver 270 on the second patch panel 200-2, where it is demodulated to provide a digital data stream. This data stream includes a unique identifier that identifies the first patch panel 200-1 and the connector port 220-1 thereof that plug 731 is plugged into. The microprocessor 280 on the second patch panel 200-2 already knows the unique identifier associated with the connector port 220-2 that plug 732 is plugged into, and hence it may then pass to its associated rack manager 36 (see FIG. 2) the unique identifiers of the two connector ports 220-1, 220-2 that are connected by the patch cord 730 for logging in a database or table of patch cord connections. In this fashion, the insertion of a plug into a connector port may automatically result in an update to the connectivity database.

The above example that is described with reference to FIG. 12 illustrates how patching connections may be automatically tracked between two connector ports. It will be appreciated that the connector ports may be patch panel connector ports, network switch connector ports, modular wall jack connector ports (or other work area outlets) so that patch cord or horizontal cabling connections can likewise be automatically tracked between these additional devices.

Another capability that is enabled by providing plug insertion/removal detection circuits is the ability to detect and track plug insertions and/or removals in the work areas of a commercial office building and/or in data centers. By tracking such insertions and/or removals network administrators may be able to detect potential security breaches and/or resolve problems remotely. For example, if a plug on a patch cord that connects a user's computer to a modular wall jack becomes loose, the user may report computer problems to a network administrator. The network administrator may consult a log and see that the system detected a plug removal when the plug loosened from the connector port on the computer. By automatically gathering this information, the system may make it easier for network administrators to resolve various problems.

One issue with extending the phantom mode control signalling capability to the work areas is that the phantom mode transmitter, the phantom mode receiver and/or the processor that is used to transmit and/or receive such signals generally require power to operate. Typically, such power will not be readily available at all modular wall jacks and other connector ports throughout the work areas. Accordingly, in some embodiments of the present invention, power-over Ethernet techniques may be used to provide a power signal to each work area connector port in order to provide power to the phantom mode control circuit elements included at the connector port. In other embodiments, the work area connector ports could be located in close proximity to standard 110-volt alternating current power outlets and power could be inductively coupled from the alternating current power lines that are connected to these power outlets. In still other embodiments, power could be wired directly to each work area connector port or, alternatively, batteries could be provided at each connector port that provide the necessary operating voltage. In still further embodiments, the phantom mode control signal could be sent continuously, and a rectifier could be included at the connector port that uses the received signal to charge a capacitor that powers the phantom mode control signalling circuitry. Thus, it will be appreciated that power could be provided to the work area connector ports in a variety of different ways.

As discussed above with respect to FIGS. 8A-8D, in addition to tracking cable and patch cord connections, embodiments of the present invention also may provide capabilities for tracking work area and/or network end devices. In particular, when an interposer 500 (see FIGS. 8A-8D) is mounted on an end device, in some embodiments, the microprocessor 580 that is included on the interposer 500 may be programmed with the MAC ID of the end device or other identifying information, and the microprocessor 580 may further be programmed to include this identifying information in the phantom mode control signals that are generated by the interposer 500 and transmitted onto the phantom mode control channel. As the manner in which an interposer 500 may send a phantom mode control signal to a system manager or other controller has been described above, a description of this process will be omitted here for the sake of brevity. The relevant point is that interposers 500 that are mounted on, for example, work area end devices may use the same process to provide information to the system manager, thereby allowing the system manager to track end-to-end connectivity information for each channel. As discussed below, this end-to-end information may be used for a variety of purposes such as enhanced network security.

Figure 13:
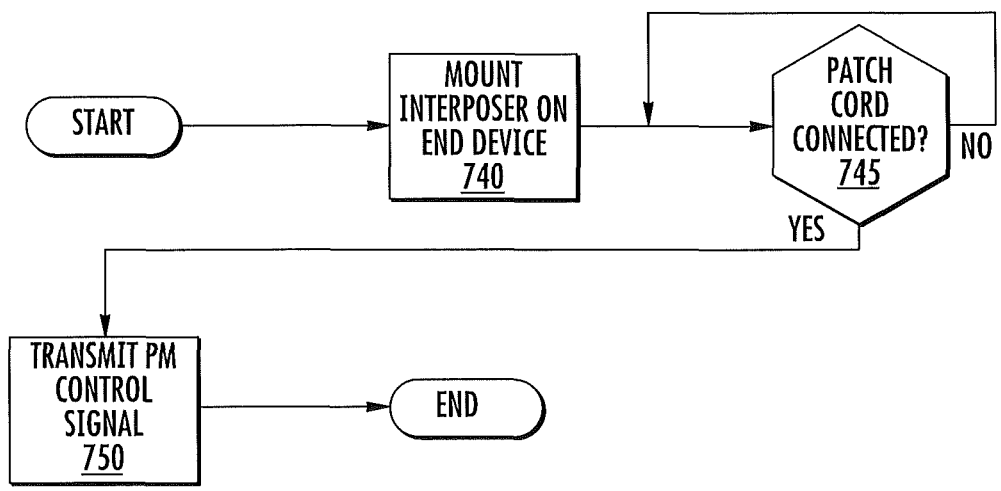
FIG. 13 is a flow chart diagram illustrating a method of automatically identifying an end device that is connected to a communications network according to certain embodiments of the present invention.

FIG. 13 is a flow chart illustrating a method of automatically identifying an end device that is connected to a communications network according to certain embodiments of the present invention. As shown in FIG. 13, operations may begin with an interposer being mounted within a connector port of an end device (block 740). The interposer may include a plug end that mounts within a connector port on the end device and a jack end that is configured to receive a patch cord. Next, a determination may be made as to whether or not a patch cord has been connected (i.e., plugged into) the interposer (block 745). This may be accomplished, for example, using any of the above-described plug insertion/removal detection circuits. If at block 745 it is determined that a patch cord has not been connected to the interposer, then operations proceed back to block 745 where the system may continue to monitor for a plug insertion into the interposer. If instead at block 745 it is determined that a patch cord has been connected to the interposer, then operations may proceed to block 750, where a phantom mode control signal may be transmitted from the interposer to a connector port on a patch panel of the communications network over a phantom mode control channel that runs from the interposer to the connector port on the patch panel. The phantom mode control signal may include identifying information for the end device. This identifying information may be accumulated in a central database that tracks the end devices that are connected to each channel in the communications network.

The above-discussed identifying information for end devices such as work area end devices that may be collected according to embodiments of the present invention may also be used to perform network security operations. By way of example, a system manager or other control processor could monitor some or all of the work area end devices that are connected to a network and make sure that those end devices only have access to appropriate network equipment, services, virtual local area networks and the like. However, one potential problem with using the interposers 500 for such network security applications is that users could remove an interposer 500 from a first work area end device (e.g., a corporate computer that is authorized access to the network) and then place the interposer 500 on another device (e.g., an employee's personal laptop computer that is not authorized access to the network). Thus, so long as such unauthorized use of the interposers 500 is readily possible, it may be difficult to use the interposers 500 to implement network security techniques. However, pursuant to further embodiments of the present invention, the plug portion of the interposers 500 may include a locking mechanism that a network administrator may use to lock the interposer 500 into a connector port on an end device. This locking mechanism may be designed such that it is difficult (or impossible) for someone without an unlocking key to remove the interposer 500 from an end device without damaging the interposer 500 and rendering it inoperable. In this fashion, unauthorized use of the interposers 500 may be made difficult, allowing the interposers 500 to be used to provide enhanced network security.

In some embodiments, the plug end of the interposer may be provided with a locking mechanism such as the locking mechanisms disclosed in U.S. Patent Application Publication No. 2010/0136809. In such embodiments, the microprocessor 580 could be embedded in the locking mechanism in such a way that anyone breaking the locking mechanism to remove the interposer 500 would also break the electrical connection between the microprocessor 580 and the remaining circuitry of the interposer 500.

As noted above, using the interposers 500 to automatically discover the MAC IDs (or other identifying information) of end devices that connect to a network may allow for enhanced security procedures. In particular, in current communications systems, MAC ID filtering is sometimes used to prevent unauthorized access of end devices to the network. With MAC ID filtering, a connector port on a network switch may be configured to only allow MAC IDs within a certain range to have access to the switch connector port. If an end device having a MAC ID outside of the authorized range attempts to connect to the network via the switch connector port, the connector port automatically shuts down and a system administrator is notified. The system administrator may then determine whether or not the end device should be given access to the network, and may reprogram the connector port on the switch to accept the MAC ID of the end device if the end device should be allowed access. Network access control technology may also be used instead of MAC filtering to enforce corporate network security policies for access to a network.

As discussed above, pursuant to embodiments of the present invention, it may be possible to automatically identify the MAC ID of end devices that are connected to a network using phantom mode control signals and interposers 500. In some embodiments, the network switches that are not in use could be set to a disabled state. When the system discovers that a new end device has been connected to the network, the system can determine the MAC ID of the end device and compare that MAC ID to a list of approved devices. If the MAC ID is included on the approved list, the system may then automatically enable the switch port, thereby providing the end device access to the network. In this manner, the network could automatically only provide access to approved devices, providing enhanced network security as compared to current MAC ID filtering or network access control techniques. In some embodiments, the connector port at the network switch will only be automatically enabled if the MAC ID of the end device is on an authorized list of MAC IDs. In other embodiments, the switch port may be automatically enabled for any end device having an interposer that provides phantom mode control channel signalling capabilities, regardless of the specific MAC ID of the end device. The ability to only enable a particular connector port on a network switch upon detecting that an end device has been connected to the connector port (through cabling and intermediate jacks) may also result in power savings, particularly in the data center environment.

Moreover, since the system can track the MAC IDs or other identifying information associated with the end devices, this identifying information may be used to restrict the access of certain devices to particular resources within the network. The MAC IDs or other identifying information that are transmitted by end devices over the phantom mode control channel may also be used to identify a specific service that needs to be provided to a connected device. The system could automatically be reconfigured to assign the required service to the switch port to which the end device is connected. By way of example, an Internet telephone typically requires access to Voice Over Internet Protocol ("VOIP") service. Upon detecting by, for example, by a MAC ID, that an Internet telephone has been connected to a particular switch port, the system can cause a virtual local area network ("VLAN") to provision VOIP service to the identified switch port. Thus, by automatically tracking the MAC IDs of end devices, the system can be configured to automatically provision certain services to connector ports on network switches in response to end devices being connected to the network, thereby avoiding the need to manually perform such provisioning operations.

Figure 14:
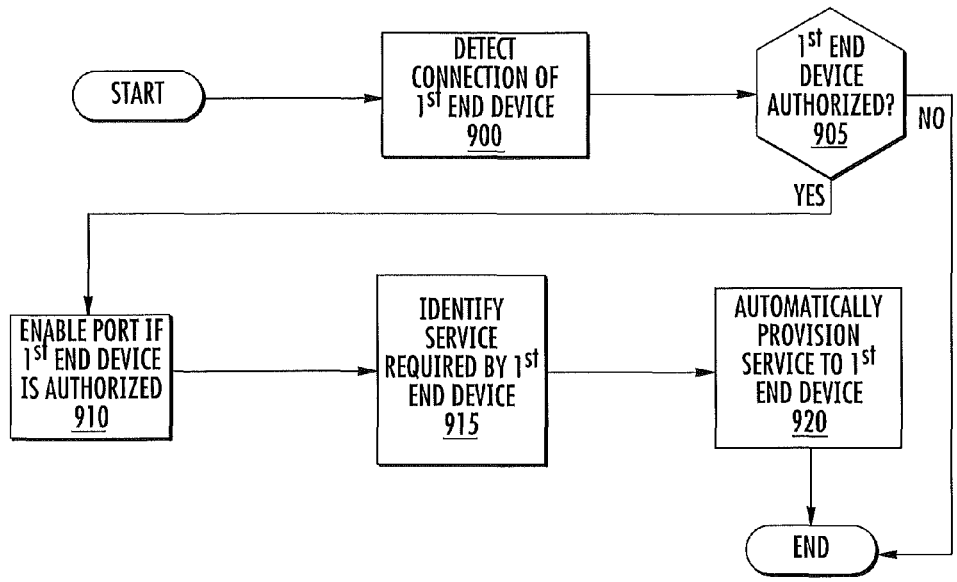
FIG. 14 is a flow chart that illustrates a method of operating a network switch according to certain embodiments of the present invention.

By way of example, the flow chart of FIG. 14 illustrates a method of operating a network switch according to certain embodiments of the present invention. As shown in FIG. 14, operations may (optionally) begin with a plug insertion detection circuit being used to automatically detect that a first end device is connected to a first end of a first channel that runs through a first of the connector ports on the network switch (block 900). A determination may then be made as to whether or not the first end device is within a set of authorized end devices (block 905). In some embodiments, this determination may be made using a phantom mode control channel to determine a first identifier that is associated with the first end device and then determining if the first identifier is within a set of authorized identifiers (e.g., determining that a MAC ID of the first end device is within a set of authorized MAC IDs). In other embodiments, this determination may be made simply by the fact that the first end device includes a phantom mode control channel. If at block 905 it is determined that the first end device is not within a set of authorized end devices, operations may end. If at block 905 it instead is determined that the first end device is within the set of authorized end devices, then the first of the plurality of connector ports may be enabled (block 910).

In some embodiments, once the connector port is enabled (or before enabling, in some embodiments), a service that is to be provided to the first end device may then be identified based at least in part on the first identifier (block 915). The network may then be automatically reconfigured to provision the identified service to the first channel (block 920).

Figure 15:
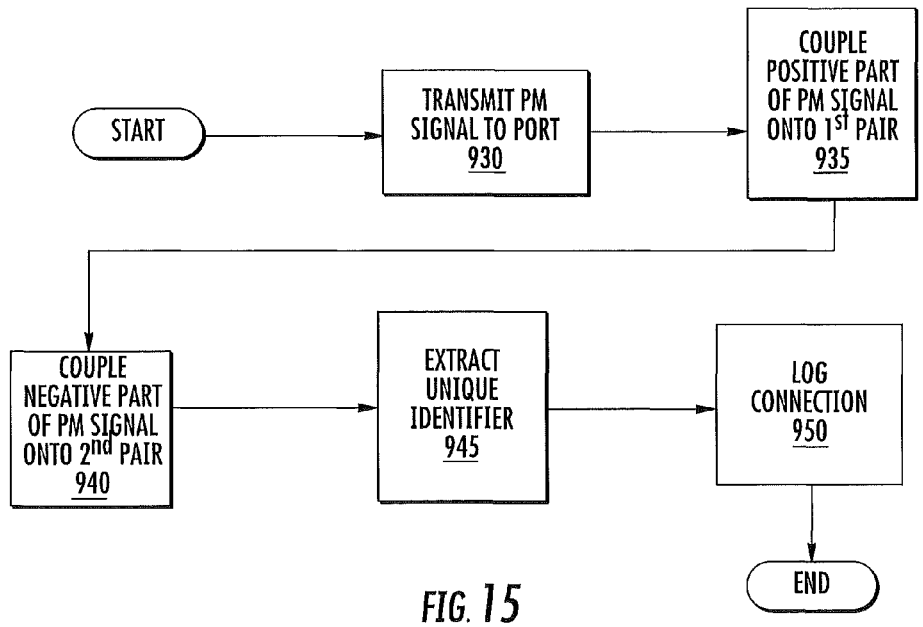
FIG. 15 is a flow chart that illustrates a method of identifying connectivity in a communications network according to certain embodiments of the present invention.

As discussed above, pursuant to embodiments of the present invention, various methods of identifying connectivity in a communications network are provided. The flow chart of FIG. 15 illustrates one such exemplary method. As shown in FIG. 15, operations may begin with a phantom mode control signal being transmitted from a connector port on a network switch to a connector port on a patch panel via a patch cord that extends therebetween (block 930). The phantom mode control signal includes a unique identifier that is associated with the connector port on the network switch, and may be transmitted over at least two differential pairs of conductors of the patch cord. Next a first component of the phantom mode control signal is coupled to a phantom mode control signal receiver via a first capacitor included in the connector port of the patch panel (block 935). A second component of the phantom mode control signal is likewise coupled to the phantom mode control signal receiver via a second capacitor that is included in the connector port of the patch panel (block 940). The unique identifier associated with the connector port on the network switch may then be extracted from the phantom mode control signal at the patch panel (block 945). Finally, the connection between the connector port on the network switch and the connector port on the patch panel may be logged in a connectivity database (block 950).

According to still further embodiments of the present invention, the phantom mode control signalling techniques and equipment disclosed herein may be used to map the horizontal cabling for a communications network. If the work area outlets include phantom mode control signalling capability, then such capabilities may be used to automatically map the horizontal cabling topology at the time the cabling is installed.

For example, referring back to FIG. 3, a communications system 100 is depicted that connects a network switch 130 to a plurality of wall jacks 140. As shown in FIG. 3 with respect to one exemplary wall jack 140, each wall jack 140 may include a phantom mode transmitter, a processor and/or a phantom mode receiver. These capabilities may be used to automatically map the connections of the horizontal cables 144 that connect the modular wall jacks 140 to the connector ports 111-114 on the first patch panel 110 to confirm that each horizontal cable 144 has been connected to the intended ones of the connector ports 111-114. To accomplish this, the microprocessor 116 on patch panel 110 may instruct each microprocessor 144 on the modular wall jacks 140 to send a phantom mode control signal with the identifying information for the wall jack 140 (e.g., office and outlet number). When each wall jack 140 receives its respective control signal, it responds by sending a responsive control signal back over the phantom mode control channel that includes the identifying information for the wall jack 140. This information may then be compared to a desired topology to determine if the horizontal cabling was correctly installed. In some embodiments, it may be necessary to have patch cords plugged into each connector port 111-114 on the patch panel 110 in order to map the horizontal cabling since the plugs of the patch cords push the contact wires of the connector ports 111-114 into mechanical and electrical contact with corresponding contact pads that are used to couple the phantom mode control signal onto the channel.

According to still further embodiments of the present invention, the phantom mode control signalling techniques and equipment disclosed herein may be used to map a communications cabling network before patch cords are plugged in at either end of the network. In particular, after the horizontal cabling for a communications network has been installed, it may be desirable to automatically map the topology of the horizontal cabling. In many situations, it may be desirable to perform this mapping before end devices or network switches have been connected to the network.

In particular, as discussed above with respect to FIG. 9, jacks according to certain embodiments of the present invention may include a plug insertion/removal detection circuit 690 that includes an externally accessible contacting structure 696 that is electrically connected to one of the conductive paths of a first of the differential pairs of conductive paths through the jack. As is also mentioned above, these jacks may further include a second externally accessible contact 692', a second conductive trace 694' and a second contacting structure 696' that are electrically connected to one of the conductive paths of a second of the differential pairs of conductive paths through the jack. These structures may provide a pair of electrical paths that may be used to transmit a differential (non-phantom mode) control signal from, for example, a patch panel connector port to a wall jack. This differential control signal may be used to discover the connection between the patch panel connector port and the wall jack even if no patch cords have yet been connected to the patch panel.

A transmitter on the patch panel (or alternatively, a transmitter on a handheld device, a rack manager, etc.) may be electrically connected to the externally accessible contacts 696, 696' so that the differential control signal may be injected onto two of the conductive paths of the horizontal cable extending between the patch panel connector port and the wall jack. In some embodiments, the same transmitter may be used that is used to generate the phantom mode control signals (e.g., transmitter 115 of FIG. 3), although it may be necessary to suitably multiplex the different signals generated by the transmitter to deliver these signals to the appropriate contact structures. The externally accessible contacts 696, 696' that are similarly provided on each modular wall jack may be used to couple the differential control signal off of the channel and to pass that signal to a receiver of the wall jack. In response to receiving the differential control signal, the processor at the wall jack may cause a transmitter at the wall jack to generate a responsive differential control signal that may be similarly injected onto the horizontal cable using the contact structures 696, 696' of the wall jack. This responsive differential control signal may be extracted from the horizontal cable at the patch panel connector port using the contact structures 696, 696' thereof, where it may be passed, for example, via a multiplexer to a receiver mounted on the patch panel. The responsive differential control signal may include identifying information for the modular wall jack which may be used to ascertain which wall jack the patch panel connector port has been connected to. Thus, it will be appreciated that the externally accessible contacts 696, 696' that may be provided on the patch panel connector ports and modular wall jacks according to certain embodiments of the present invention may be used to map the horizontal cabling connections even before any patch cords are connected in the communication system.

It should be noted that any differential control signal that is injected onto a channel using the contacting structures 696, 696' may interfere with any underlying traffic signals that are being carried on the various differential pairs of the channel. Accordingly, in some embodiments, a plug insertion/detection circuit may be used to confirm that no plug is plugged into the patch panel connector port and/or the modular wall jack before the differential control signal is injected into the channel.

Figure 16:
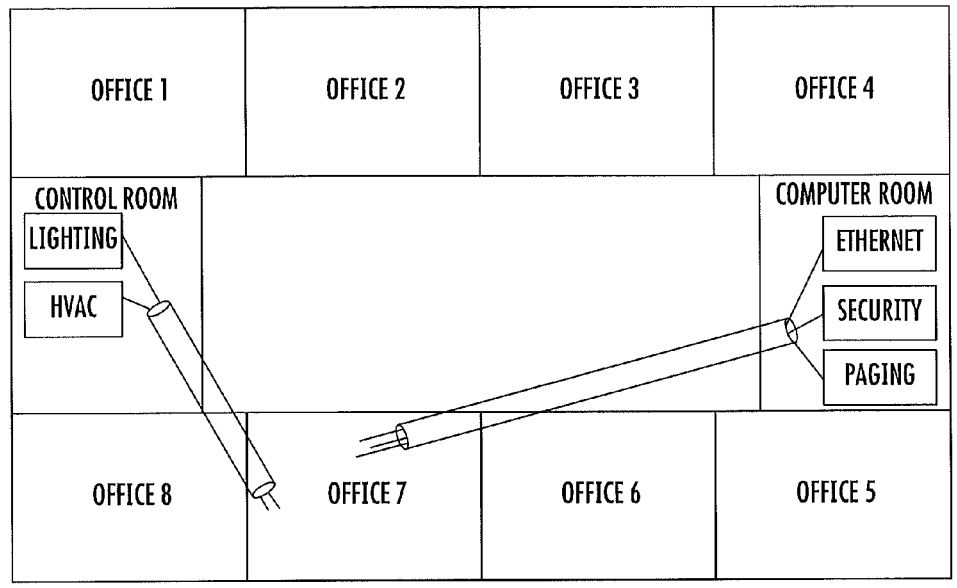
FIG. 16 is a block diagram illustrating the different types of low voltage cabling that may be wired to typical rooms in a commercial office building.
Figure 17:
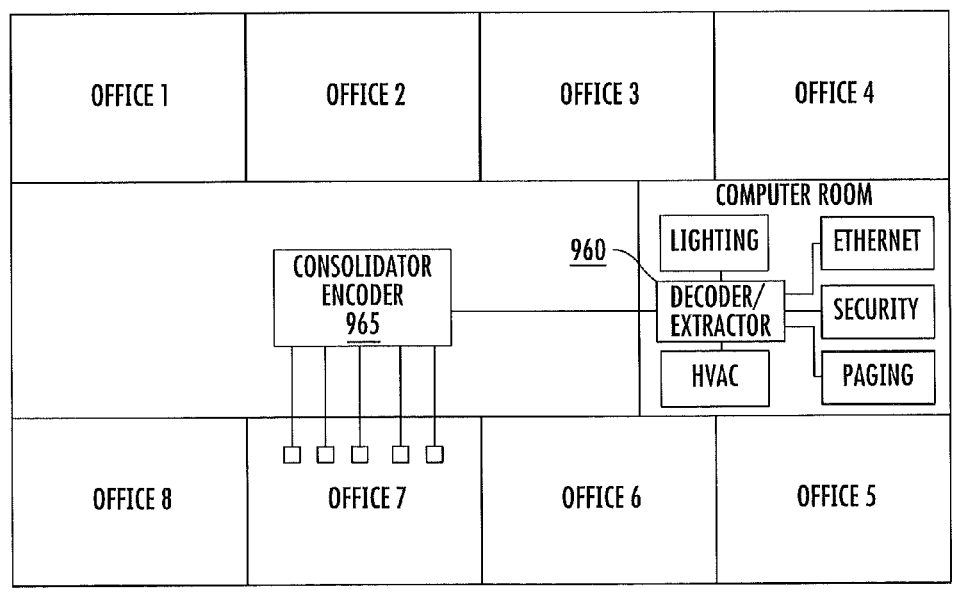
FIG. 17 illustrates how consolidator/encoder units and phantom mode control signalling techniques according to embodiments of the present invention may be used to reduce the amount of low voltage cabling required in certain commercial office buildings.

Pursuant to still further embodiments of the present invention, the phantom mode control signalling capabilities that are disclosed herein may be used to carry control signals that are unrelated to the communications network. These capabilities are described with respect to FIGS. 16 and 17. In particular, FIG. 16 is a schematic diagram illustrating the different low voltage wiring that may be provided to a typical office in a commercial building to support various building infrastructure systems. FIG. 17 illustrates how the phantom mode control signals according to embodiments of the present invention may be used to reduce the amount of wiring that is necessary.

Turning first to FIG. 16, it can be seen that as many as five different types of cables may run to a given office in a commercial office building. These cables include (1) Ethernet communications cables, such as the cables discussed above in the present disclosure, (2) paging cables for a paging system, (3) security cables that carry signals for a security system (e.g., cameras), (4) lighting control cables that carry control signals for intelligent lighting systems, and (5) control cables for heating and air conditioning controls ("HVAC cables") such as the wires that run to thermostats. Low-voltage cables may also be provided for other and/or additional building infrastructure systems. Typically the paging cables, the security cables, the lighting control cables and the HVAC cables are implemented using thin copper wires that are similar to speaker wires. The need to run such a large number of cables—often over long distances—into many if not most offices in a commercial building can greatly increase both the material costs and construction costs of the building. FIG. 16 schematically illustrates how a long "horizontal" run may be required for each different type of cabling to wire the cable into each office (the cables that extend to a single office are shown in FIG. 16 in order to simplify the drawing).

Pursuant to further embodiments of the present invention, the phantom mode control channels that are present on the Ethernet cables in the communications systems disclosed herein may be used to reduce the amount of low voltage cabling required. In particular, as illustrated schematically in FIG. 17, the control systems for the paging system, the security system, the lighting system (e.g., a control system that automatically turns lights on and off based on certain criteria such as time of day, the sensed presence of certain individuals within a building, etc.) and the HVAC system may be located in or near the computer room for the building. A decoder/extractor unit 960 (which may also be referred to herein as a "distributor" unit) is located in the computer room, and a first set of short cables may connect each of the lighting control system, the HVAC control system, the paging system, the security system to the decoder/extractor unit 960. A short Ethernet communications cable may also run to the decoder/extractor unit 960. Consolidator/encoder units 965 (only one is shown in FIG. 17) may be added in selected locations in the work areas throughout the building. A longer Ethernet communications cable may run from the decoder/extractor unit 960 to a consolidator/encoder unit 965 that may be located, for example, in or adjacent to one of the offices in the building. A second set of short cables may run from the consolidator/encoder unit 965 into the office to provide the control signals to the various systems.

In operation, the control signals that are to be sent to remote units of the paging system, the security system, the lighting system and the HVAC system that are located in a particular office are generated by the appropriate systems in the computer room and then are provided to the decoder/extractor 960 which multiplexes these signals onto the phantom mode control channel of an Ethernet communications cable that is likewise being sent to the office at issue. The decoder/extractor unit 960 may include a connector port that receives a short Ethernet cable from, for example, one of the connector ports on a patch panel. This connector port at the decoder/extractor unit 960 may include a control signal input circuit such as the circuit provided on jack 300 discussed above, and the decoder/extractor unit 960 may further include phantom mode control signalling circuitry that may be used to inject a phantom mode control signal into the Ethernet channel (in other embodiments, a common mode signal may be used that is transmitted over one or more of the differential pairs of the Ethernet cable). The decoder/extractor unit 960 may receive control signals from the various systems (e.g., paging, security, etc.), process these (if necessary) into an appropriate format, and then multiplex these systems onto the phantom mode control channel in order to transmit the signals to the consolidator/encoder unit 965. Any appropriate multiplexing scheme such as, for example, time division multiplexing may be used to multiplex multiple control signals onto each phantom mode control channel.

The consolidator/encoder units 965 in the individual offices may have phantom mode control circuitry that may be used to extract the phantom mode control signal from the phantom mode control channel and then demultiplex the phantom mode control signal to extract the individual control signals for the security system, the paging system, the lighting system and/or the HVAC system. The system may also be designed to allow for two way communications over the phantom mode control channel. Thus, it will be appreciated that in some embodiments the decoder/extractor unit 960 and the consolidator/encoder unit 965 may be identical units that consolidate a plurality of control signals and transmit them over a phantom mode control channel and may also extract a plurality of control signals from a phantom mode control channel and route each signal to its appropriate location.

Thus, pursuant to embodiments of the present invention, the phantom mode control channels may be used to reduce the amount of non-Ethernet cabling required in commercial office buildings. While short cabling runs may be required to connect the security system, the paging system, the lighting control system and the HVAC system to the decoder/extractor unit 960 and to run from the consolidator/encoder unit 965 into each individual office, the long horizontal cabling runs for these different control systems, an exemplary one of which is illustrated in FIG. 16, may be eliminated through the use of the phantom mode control channel on the Ethernet communications cable.

In some embodiments, the consolidator/encoder unit 965 may be implemented as part of the modular wall jacks that are provided in offices and other rooms of most commercial office buildings. The consolidator/encoder unit 965 may include the above-described phantom mode control signalling circuitry that is used to receive a phantom mode control signal such as a phantom mode transceiver and a phantom mode processor, and may also include a phantom mode processor for transmitting control information back to a central location (such control information may include both cabling or connectivity information or control signals for the security, paging, lighting or HVAC systems such as, for example, a control signal indicating that a user has changed a setting on a thermostat). The receiver and/or processor on the consolidator/encoder units 965 may be configured to perform the multiplexing and demultiplexing of the control signals, and may feed the appropriate control signals to the short cables that extend between the consolidator/encoder unit 965 and each of the systems in the office.

As made clear from the above discussion, pursuant to embodiments of the present invention, methods of distributing signals from a master unit of a building infrastructure system to a remote unit of the building infrastructure system are provided in which a signal from the master unit is multiplexed onto a phantom mode communications path of an Ethernet cable. In some embodiments, the signal may be one of a plurality of control and/or data signals for one or more building infrastructure systems (other than computer systems) such as, for example, a lighting control system, an HVAC control system, a security system, a fire detection system, a wireless network system, a paging system, etc., that are, for example, time division multiplexed or frequency division multiplex onto the Ethernet cable. The multiplexed signal may thereafter be extracted from the Ethernet cable. The extracted signal may then be distributed to the remote unit. In some embodiments, the remote unit may be powered with power provided over the Ethernet cable.

By using Ethernet cabling to replace, for example, long horizontal cabling runs for other building infrastructure systems, the installation material and expense for wiring a new building and/or rewiring an existing building can be significantly reduced. Many building infrastructure systems use low data rate control and/or data signals and thus, in many instances, it may be possible to multiplex the signalling for multiple such systems onto a common mode control channel or a phantom mode control channel that is provided on existing Ethernet cabling. Moreover, power can be provided to these systems in at least some instances using power supplied from the switch using conventional Power-over-Ethernet techniques. The above-described integration of Ethernet systems and other building infrastructure systems also allows integrating intelligent building software (e.g., software that automatically controls lighting systems, HVAC systems etc. to reduce energy usage or the like) into network management software to provide a more efficient overall solution. With such integrated systems, the plug insertions and/or removals that may be detected using, for example, the plug insertion/removal circuits according to embodiments of the invention could be provided to the control software for the various building infrastructure systems, thereby providing a single, integrated notification system.

While the communications patching systems and the components thereof have primarily been described above with respect to a few exemplary embodiments, it will be appreciated that numerous modifications are also within the scope of the present invention. For example, while the illustrated connector ports inject and remove the phantom mode control signals from a main printed circuit board of the communications connector, it will be appreciated that in other embodiments the phantom mode control signal may be injected into (and/or extracted from) the connector at other locations including, for example, from an auxiliary printed circuit board, an external printed circuit board that includes intelligent patching circuitry (e.g., a phantom mode transmitter or receiver), or in the input contacts (e.g., spring contacts) or output contacts (e.g., IDCs) of the connector.

As another example, various of the embodiments that are discussed above couple the phantom mode control signal onto pairs 2 and 4 (see FIGS. 5A-C) or all four pairs (see FIG. 6B). However, it will be appreciated that the phantom mode control signal could be coupled onto other pair combinations in other embodiments, specifically including (1) pairs 1 and 3, (2) pairs 1 and 2, (3) pairs 1 and 4 and (4) pairs 3 and 4. In such embodiments Pairs 2 and 4 may be preferred pairs in many connector designs as these pairs may have fewer crosstalk and return loss issues (e.g., increased margins) and hence using these pairs to carry the phantom mode control signal may be advantageous in some connector designs. Combinations involving transmitting the phantom control signal onto four pairs by coupling its positive component onto two of the pairs and its negative onto the other two of the pairs are also possible, as are unbalanced pair combinations that use, for example, three of the differential pairs (e.g., coupling the positive component of the phantom mode control signal onto pairs 2 and 4 and the negative component onto pair 1 or pair 3).

In various of the embodiments discussed above either 3-terminal or 5-terminal plate capacitors are used to inject/extract the phantom mode control signal to and from the connector. It will be appreciated, however, that numerous other capacitive elements could be used. For example, in further embodiments, a vertically-oriented plate or plates (where the major plane of the printed circuit board defines a horizontal plane) could be mounted adjacent to the metal plated vias that hold the wire connection terminals for a differential pair to provide, for example, a 3-terminal capacitor. In other embodiments, inter-digitated finger capacitors could be used instead of plate capacitors.

It will likewise be appreciated that any appropriate connection contacts such as phantom mode contacts 366, 376 may be used to carry the phantom mode control signal from the printed circuit board of a communications jack to another printed circuit board or other mounting structure that includes the phantom mode control signal transmitter and/or receiver and/or an intervening multiplexer, switching circuit or the like. In fact, the connection contacts 366, 376 may be implemented as any conductive contact that electrically connects the phantom mode transmitter and/or receiver to the capacitors that are used to inject/extract the phantom mode control signal to and from the connector. In some embodiments, the connection contact may include a first end that has, for example, an eye-of-the-needle termination or other suitable termination that can be press-fit into a metal-plated aperture on the connector printed circuit board. The connection contact may further include a second end that likewise has, for example, an eye-of-the-needle termination or other suitable termination that can be press-fit into a metal-plated aperture on, for example, the patch panel printed circuit board. In other embodiments, the second end may use a spring contact structure that electrically mates with a conductive element on, for example, the patch panel printed circuit board. Other mechanisms may likewise be used. Thus, it will be appreciated that the depicted connection contacts are exemplary in nature and are not limiting with respect to the present invention.

It will likewise be appreciated that in some embodiments, a common printed circuit board may be provided that serves as the printed circuit board for each of the connectors on a multi-connector structure and this common printed circuit board may likewise hold the phantom mode control signal circuitry. By way of example, a 24-connector port patch panel could include a single printed circuit board that receives the spring contacts and IDCs for each connector port, the signal traces and crosstalk compensation circuitry for each connector port, the capacitors that are used to inject/extract phantom mode signals from each connector port, as well as the phantom mode transmitter, the phantom mode receiver, the processor and a multiplexer or switching circuit. In such embodiments, the connection contacts may simply be implemented as traces on a printed circuit board.

As yet another example, it will be appreciated that in some embodiments the network switches that are used could be upgraded to include phantom mode control signal circuitry similar to the circuitry provided on patch panels according to embodiments of the present invention. In such embodiments, any need for interposers according to embodiments of the present invention may be eliminated, as the phantom mode control signal circuitry would be included in the switch.

While embodiments of the present invention have primarily been discussed above with respect to tracking patching connections between two patch panels as would be done in cross-connect communications systems and between a patch panel and a network, switch as would be done in an interconnect communications system, embodiments of the present invention are not limited to these cases. For example, the phantom mode control signalling capabilities described herein can be used in a variety of other situations including identifying end devices and/or tracking horizontal cabling connections between patch panels and work area outlets. Yet another area where the techniques of the present invention may be used is in tracking connections to consolidation points. As known to those of skill in the art, a consolidation point refers to a connection device that may be similar to a patch panel that is mounted in work areas of a building such as in modular furniture and/or work areas. The consolidation may include a plurality of connector ports. A plurality of horizontal cables may run from a patch panel field in the computer room to the back end of respective ones of the consolidation point connector ports. Patch cords may be plugged into the other end of each of the consolidation point connector ports. A plurality of RJ-45-to-RJ-45 modular wall jacks may be mounted in the modular furniture and/or work areas. Each patch cord that is plugged into the consolidation point connector ports may run to a respective one of these RJ-45-to-RJ-45 modular wall jacks. End devices may be connected to each RJ-45-to-RJ-45 modular wall jack by another patch cord.

While embodiments of the present invention have primarily been discussed above with respect to the use of phantom mode control signals, which are control signals that each include two common mode signal components, it will be appreciated that other types of control signals may be used. For example, as discussed above, a single common mode control signal that is transmitted over a single differential pair may be used in place of the phantom mode control signal. Likewise, multiple common mode signals (that do not together comprise a phantom mode control signal) could be used as the control signal, or a single common mode control signal could be used that is transmitted over multiple differential pairs. Thus, it will be appreciated that embodiments of the present invention are not limited to the use of phantom mode control signals.

Pursuant to embodiments of the present invention, the consolidation points and/or the RJ-45-to-RJ-45 modular wall jacks may include the above-described phantom mode control signalling capabilities. In some embodiments, essentially the same equipment that is used to provide the phantom mode signalling capabilities on a patch panel may be used to provide the capabilities to the consolidation point.

Embodiments of the present invention may have a number of distinct advantages over prior art intelligent patching approaches. For example, some embodiments of the present invention may use conventional communications cables and patch cords that do not include extra conductors, identification chips, special contacts and the like. The inclusion of such extra elements as required by various prior art intelligent patching approaches increase the cost of the cabling infrastructure, prevents use of the already installed cabling and patch cord base, may increase the size, weight and cost of the cabling and has various other potential disadvantages. Some embodiments of the present invention also may require only minimal changes to the connector ports in a communications system such as, for example, the provision of capacitors or other capacitive elements that are used to transfer the phantom mode control signal to and from the connectors along with appropriate electrical connections to the phantom mode control signal circuitry. Such capacitors may be implemented at almost zero cost, and the contacts or other electrical connections may typically be implemented as simple conductive traces or contacting structures that add very little to the cost of the connector. The systems according to embodiments of the present invention work in both shielded and unshielded twisted pair communications systems, and provide solutions for tracking of patch cord connections in both cross-connect and inter-connect communications systems.

Moreover, while the provision of the phantom mode control signal circuitry such as the phantom mode transmitters and receivers and associated processors may increase the cost of the systems according to embodiments of the present invention, at the patch panels, consolidation points and the network switches (via the use of interposers, for example), these components may be shared across many connector ports using multiplexers or switching circuits, and hence the overall impact on the cost of the system may be manageable. Moreover, the intelligent tracking capabilities of the communications systems according to embodiments of the present invention may extend to the work area in order to track patch cord and cabling connections to consolidation points and wall jacks, and interposers or other techniques may be used to perform tracking all the way to end devices in both the work area and the computer room to provide full end-to-end tracking. Such tracking of end devices may also enable a host of other capabilities such as, for example, automatic enablement of switch ports upon detection of the connection of an authorized device, the automatic deployment of services in response to detection of the connection of an authorized device, etc. Such capabilities may, for example, simplify network operation and/or provide power savings (by allowing unused switch ports to be set to a non-enabled state).

The present invention has been described with reference to the accompanying drawings, in which certain embodiments of the invention are shown. This invention may, however, be embodied in many different forms and should not be construed as limited to the embodiments that are pictured and described herein; rather, these embodiments are provided so that this disclosure will be thorough and complete, and will fully convey the scope of the invention to those skilled in the art. It will also be appreciated that the embodiments disclosed above can be combined in any way and/or combination to provide many additional embodiments.

Unless otherwise defined, all technical and scientific terms that are used in this disclosure have the same meaning as commonly understood by one of ordinary skill in the art to which this invention belongs. The terminology used in the above description is for the purpose of describing particular embodiments only and is not intended to be limiting of the invention. As used in this disclosure, the singular forms "a", "an" and "the" are intended to include the plural forms as well, unless the context clearly indicates otherwise. It will also be understood that when an element (e.g., a device, circuit, etc.) is referred to as being "connected" or "coupled" to another element, it can be directly connected or coupled to the other element or intervening elements may be present. In contrast, when an element is referred to as being "directly connected" or "directly coupled" to another element, there are no intervening elements present.

Herein, the term "Ethernet cable" refers to a cable that includes at least four twisted pairs of insulated conductors that are suitable for use as a transmission medium for computer communications.

Certain embodiments of the present invention have been described above with reference to flowchart illustrations. It will be understood that some blocks of the flowchart illustrations may be combined or split into multiple blocks, and that the blocks in the flow chart diagrams need not necessarily be performed in the order illustrated in the flow charts.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of detecting a plug insertion into a plug aperture of a communications connector that includes a plurality of input ports, a plurality of output ports, and a plurality of conductive paths that connect respective ones of the input ports to respective ones of the output ports, where the conductive paths are configured as a plurality of differential pairs of conductive paths, the method comprising:
    transmitting a control signal to a control signal input circuit on the communications connector that includes a reactive coupling element;
    electromagnetically coupling the control signal through the control signal input circuit onto a first of the differential pairs of conductive paths;
    outputting at least a portion of the electromagnetically coupled control signal from the communications connector via a control signal output circuit of the communications connector;
    detecting at a controller associated with the communications connector the electromagnetically coupled control signal that is output from the communications connector; and
    determining that a plug is present in the plug aperture based at least in part on detecting the electromagnetically coupled control signal that is output from the communications connector.

2. The method of claim 1, wherein the control signal is electromagnetically coupled onto the first of the differential pairs of conductive paths as a common mode signal.

3. The method of claim 1, wherein the control signal input circuit comprises a first control signal input circuit and the control signal comprises a first control signal, the method further comprising electromagnetically coupling a second control signal from a second control signal input circuit onto a second of the differential pairs of conductive paths.

4. The method of claim 3, wherein the first and second control signals together comprise a differential control signal.

5. The method of claim 1, wherein the control signal comprises a first component of a phantom mode control signal, and wherein a second component of the phantom mode control signal that is oppositely phased from the first component is electromagnetically coupled onto a second of the differential pairs of conductive paths.

6. The method of claim 5, wherein the first component of the phantom mode control signal is electromagnetically coupled onto the first of the differential pairs of conductive paths via a first capacitive circuit having an input terminal, a first output terminal and a second output terminal, and wherein the second component of the phantom mode control signal is electromagnetically coupled onto the second of the differential pairs of conductive paths via a second capacitive circuit having an input terminal, a first output terminal and a second output terminal.

7. The method of claim 6, wherein the input ports comprise first through eighth spring contacts that each mate with a respective one of first through eighth contact pads, wherein the first and second spring contacts are part of the first differential pair of conductive paths, and wherein the first and second contact pads that mate with the respective first and second spring contacts comprise first and second output terminals of the first capacitive circuit.

8. The method of claim 1, wherein the communications connector is configured such that the insertion of a plug into a plug aperture of the communications connector completes an electrical connection between the first of the differential pairs of conductive paths and the control signal input circuit.

9. A communications jack, comprising:
  a plurality of spring contacts that have plug contact regions that comprise input ports of the communications jack;
  a plurality of wire connection contacts that include wire contact regions that comprise output ports of the communications jack;
  a plurality of conductive paths that connect respective ones of the spring contacts to respective ones of the wire connection contacts, where the conductive paths are arranged as a plurality of differential pairs of conductive paths;
  a control signal input circuit that is configured to inject a common mode control signal onto a first of the differential pairs of conductive paths;
  a control signal output circuit that is separate from the spring contacts and wire connection contacts and that is configured to output at least a portion of the injected common mode control signal to a processor that is associated with the communications jack; and
  a plug insertion detection circuit that is coupled to the control signal output circuit.

10. The communications jack of claim 9, wherein the control signal circuit input is configured to electromagnetically couple the common mode control signal onto the first of the differential pairs of conductive paths.

11. The communications jack of claim 10, wherein the control signal input circuit comprises a capacitor.

12. The communications jack of claim 9, wherein the control signal input circuit comprises a capacitor having an input terminal, a first output terminal and a second output terminal, wherein the input terminal is coupled to a control signal generator and first and second output terminals are coupled to the respective conductive paths of the first of the differential pairs of conductive paths.

13. The communications jack of claim 9, further comprising:
  a first contact pad that is positioned adjacent a first of the spring contacts that is connected to a first of the conductive paths of the first differential pair of conductive paths,
  wherein the first contact pad is positioned so that it does not contact the first of the spring contacts when the first of the spring contacts is in a resting position and so that it contacts the first of the spring contacts when a mating plug is inserted within the plug aperture to resiliently deflect the first of the spring contacts;
  wherein the control signal input circuit is electrically connected to the control signal output circuit when the first contact pad contacts the first of the spring contacts.

14. The communications jack of claim 9, wherein the control signal output circuit comprises an externally accessible contact that is electrically connected to at least one of the conductive paths of the first of the differential pairs of conductive paths via a capacitor.

15. The communications jack of claim 9, wherein the control signal output circuit comprises an externally accessible contact that is directly electrically connected to at least one of the conductive paths of the first of the differential pairs of conductive paths via a conductive path.

16. A method of detecting insertion of a plug into a plug aperture of a communications jack, the method comprising:
  transmitting a plug insertion detection signal to a plug insertion detection circuit that includes a switch within the jack that selectively opens and closes the plug insertion detection circuit;
  receiving a received version of the plug insertion detection signal at a receiver that is output from the communications jack via control signal output circuit that is separate from the input and output ports of the communications jack that carry data signals; and
  determining that the plug is present within the plug aperture based on receipt of the received version of the plug insertion detection signal.

17. The method of claim 16, wherein the plug insertion detection circuit includes a capacitor that capacitively couples the plug insertion detection signal onto at least a first conductor of a first differential pair of conductive paths through the communications jack.

18. The method of claim 16, wherein the switch comprises a spring contact and a mating contact pad.

19. The method of claim 18, wherein the contact pad is positioned so that insertion of a mating plug within the plug aperture resiliently deflects the spring contact into physical and electrical contact with the contact pad.

* * * * *